United States Patent
Talwar

(10) Patent No.: US 6,367,054 B1
(45) Date of Patent: Apr. 2, 2002

(54) METHOD OF GENERATING FINITE STATE DATA FOR DESIGNING A CASCADE DECOMPOSED LOGIC CIRCUIT

(75) Inventor: Sunil Talwar, New Barnet (GB)

(73) Assignee: Automatic Parallel Designs Limited (GB)

(*) Notice: Subject to any disclaimer, the term of this patent is extended or adjusted under 35 U.S.C. 154(b) by 0 days.

(21) Appl. No.: 09/406,941

(22) Filed: Sep. 28, 1999

Related U.S. Application Data

(63) Continuation of application No. PCT/GB99/01160, filed on Apr. 15, 1999.

(30) Foreign Application Priority Data

Apr. 22, 1998 (GB) .............................................. 3808609

(51) Int. Cl.[7] .............................................. G06F 17/50
(52) U.S. Cl. .............................. 716/2; 716/7; 716/10; 326/10; 326/41; 326/47
(58) Field of Search .............................. 706/10; 716/2, 716/7, 10; 326/10, 41, 47

(56) References Cited

U.S. PATENT DOCUMENTS 5,963,447 A * 10/1999 Kohn et al. .................... 706/10

FOREIGN PATENT DOCUMENTS

| EP | 0220493 | 5/1987 | ........... G06F/15/60 |
| EP | 0404444 | 12/1990 | ........... G06F/17/50 |
| EP | 0630502 | 12/1994 | ........... G06F/17/50 |

OTHER PUBLICATIONS

Devadas, S. and Newton, A.R., "Decomposition and Factorization of Sequential Finite State Machines", IEEE Transactions on Comuter–Aided Design, Nov. 1989, vol. 8, No. 11.*

Ashar, P., et al., "Unified Approach to the Decomposition and Re–decomposition of Sequential Machines", Proceedings of the 27th ACM/IEEE Design Automation Conference, Paper 37.1, pp. 601–606, (1990).

Aziz, A., et al., "Sequential Synthesis Using SIS", IEEE, pp. 612–617, (Nov. 5, 1995).

De Micheli, G., et al., "Optimal State Assignment for Finite State Macines", IEEE Transactions on Computer–Aided Design, CAD–4 (3), pp. 269–285, (Jul. 1985).

Devadas, S., et al., "Decomposition and Factorization of Sequential Finite State Machines", IEEE Transactions on Computer–Aided Design of Integrated Circuits and Systems, 8 (11), pp. 1206–1217 (Nov. 1989).

Dilger, E., "On Permutation–Reset Automata", *Information And Control*, 30, pp. 86–95, (1976).

Geiger, M., et al., "FSM Decomposition Revisited: Algebraic Structure Theory Applied to MCNC Benchmark FSMs", Proceedings of the 28th ACM/IEEE Design Automation Conference, Paper 11.4, pp. 183–185, (1991).

(List continued on next page.)

*Primary Examiner*—Matthew Smith
*Assistant Examiner*—Jibreel Speight
(74) *Attorney, Agent, or Firm*—Schwegman, Lundberg, Woessner & Kluth, P.A.

(57) ABSTRACT

A method of designing a cascade decomposed sequential circuit is described in which an input state graph for a sequential circuit is used to generate functions defining transitions between states of the sequential circuit. These functions are used to generate sets of states of the sequential circuit and which contain possible states of the sequential circuit. Levels are then assigned to the generated sets and states are assigned to sequential circuit components in accordance with the assigned levels. These assigned states comprise the current states of the sequential circuit components and using these states and the functions, next states for these sequential circuit components are derived.

49 Claims, 27 Drawing Sheets

OTHER PUBLICATIONS

Hartmanis, J., et al., Algegbraic Structure Theory of Sequential Machines, Prentice–Hall, Englewood Cliffs, NJ, pp. 1–211, (1966).

Krohn, K., et al., "Algebraic Theory fo Machines. I. Prime Decomposition Theorem for Finite Semigroups and Machines", *Transactions of the American Mathematical Society*, 116 (4), pp. 450–464, (Apr. 1965).

Krohn, K., et al., "Algebraic Theory of Machines, Languages, and Semigroups" Academic Press, New York, NY, 1968 (4 pages).

Kukula, J., et al., "Finite State Machine Decomposition By Transistion Pairing", *IEEE*, pp. 414–417, (1991).

Monteiro, J., et al., "Bitwise Encoding of Finite State Machines", Proceedings of the 7th International Conference on VLSI Design, pp. 379–382, (Jan. 1994).

Reynolds, B.G., "Some Results on Cascade Decomposition of Automata", *Information And Control*, 14, pp. 478–489, (1969).

Zeiger, H.P., "Cascade Synthesis of Fininte–State Machines", *Information And Control*, 10, pp. 419–433, (1967).

Zeiger, H.P., "Cascade Decomposition of Automata Using Covers", *In: Algebraic Theory of Machines, Languages, and Semigroups*, Chapter 4, Edited by M. A. Arbib, Academic Press, New York, NY, pp. 55–79, (1968).

* cited by examiner

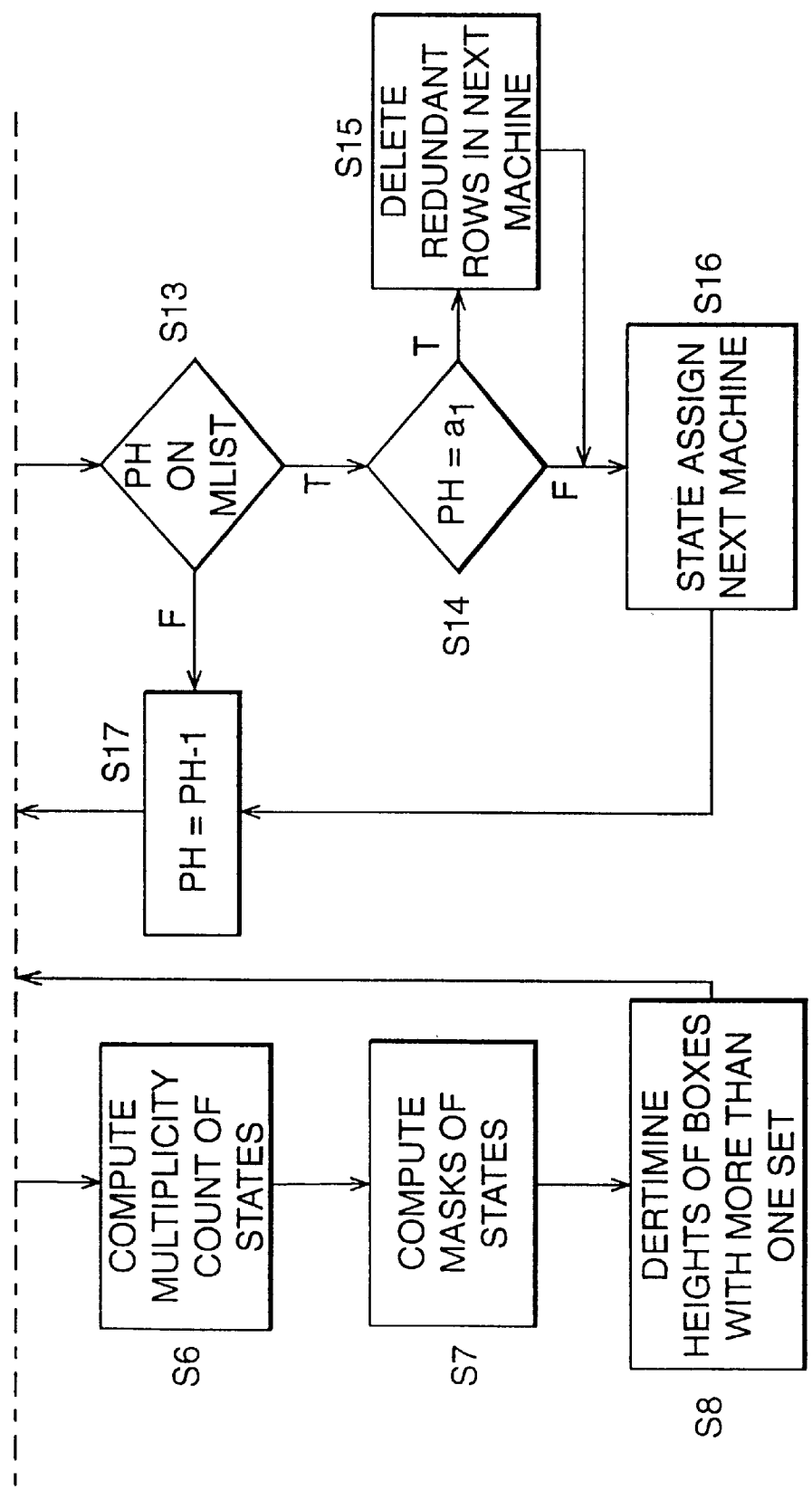
FIG. 12(CONTD.)

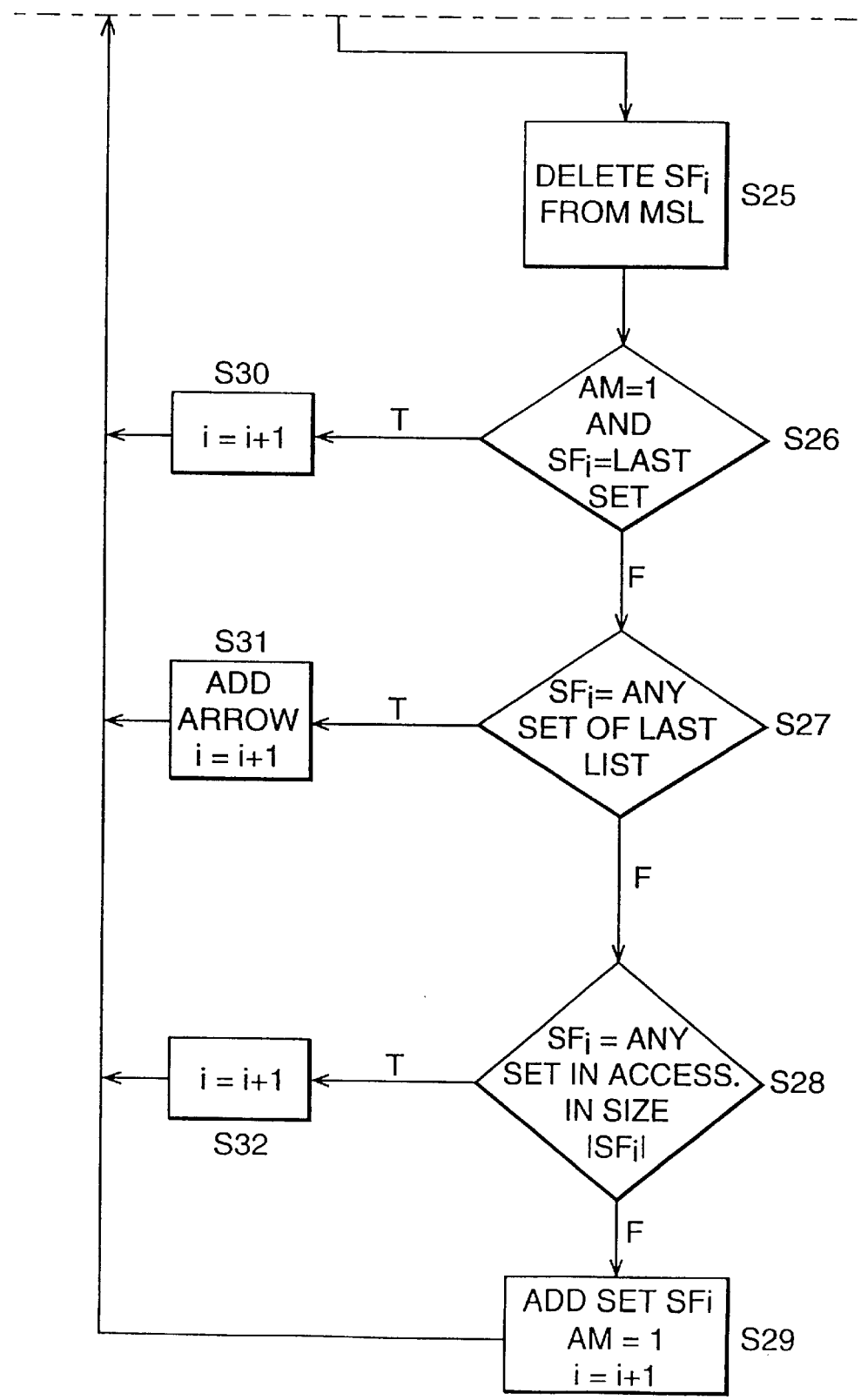
FIG. 13 (CONTD.)

METHOD OF GENERATING FINITE STATE DATA FOR DESIGNING A CASCADE DECOMPOSED LOGIC CIRCUIT

CROSS-REFERENCE TO RELATED APPLICATIONS

This application is a continuation of International Patent Application No. PCT/GB99/01160, filed on Apr. 15, 1999, which in turn is an international filing of British Patent Application No. 9808609.3 filed on Apr. 22 1998, both of which are incorporated herein by reference.

The present invention generally relates to the field of sequential circuits and more particularly to the field of cascade decomposition of sequential circuits Digital electronics sequential circuits have the property that the output depends not only on the present input but also on the past sequence of inputs. In effect, sequential circuits must be able to store something about the past history of inputs in order to produce the present output. Conventionally, a sequential circuit is synthesised as a forward path containing combinational logic and a feedback path that includes memory as shown for a Mealy sequential circuit in FIG. 1. In such an implementation the cycle time is measured from input to updating the memory.

Sequential circuits have a wide variety of applications such as code converters, sequence detectors, controllers, etc. and their speed of operation i.e. their cycle time can be a limitation in electronic equipment.

Thus, work has been carried out in an attempt to improve the speed of operation of sequential circuits.

It is known that the implementation of the sequential circuit as a set of interacting sequential circuits functioning concurrently i.e. in parallel is desirable primarily because of the resulting improvements in performance.

One such method is a decomposition approach based on the Algebraic Structure Theory disclosed in a book by J. HartManis and R. E. Stearns ("Algebraic Structure Theory of Sequential Machines", Prentis Hall, Englewood Cliffs, 1996). This work has been further analysed in a paper by M. Geiger and T. Mülle-Wipperfürth ("FSM Decomposition revisited: Algebraic Structure Theory applied to MCNC Benchmark FSMS", 28th ACM/IEEE Design Automation Conference, 1991, ACMO-89791-395-7/91/0006/0182, pages 182 to 185). In this approach a sequential circuit is decomposed into a cascade of component sequential circuits. In such a configuration all of the component sequential circuits function concurrently. It has been shown that such an approach can result in reduced cycle time and reduced circuit components and/or a reduced circuit area. However, such an approach relies on determining partitions and it is known that partitions are scarce. Consequentially, such methods rarely yield a decomposition and if they do it is typically only into two or three smaller machines.

It is known in the Algebra Structure Theory of K. Krohn and J. L. Rhodes ("Algebraic Theory of Machines, I Prane Decomposition Theorem for Finite Semi-Groups and Machines" Trans. Amer. Math. Soc. Vol. 116 (1965) pages 450 to 464) and from the later work by H. P. Zeiger ("Cascade Synthesis of Finite State Machines" Information and Control, 1967, pages 419 to 433) that the state transition graph of a sequential circuit gives rise to an algebraic structure known as a semi-group and that a semi-group can be decomposed into component semi-groups. Moreover, each decomposition of the semi-group results in a decomposition of the sequential circuit into a cascade of component sequential circuits as shown in FIG. 2 such that each machine is a permutation reset machine.

The problem of the approach of Zeiger is that his method requires the calculation of the semi-group of the sequential circuit and this can be very large. Thus the method is not generally implementable. Since the technique calculates functions for all possible sequences of inputs this can give rise to $p^p$ functions where p is the number of states in the given circuit. If the elementary functions are not fully defined the number of functions can be larger than $p^p$. Further, as can be seen in FIG. 2, the input to the $p^{th}$ circuit is the output of all the previous p-1 circuits. Clearly even for p the amount of wiring between the circuits becomes considerable and the calculations of the component machines becomes very difficult. FIG. 2 is only a schematic drawing and only shows one wire output for each circuit. In fact the number of wires is at least as large as the number of bits required to encode the states of the machine.

It is therefore an object of the present invention to provide a sequential circuit design and method in which the disadvantages of the prior art methods are overcome and a sequential circuit of reduced cycle time is produced.

In accordance with one aspect of the present invention there is provided a method and apparatus for determining the decomposition of a sequential circuit which does not require the semi-group to be calculated. From the state transition graph of the sequential circuit, a dynamic data structure is generated which represents all the information required to determine the component sequential circuits.

In accordance with another aspect of the present invention the above mentioned data structure is utilised so as to optimise the wiring so that the resulting decomposition only requires a single connection between each component sequential circuit.

In accordance with a further aspect of the present invention there is provided a method and apparatus for generating finite state graphs for designing a cascade decomposed sequential circuit from an input finite state graph for a sequential circuit, wherein functions are determined defining all transitions from the current state to a next state of the logic circuit caused by an input to the logic circuit, sets of states which include the possible state of the logic circuit are determined using the functions, the levels are assigned to the sets such that each level corresponds to one of a cascaded plurality of circuit units, each circuit unit is defined to have a plurality of the states, where each state comprises a set of states of the sequential circuit, the sets of states are assigned to the plurality of cascaded circuit units on the basis of the assigned levels such that at least two states of the circuit unit are subsets of a set of states of an immediately preceding circuit unit in the cascade, where the subsets are a cover of the set, and at least one circuit unit has a state which is a set of states of an immediately preceding circuit unit in the cascade, and next sets of states for the circuit unit are determined using the functions and the states of a proceeding circuit unit in the cascade.

In this aspect of the present invention an input can comprise any number of bits which are input within an instance in time. Where there are no transitions between states for an input the functions need not be defined.

The term "logic" is used to describe the usual circuit components used to build sequential circuits and includes logic gates and memory devices for example.

Thus, in this aspect of the present invention, extra states are added to at least one circuit unit and instead of using wires to pass states of one circuit unit to another circuit unit so that intermediate circuit units are by passed, logic is used within the intermediate circuit units to store and thereby pass on the states of the proceeding circuit units. In this way the wiring required is reduced and instead extra logic may be added if necessary into the intermediate circuit units thereby increasing the number of states of those intermediate circuit units.

Another aspect of the present invention provides a method and apparatus wherein the functions defining all the transitions from a current state to a next state of the logic circuit caused by a single input to the logic circuit are determined, sets of states which comprise possible states of the logic circuit are determined using the functions thereby ensuring that the sequences of actions which cannot possibly take place are not defined, and levels are assigned to the sets, where each level corresponds to one of the cascaded plurality of the said units, the sets of states are assigned to the cascaded circuit units on the basis of the assigned levels, information on the states of the preceding circuit units are passed along the cascade, and determining next states for the sequential circuit components using said functions and the states of preceding sequential circuit components in the cascade.

In accordance with this embodiment since sets of states are determined using the functions which are only defined for a single input to the sequential circuit and these are applied sequentially to determined sets of states, only sets of states are defined which contain a state in which the circuit can exists This technique no longer requires the calculation of the possible $n^n$ functions that may require calculations of possible $2_n$. Further, it is evident from such a technique that it is not always necessary to pass on the states of a circuit unit onto all subsequent circuit units if the state is processed in the next circuit unit and thus wiring can be reduced.

In accordance with another aspect of the present invention there is provided a sequential logic circuit for receiving an input and for generating an output wherein the logic circuit comprises at least three interacting sequential circuit units each functioning concurrently, each sequential circuit unit having an input means for receiving the input, at least one of the sequential circuits having a second input means for receiving one further input only an immediately preceding sequential circuit unit in the sequence, and the last of the sequential circuit units in the sequence having an output means for generating the output.

In accordance with a further aspect of the present invention there is provided a sequential logic circuit for receiving an input and for generating an output, the logic circuit comprising a plurality of interacting sequential circuit units which function concurrently, each said sequential circuit unit having input means for receiving the input, at least one of said sequential circuits having second input means for receiving only one further input from only an immediately preceding sequential circuit unit in the sequence, the last of said sequential circuit units, in the sequence having output means for generating the output, and at least one of the sequential circuit units is not a permutation reset machine.

A further advantage of this aspect of the present invention is that each of the circuit units is not limited to being a permutation reset circuit thus giving the circuit wider applications.

In an embodiment of the present invention the sequential circuit can be fully decomposed such that the only wiring between the circuit units comprises wires connecting immediately adjacent circuit units such that states of the circuit units which are not conventionally used as an input to an adjacent circuit unit are input into the adjacent circuit unit and simply passed therethrough until they reach a circuit unit where they are required as an input.

In such an embodiment where the number of states to be passed on becomes large, in order to reduce the amount of logic required in each circuit unit, it is preferable to feeding on the states of a circuit unit having such a large number of states using the wiring technique. This is an optimisation technique requiring a decision as to whether it is preferable to use a large amount of logic or to increase the amount of wiring between the circuit units. The use of the feed forward wiring is possible at any stage using prior art methods but in most cases desirable when sets of states are identified which can transit between each other in the manner of a closed loop. Such sets are defined as equivalent and are represented by a single one of the sets.

Another form of optimisation which can be used in an embodiment of the present invention is the merging of circuit units i.e. the reduction of the decomposition of the sequential circuit. This can either be achieved by stopping the decomposition of the sequential circuit i.e. by not determining the states of each sequential circuit unit, or by combining the states of adjacent circuit units after they have been determined. For example, in order to reduce processing it may be desirable to identify when the number of states of a circuit unit reach a threshold and to attempt to merge the circuit units thereafter in the sequence in order to reduce the amount of logic used in building the complete sequential circuit. Alternatively, once the fully decomposed sequential circuit has been designed, the performance of each of the circuit units can be determined and merging of circuit units can take place thereafter in dependence upon the performance of each of the circuit units. For example, if one of the circuit units operates particularly slowly, and therefore represents a bottleneck in the simultaneous pipeline processing, circuit units upstream or downstream of the bottleneck in the sequence can be merged thereby reducing the amount of logic without affecting the overall performance of the sequential circuit.

In accordance with a further aspect of the present invention there is provided a method of apparatus of generating finite state data for designing a cascade decompose sequential circuit for the finite state data defining current states, next states, input states and output states for a sequential circuit, the method comprising:

determining functions defining transitions from a current state to a next state of the sequential circuit caused by any of a number of possible input states to the sequential circuit;

determining sets of states which include the possible states of the sequential circuit using said functions;

determining a plurality of equivalence classes of sets of states, each said equivalence class being determined to comprise one said set and any further said sets to which said one set can transit by application of said functions and from which said one set can be transmitted to by application of said functions;

assigning a level to the sets of each said equivalence class, sets of each equivalence class being assigned the same level, each level corresponding to one of a cascaded plurality of sequential circuit components;

assigning said sets of states as states of said cascaded plurality of sequential circuit components on the basis of the assigned levels;

identifying any of the equivalence classes comprising only one said set;

for any said sequential circuit component corresponding to a said equivalence class identified by the identifying step, using the states of the sequential circuit component as inputs for only the next sequential circuit component in the cascade; and determining next states for the sequential circuit components using said functions and the states of at least one preceding sequential circuit component in the cascade as an input.

In accordance with this aspect of the present invention if an equivalence class only comprises one set, it is necessary for states of the circuit component to be passed on only to the next circuit component. In this way the amount of wiring is reduced. Thus the present inventors have realised that, in contrast to the technique of Krohn and Rhodes, it is not necessary in all circumstances to always pass on the states of every machine in a cascade to all the subsequent machine as an input. For any machine which has an equivalence class comprising only one member set, the wiring should simply only be to the next machine in the sequence. Alternatively, by identifying the points at which the wiring may be necessary, a designing can be given the option of either to use the wiring to pass on the states of the machine to each subsequent machine in the sequence, or to assign the states of the machine to the states of one or more subsequent machines whereby the states can be passed through one or more intermediate machines to reach a machine having those states.

In an embodiment of the present invention the finite state graph produced for the decomposed sequential circuit is in symbolic form and must subsequentially be state assigned to generate the finite state data in binary form used in the design of the logic for the sequential circuit. The state assignment for each of the circuit units can either be carried out as the states for each circuit unit are sequentially determined, or at the end when the symbolic states for all the circuit units have been determined. In this latter method the state assignment of each circuit unit can take place sequentially since the input to a subsequent circuit unit is defined as a binary state of a proceeding circuit unit.

In the embodiment of the present invention the levels or heights which are assigned to the states are dependent upon the order of generation and set containment e.g. the size of the sets and their order of generation during the sequential generation of the sets using the functions.

One aspect of the present invention also provides a method of manufacturing a decomposed sequential circuit wherein the finite state graphs are used for determining the circuit logic and the sequential circuit is manufactured in accordance with the determined logic design.

Since the present invention can be implemented on a computer, the present invention can also be provided as a storage medium containing instructions for controlling a processing apparatus to carry out the generation of the finite state graphs for designing the cascaded decomposed sequential circuit.

Techniques of optimal state assignment in order to determine the binary encoding of states are well known in the art e.g. the method described by J. R. Story, H. J. Harrison, E. A. Reinhard in a paper entitled "Optimum state assignment for Syndromes Sequential Circuits" (IEEE Transactions Vol. C-21, December 1972, pages 1365 to 1373) and will thus not be described in detail.

Embodiments of the present invention will now be described with reference to the accompanying drawings in which:

FIG. 1 is a schematic diagram of a Mealy sequential circuit in accordance with the prior art, FIG. 2 is a schematic drawing of a decomposed sequential circuit in accordance with the prior art, FIG. 3 is a functional diagram of apparatus in accordance with one aspect of the present invention, FIG. 4 is a schematic diagram illustrating the sets of states in an embodiment of the present invention, FIG. 5 is a schematic drawing of a decomposed sequential circuit formed of six circuit units (machines $M_1$ to $M_6$) formed using the sets of states illustrated in FIG. 4, FIG. 6 is a schematic drawings of a decomposed sequential circuit wherein the number of states of the fourth circuit unit ($M_4$) has been reduced using equivalent sets resulting in an increased wiring to pass the equivalent sets onto every subsequent circuit unit ($M_5$ and $M_6$), FIG. 7 is a schematic drawings demonstrating the generation of the sets of states using the functions, FIG. 8 is an illustration of the equivalent sets, FIG. 9 is a schematic drawing of the sets performed when the second to fourth levels of sets (or the circuit units $M_2$ to $M_4$) are merged, FIG. 10 is a schematic drawings of a decomposed sequential circuit in which circuit units ($M_2$ to $M_4$) have been merged in accordance with the set structure of FIG. 9, FIG. 10A is a schematic drawing of a decomposed sequential circuit in which the output logic is pipelined, FIG. 11 is a schematic drawing of the data structure used in an embodiment of the present invention, FIG. 12 is a general flow diagram illustrating the steps of a method of an embodiment of the present invention, FIG. 13 is a flow diagram illustrating in more detail the steps of the step S3 in FIG. 12 for computing the sets and equivalents classes, FIG. 13A is an illustration of the data structure of FIG. 11 before the Collect Boxes routine, FIG. 13B is an illustration of the data structure of FIG. 11 after the completion of the Collect Boxes routine, FIG. 13C is an illustration of the data structure of FIG. 11 when AM=0 before the Add Set routine, FIG. 13D is an illustration of the data structure of FIG. 11 when AM=0 after the Add Set routine, FIG. 13E illustrates the data structure of FIG. 11 when AM=1 before the Add Set routine, FIG. 13F illustrates the data structure of FIG. 11 when AM=1 after the Add Set routine, FIG. 13G illustrates the data structure of FIG. 11 before the implementation of the Split Lists routine, FIG. 13H illustrates the data structure of FIG. 11 after the implementation of the Split Lists routine, FIG. 14 is a flow diagram illustrating in more detail the steps of steps S4 in FIG. 12 for computing the height of each equivalence class, FIG. 15 is a flow diagram illustrating in more detail the steps of step S5 of FIG. 12 for computing the states of each equivalence class, FIG. 16 is a flow diagram illustrating in more detail the steps of step S12 of FIG. 12 for building the next machine from the current machine, FIG. 17 is a flow diagram illustrating in more detail the steps of step S72 in FIG. 16 for generating the present states, FIG. 18 is a flow diagram illustrating in more detail the steps of step S73 of FIG. 16 for updating the present state list, FIG. 19 is a flow diagram illustrating in more detail the steps of step S74 in FIG. 16 for updating inputs, FIG. 20 is a flow diagram illustrating in more detail the steps of step S75 in FIG. 16 for updating the working sets, FIG. 21 is a flow diagram illustrating in more detail the steps of step S76 in FIG. 16 for computing the next states, FIG. 22 is a flow diagram illustrating in more detail the steps of step S78 of FIG. 16 for updating the entry sets, and FIG. 23 is a flow diagram illustrating in more detail the steps of step S80 of FIG. 16.

The principles and concepts of the present invention will now be described.

FIG. 3 is a diagram of the functional components of the apparatus of the present invention which is typically implemented as a computer program running on a standard computer. The method can however be implemented in hardware or using the combination of hardware and software.

As can be seen in FIG. 3 the finite state data is input into the data input means 1. The finite state data comprises a state table or graph defining transitions between the current state and the next state for input data and associated output states. One conventional form of such data for use in a computer implemented method of designing sequential circuits is termed a Kiss file. An example of a Kiss file for a sequential circuit having seven possible states is illustrated in Table 1 below:

TABLE 1

| Input | Current State | Next State | Output |
|---|---|---|---|
| 0 | 1 | 6 | 00 |
| 0 | 2 | 5 | 00 |
| 0 | 3 | 5 | 00 |
| 0 | 4 | 6 | 00 |
| 0 | 5 | 1 | 10 |
| 0 | 6 | 1 | 01 |
| 0 | 7 | 5 | 00 |
| 1 | 1 | 4 | 00 |
| 1 | 2 | 3 | 00 |
| 1 | 3 | 7 | 00 |
| 1 | 4 | 6 | 10 |
| 1 | 5 | 2 | 10 |
| 1 | 6 | 2 | 01 |
| 1 | 7 | 6 | 10 |

As can be seen in the table above, the input is defined as a binary input having two values 0 or 1. The present and next states are defined symbolically and have seven possible states 1 to 7. The output states are given as binary having four possible values 00, 01, 10 or 11, although the value 11 does not appear in the output.

The input data is passed to both a set calculator 2 and a function generator 4. The function generator 4 extracts functions. Each function defines transitions between a present state and a next state for one particular input. Thus in this example two functions $F_0$ and $F_1$ are derived and these are shown in Tables 2 and 3 below:

TABLE 2

| $F_0$ | | | | | | |
|---|---|---|---|---|---|---|
| 1 | 2 | 3 | 4 | 5 | 6 | 7 |
| 6 | 5 | 5 | 6 | 1 | 1 | 5 |

TABLE 3

| $F_1$ | | | | | | |
|---|---|---|---|---|---|---|
| 1 | 2 | 3 | 4 | 5 | 6 | 7 |
| 4 | 3 | 7 | 6 | 2 | 2 | 6 |

The set calculator 2 determines the sets of states which include the possible states in which the sequential circuit can exist. These are determined using the input state data from the data input means 1 and the functions from the function generator 4 as will be described in more detail hereinafter.

The set height calculator 3 then assigns a height or level to each of the calculated sets calculated by the set calculator 2. The calculated height of each set is then used by the machine present state calculator 5 to assign the calculated sets from the set calculator 2 to states of machines i.e. circuit units. The details of how the states are assigned will be described in more detail hereinafter.

The machine next state calculator 6 then calculates the next states for each machine using the present states calculated by the present state calculator 5 and the functions generated by the function generator 4. In this way a file of states data for each machine is determined where the output of each machine (but not the last circuit) is the present state of the machine thus providing a state table or graph for each machine which can be used using a conventional technique for the design of logic required to implement the sequential circuit components of a cascade decomposed sequential circuit.

Details of what occurs in each of the functional components of FIG. 3 will now be described with reference to an example of a sequential circuit for which the state table or graph is input as given in Table 1.

The input state table can be reorganised as shown in Table 4 below to more clearly illustrate the relationship between the current state and the next state for different input data.

TABLE 4

| Current State | Input Data | | Output for | Output for |
|---|---|---|---|---|
| | 0 | 1 | Input 0 | Input 1 |
| 1 | 6 | 4 | 00 | 00 |
| 2 | 5 | 3 | 00 | 00 |
| 3 | 5 | 7 | 00 | 00 |
| 4 | 6 | 6 | 00 | 10 |
| 5 | 1 | 2 | 10 | 10 |
| 6 | 1 | 2 | 01 | 01 |
| 7 | 5 | 6 | 00 | 10 |

From Table 4 the function generator determines the functions $F_0$ and $F_1$ as given in Tables 2 and 3 herein above.

As can be seen in Table 4 the current states defines a state set which gives the possible states in which the sequential circuit can exist. Thus the state set is {1,2,3,4,5,6,7}. Using this state set, the functions $F_0$ and $F_1$ are applied in order to determine image sets. The functions are also repeatedly applied to the image sets to determine further image sets until all possible image sets of size 2 or greater are determined. FIG. 7 illustrates this process. As can be seen, starting with the state set {1,2,3,4,5,6,7}, when function $F_1$ is applied the image set {4,3,7,6,2} is derived and using the function $F_0$ the image set {6,5,1} is derived. The subsequent application of the functions $F_0$ and $F_1$ to the image sets {4,3,7,6,2} results in only one further new image set {6,7, 2,3}. The application of the functions $F_0$ and $F_1$ to the image sets {6,5,1} results in the generation of the image sets {2,4} and {6,1}. The application to the functions to the image set {6,7,2,3} results in only one new image set {1,5}. The application of the functions to the image set {1,5} results in no new image sets whereas the application of the functions to the image set {2,4} results in two new image sets {5,6} and {3,6}. The application of the functions to the set {3,6} results in only one new image set {7,2}.

No further sets of size 2 or greater can be generated by the application of the functions.

As can be seen in FIG. 7, the sets {1,5}, {2,4}, {6,1}, {3,6} and {7,2} can all be transmitted from the set {1,5} and can transit to the set {1,5} and thus form a closed loop. By identifying such a loop it is possible to define these sets as equivalent sets as illustrated in FIG. 8. The identification of equivalent sets enables the number of states of a machine to be reduced by representing all of the equivalent sets by a single set i.e. {1,5} and by using the conventional wiring technique to pass on the sets of states to all subsequent machines in the sequence. This is an optimisation technique which can reduce the number of states and thus the amount of logic required for the machines in the sequence. This optimisation technique will be described in more detail hereinafter.

Having identified the sets which a current state of the machine can be a member of, the next step is to assign the sets of states to machines in a sequence. In order to do so it is necessary to decide which sets of states are to be states of a machine. Thus, a height or level is assigned to each set or to the equivalent sets. There are several ways in which this can be done. In this embodiment the height of the set is determined based both on the size of the set and on its order of generation using the sequential application of the functions $F_0$ and $F_1$ as illustrated in FIG. 7. In this embodiment the size of the set is the initial factor which decides the height of the set. For sets which are of the same size, the order of generation of the set then determines the height for that set. If a set can be transmitted to or is a subset of another set then the latter has a height of less than or equal to the height of the former. Thus, once a height has been assigned to a set, this height corresponds to a machine and thus the distribution of sets as states of machines can be illustrated diagrammatically as shown in FIG. 4.

AS can be seen in FIG. 4 the state set {1,2,3,4,5,6,7} does not represent the state of any real machine. As however will be described in more detail hereinafter the state set is used for the generation of a dummy machine in order to determine the states of the first machine $M_1$. The set {1,2,3,4,5,6,7} has a height of 5, the set {4,3,7,6,2} has height 4, the set {6,7,2,3} has height 3, the set {6,5,1} has height 2, the sets {3,6}, {7,2}, {2,4}, {6,1} and {1,5} have height 1, and set {5,61} has height 0. Thus, these sets are assigned to respective machines $M_1$ and $M_5$. However, the sets of each machine must comprise a cover of the set of a previous machine and in the case of the first machine M1 the sets must be a cover of the state set. Sets which have a height lower than the machine in which they are generated by decomposition of a set into subsets must be passed down to the machine having the correct height so that the set can then be decomposed into its subsets. For example, as can be seen in FIG. 4 the set {6,5,1} is passed through machines $M_1$ and $M_2$ to machine $M_3$ which is of the correct height. Thus, machines $M_1$ and $M_2$ require extra logic in order to store this state. Similarly, {2,4} is generated by the subset of {4,3,7,6,2} in the machine $M_2$ and is passed through machine $M_3$ to machine $M_4$ whereupon it can be decomposed into is maximal elemental sets in the machine $M_5$.

Thus, FIG. 4 illustrates the states of each machine in a fully cascade decomposed sequential circuit and also each branch illustrates the configuration of machines at any instant of time. Such a circuit is illustrated in FIG. 5. Each machine $M_1$ to $M_6$ receives the input and each machine $M_2$ to $M_6$ receives an additional input from the preceding machine in the cascade. The final machine of the cascade $M_6$ generates the output.

So far what has been described is the generation of the current states of each machine. However, in order to generate the finite state tables, it is also necessary to determine the next states of each machine. The principles of this process will now be described.

The machine $M_1$ has the current states {4,3,7,6,2} and {6,5,1} and the functions $F_0$ and $F_1$ are applied in order to determine the next states of the machines which comprise sets of states of the sequential circuit. Table 5 below gives the state Table for the machine $M_1$. The output of the machine $M_1$ is simply the current state of the machine.

TABLE 5

| Current State | Input Data | |
|---|---|---|
| | 0 | 1 |
| 6,5,1 | 6,5,1 | 4,3,7,6,2 |
| 4,3,7,6,2 | 6,5,1 | 4,3,7,6,2 |

For the second machine $M_2$ the inputs are the states of the machine $M_1$ and the input data. Thus, when the current state is {6,5,1} the input from machine $M_1$ must be {6,5,1} and thus an input is 0 or 1 by applying functions, the sets could transit to {6,1} or {2,4}. However the state {6,1} is not a state of this machine but is contained within the set {6,5,11} and thus the machine must transit to the state {6,5,1}. This technique is applied to all the machines. The state table for machine $M_2$ is given below in Table 6.

TABLE 6

| Current State | Input (States of $M_1$ & Data) | | | |
|---|---|---|---|---|
| | 6,5,1&0 | 6,5,1&1 | 4,3,7,6,2&0 | 4,3,7,6,2&1 |
| 6,5,1 | 6,5,1 | 2,4 | x | x |
| 6,7,2,3 | x | x | 6,5,1 | 6,7,2,3 |
| 2,4 | x | x | 6,5,1 | 6,7,2,3 |

It can be seen from Table 6 that no next states are defined when the current state is {6,5,1} and the input from machine $M_1$ is {4,3,7,6,21} since the machine could not have been in this state. Similarly, when the machine $M_2$ is in the state {6,7,2,3} the input from machine $M_1$ cannot be {6,5,11}.

When the current state of machine $M_2$ is {6,7,2,3} and the input is 0, this can transit to {1,5}. However, this is not a state of this machine and thus it must transit to the state {6,5,1}. Similarly, when the current state of the machine is {2,4} the machine could transit to the state {5,6} when an input 0 is received. However, since this is not the state of this machine, what the state must transit to the state {6,5,1}. Further, the state {2,4} could transit with an input 1 to {13,6}. Since this not a state of this machine the state transmitted to is {16,7,2,3}.

Table 7 below illustrates the state of the $M_3$. This receives the inputs of the states of machine $M_2$ plus the data input. As can be seen, the next states of the machines are only defined for the diagonal components and once again the current state can only transit to a state of the present machine.

TABLE 7

| Current State | Input (States of $M_2$ & Data) | | | | | |
|---|---|---|---|---|---|---|
| | 6, 5, 1 & 0 | 6, 5, 1 & 1 | 6, 7, 2, 3 & 0 | 6, 7, 2, 3 & 1 | 2, 4 & 0 | 2, 4 & 1 |
| 6, 5, 1 | 6, 5, 1 | 2, 4 | x | x | x | x |
| 3, 6 | x | x | 6, 5, 1 | 7, 2 | x | x |
| 7, 2 | x | x | 6, 5, 1 | 3, 6 | x | x |
| 2, 4 | x | x | x | x | 6, 5, 1 | 3, 6 |

Table 8 illustrates the states of machine $M_4$ this receives as an input the states of machine $M_3$ and the data input.

TABLE 8

| Current State | Input (States of $M_3$ & Data) | | | | | | | |
|---|---|---|---|---|---|---|---|---|
| | 6, 5, 1 & 0 | 6, 5, 1 & 1 | 3, 6, & 0 | 3, 6 & 1 | 7, 2 & 0 | 7, 2 & 1 | 2, 4 & 0 | 2, 4 & 1 |
| 1, 5 | 6, 1 | 2, 4 | x | x | x | x | x | x |
| 1, 6 | 6, 1 | 2, 4 | x | x | x | x | x | x |
| 5, 6 | 6, 1 | 2, 4 | x | x | x | x | x | x |
| 3, 6 | x | x | 1, 5 | 7, 2 | x | x | x | x |
| 7, 2 | x | x | x | x | 1, 5 | 3, 6 | x | x |
| 2, 4 | x | x | x | x | x | x | 5, 6 | 3, 6 |

Table 9 illustrates the states of machine $M_5$. It can be seen from this table that the current states of the machine are the elemental sets. Each elemental set includes an indication of its set of origin i.e. each subset identifies the set from which it was derived. This is necessary in order to identify the branch of the tree illustrated in FIG. 4 in which the states of the machine are currently residing. In fact, although not described in all of the tables, each set identifies its set of origination so that the branch of the tree of FIG. 5 can be identified.

TABLE 9

| Current State | Input (States of $M_4$ & Data) | | | | | | | | | | | |
|---|---|---|---|---|---|---|---|---|---|---|---|---|
| | 1, 5 & 0 | 1, 5 & 1 | 6, 1 & 0 | 6, 1 & 1 | 5, 6 & 0 | 5, 6 & 1 | 3, 6 & 0 | 3, 6 & 1 | 7, 2 & 0 | 7, 2 & 1 | 2, 4 & 0 | 2, 4 & 1 |
| 1(1, 5) | 6(6, 1) | 4(2, 4) | x | x | x | x | x | x | x | x | x | x |
| 5(1, 5) | 1(6, 1) | 2(2, 4) | x | x | x | x | x | x | x | x | x | x |
| 6(6, 1) | x | x | 1(6, 1) | 2(2, 4) | x | x | x | x | x | x | x | x |
| 1(6, 1) | x | x | 6(6, 1) | 4(2, 4) | x | x | x | x | x | x | x | x |
| 5, 6 | x | x | x | x | 1(1, 6) | 2(2, 4) | x | x | x | x | x | x |
| 3(3, 6) | x | x | x | x | x | x | 5(1, 5) | 7(7, 2) | x | x | x | x |
| 6(3, 6) | x | x | x | x | x | x | 1(1, 5) | 2(7, 2) | x | x | x | x |
| 7(7, 2) | x | x | x | x | x | x | x | x | 5(1, 5) | 6(3, 6) | x | x |
| 2(7, 2) | x | x | x | x | x | x | x | x | 5(1, 5) | 3(3, 6) | x | x |
| 2(2, 4) | x | x | x | x | x | x | x | x | x | x | 5, 6 | 3(3, 6) |
| 4(2, 4) | x | x | x | x | x | x | x | x | x | x | 5, 6 | 6(3, 6) |

Table 10 is a state table of the final machine $M_6$ in the cascade and thus its output is the output of the sequential circuit and not the current states of the machine.

TABLE 10

| Current State | From 1, 5 | | | | From 6, 1 | | | | | | From 3, 6 | | | | From 7, 2 | | | | From 2, 4 | | | | Output for input 0 | Output for input 1 |
|---|---|---|---|---|---|---|---|---|---|---|---|---|---|---|---|---|---|---|---|---|---|---|---|---|
| | 1 & 0 | 1 & 1 | 5 & 0 | 5 & 1 | 1 & 0 | 1 & 1 | 6 & 0 | 6 & 1 | 56 & 0 | 56 & 1 | 3 & 0 | 3 & 1 | 6 & 0 | 6 & 1 | 7 & 0 | 7 & 1 | 2 & 0 | 2 & 1 | 2 & 0 | 2 & 1 | 4 & 0 | 4 & 1 | | |
| 1 / (1, 5) | 6 (1, 6) | 4 (2, 4) | x | x | x | x | x | x | x | x | x | x | x | x | x | x | x | x | x | x | x | x | 00 | 00 |
| 5 / (1, 5) | x | x | 1 (1, 6) | 2 (2, 4) | x | x | x | x | x | x | x | x | x | x | x | x | x | x | x | x | x | x | 10 | 10 |
| 6 / (6, 1) | x | x | x | x | 1 (6, 1) | 2 (2, 4) | x | x | x | x | x | x | x | x | x | x | x | x | x | x | x | x | 01 | 01 |
| 1 / (6, 3) | x | x | x | x | x | x | 6 (6, 1) | 4 (2, 4) | x | x | x | x | x | x | x | x | x | x | x | x | x | x | 00 | 00 |
| 5 / (5, 6) | x | x | x | x | x | x | x | x | 1 (1, 6) | x | x | x | x | x | x | x | x | x | x | x | x | x | 10 | 10 |
| 6 / (5, 6) | x | x | x | x | x | x | x | x | x | 2 (2, 4) | x | x | x | x | x | x | x | x | x | x | x | x | 01 | 01 |
| 3 / (3, 6) | x | x | x | x | x | x | x | x | x | x | 5 (1, 5) | 7 (7, 2) | x | x | x | x | x | x | x | x | x | x | 00 | 00 |
| 6 / (3, 6) | x | x | x | x | x | x | x | x | x | x | x | x | 1 (1, 5) | 2 (2, 7) | x | x | x | x | x | x | x | x | 01 | 01 |
| 7 / (7, 2) | x | x | x | x | x | x | x | x | x | x | x | x | x | x | 5 (1, 5) | 6 (3, 6) | x | x | x | x | x | x | 10 | 00 |
| 2 / (7, 2) | x | x | x | x | x | x | x | x | x | x | x | x | x | x | x | x | 5 (1, 5) | 3 (3, 6) | x | x | x | x | 00 | 00 |
| 2 / (2, 4) | x | x | x | x | x | x | x | x | x | x | x | x | x | x | x | x | x | x | 5 (5, 6) | 3 (3, 6) | x | x | 00 | 00 |
| 4 / (2, 4) | x | x | x | x | x | x | x | x | x | x | x | x | x | x | x | x | x | x | x | x | 6 (5, 6) | 6 (3, 6) | 00 | 00 |

In the example given above the states of any machine which are at the wrong height are always passed down through intermediate machines to the machine at the right height. However, as can be seen from machine $M_4$ when the number of states becomes large this is likely to require a large amount of logic in the machine in order to represent these states. An optimisation technique which can be used in order to reduce the amount of logic is based on the identification of sets which are equivalent. This concept of equivalent states has already been mentioned and can now be considered in more detail.

As can be seen in FIG. 7, since each of the sets {2,4}, {6,1}, {3,6} and {7,2} can be transmitted to from the set {1,5} by some sequence of inputs whilst preserving the orders of the sets, the set {1,5} can be transmitted to from each of the sets {2,4}, {6,1}, {3,6} and {7,2} it is possible to use the states of the set {1,5} to identify the states of the equivalent sets. Thus, the states of the set {1,5} can be used as coordinates to identify the states of the equivalent sets. Table 11 below illustrates this wherein the states of the sets {1,5} are used as coordinates to define the states of the equivalent sets.

TABLE 11

| Equivalent Set Coordinates | Equivalent Sets | | | | |
|---|---|---|---|---|---|
| | 1,5 | 6,1 | 2,4 | 3,6 | 7,2 |
| 1 | 1 | 6 | 2 | 3 | 7 |
| 5 | 5 | 1 | 4 | 6 | 2 |

Machine $M_5$ simply has the states of the set {1,5} and the state {5,6} as given in Table 12 below.

TABLE 12

| Current State | Input (States of $M_4$ & Data) | | | | | | | | | | | |
|---|---|---|---|---|---|---|---|---|---|---|---|---|
| | 1, 5 & 0 | 1, 5 & 1 | 6, 1 & 0 | 6, 1 & 1 | 3, 6 & 0 | 3, 6 & 1 | 7, 2 & 0 | 7, 2 & 1 | 2, 4 & 0 | 2, 4 & 1 | 5, 6 & 0 | 5, 6 & 1 |
| 1 | 1 | 5 | 5 | 1 | 5 | 1 | 5 | 5 | 5, 6 | 1 | x | x |
| 5 | 5 | 1 | 5 | 5 | 1 | 5 | 5 | 1 | 5, 6 | 5 | x | x |
| 5, 6 | x | x | x | x | x | x | x | x | x | x | 5 | 1 |

It can clearly be seen by comparing Table 12 with Table 9 that this optimisation technique is likely to reduce the amount of logic required for machine $M_5$ and thus reduces the logic requirements for this machine.

Table 13 below gives the states of the final machine $M_6$ when using this optimisation technique.

TABLE 13

| Current State | Input (States of $M_4$ & States of $M_5$ & Data) | | | | | | | | | | | | |
|---|---|---|---|---|---|---|---|---|---|---|---|---|---|
| | 1, 5 & 1 & 0 | 1, 5 & 1 & 1 | 1, 5 & 5 & 0 | 1, 5 & 5 & 1 | 6, 1 & 1 & 0 | 6, 1 & 1 & 1 | 6, 1 & 5 & 0 | 6, 1 & 5 & 1 & 0 | 3, 6 & 1 & 0 | 3, 6 & 1 & 1 | 3, 6 & 5 & 0 | 3, 6 & 5 & 1 | 3, 6 & 1 & 0 | 7, 2 & 1 & 1 |
| 1 | 1/00 | 5/100 | x | x | 5/01 | 1/01 | x | x | 5/00 | 1/00 | x | x | 5/00 |
| 5 | x | x | 5/10 | 1/10 | x | x | 1/00 | 5/00 | x | x | 1/01 | 5/01 | x |
| 5 (5, 6) | x | x | x | x | x | x | x | x | x | x | x | x | x |
| 6 (5, 6) | x | x | x | x | x | x | x | x | x | x | x | x | x |

| Current State | Input (States of $M_4$ & States of $M_5$ & Data) | | | | | | | |
|---|---|---|---|---|---|---|---|---|
| | 7, 2 & 5 &: 0 | 7, 2 & 5 & 1 | 7, 2 & 1 & 0 | 2, 4 & 1&: 1 | 2, 4 & 5 & 0 | 2, 4 & 5 & 1 | 2, 4 & 56 & 0 | 5.6 & 1 |
| 1 | 5/10 | x | x | 5(5, 6)/00 | 1/00 | x | x | x |
| 5 | x | 5/00 | 1/00 | x | x | 6(6, 5)/00 | 5/10 | x |
| 5 (5, 6) | x | x | x | x | x | x | 5/10 | 1/10 |
| 6 (5, 6) | x | x | x | x | x | x | 5/01 | 1/01 |

As can be seen from Table 13 the input to machine $M_6$ is the states of machine $M_4$, the states of machine $M_5$ and the input data. In Table 13 the output states have been included with the next states in the table. These are the same as given for machine $M_6$ in Table 10.

FIG. 6 schematically illustrates the cascade decomposed sequential circuit which has been optimised using this technique in order to reduce the logic required in machine $M_5$ and subsequent machines. As can be seen in FIG. 6 there is no longer simply a feeding of the states of each machine sequentially to the next machine only. Machine $M_4$ feeds the states not only to machine $M_5$ but also to each subsequent machine which in this case is only machine $M_6$.

This technique is thus likely to significantly reduce the amount of logic which is required when equivalent sets can be identified. It does however have a disadvantage that additional wiring is required. Whether this optimisation technique is used depends upon a balance between the use of logic or the use of wiring.

Another optimisation technique will now be described with reference to FIGS. 9 and 10.

It is possible for the states of adjacent machines to be combined. This combination reduces the amount of logic but can reduce the speed of operation of the combined sequential circuit component. The combination of sequential circuit components can be achieved in two ways. When the sets are calculated, if there are a large number of sets of the same size and of equivalent height this can result in a large number of states for one particular machine or a large number of inputs for a particular machine (where wiring is used), since the state assignment process for machines having large number of states can be difficult, it may be advantageous to stop the further decomposition below this level of sets.

Alternatively, when all of the circuit units have been determined, a parameter of each circuit unit is determined in order to determine which units should be combined. For example a speed of operation of each circuit unit can be determined in order to identify which of the circuit units is the slowest and if one of the circuit units is significantly slower than the others, thus causing a bottleneck in the processing, other circuit units could be combined without detrimentally affecting the overall performance.

Referring now to FIG. 9, in this diagram the sets of heights 2 to 4 have been combined and this combination process has resulted in the sets which are the lowest subsets. In this case the sets are the states of the last machine in the combination i.e. machine $M_4$. It can thus clearly be seen from FIG. 9 that the intermediate subsets have been omitted.

Table 14 bellow illustrates the state table for the merged circuit unit $M_{2-4}$.

TABLE 14

| Current State | Input Data | | | |
|---|---|---|---|---|
| | 6,5,1&0 | 6,5,1&1 | 4,3,7,6,2 &0 | 4,3,7,6 2&1 |
| 1,5 | 6,1 | 2,4 | x | x |
| 1,6 | 6,1 | 2,4 | x | x |
| 5,6 | 6,1 | 2,4 | x | x |
| 3,6 | x | x | 1,5 | 7,2 |
| 7,2 | x | x | 1,5 | 3,6 |
| 2,4 | x | x | 5,6 | 3,6 |

FIG. 10 schematically illustrates such a cascaded decomposed sequential circuit in which the amount of decomposition is reduced.

Since the current states of the compound machine $M_{2-4}$ are the same as the states of the original machine $M_4$, the optimisation technique which uses equivalent sets could also be applied in order to reduce the number of states of machine $M_5$. Thus, in an embodiment of the present invention either one of the optimisation techniques could be used on its own or they can be used in combination In any of the embodiments described hereinabove, the last circuit component in the sequence contains the logic necessary in order to generate the output states. However, it is well known that the output logic can be pipelined as shown in FIG. 10A wherein as can be seen in this embodiment the four sequential circuit components M1, M2, M3 and M4 each output their current states as an input to the next circuit in the sequence the final circuit in the sequence is a logic circuit 400 which simply receives the current input, the state of the last machine M4 and generates an output. Table 15 below illustrates the logic table for the logic circuit 400.

TABLE 15

| State of | Input | |
|---|---|---|
| Machine M4 | 0 | 1 |
| 1 | 00 | 00 |
| 2 | 00 | 00 |
| 3 | 00 | 00 |
| 4 | 00 | 10 |
| 5 | 10 | 10 |
| 6 | 01 | 01 |
| 7 | 00 | 10 |

As can be seen from Table 15 the two-bit output state depends on the state of the machine M4 and the input state.

Specific Embodiment

A specific embodiment of the invention will now be described which uses a particular dynamic data structure in order to process the input state graph for the sequential circuit to generate the state graphs for each of the circuit components of the cascade decomposed sequential circuit.

The method of this specific embodiment uses the optimisation technique wherein equivalent sets are identified in order to reduce the logic of the circuit components.

In this embodiment the dynamic data structure is used in order to determine the sets and equivalences and to assign a height to the sets.

FIG. 12 is a flow diagram illustrating generally the steps of this embodiment of the present invention.

In step S1 the finite state data for the sequential logic circuit is input in the form of a Kiss file as illustrated in Table 1.

In step S2 the functions $F_p$ defining the state transitions of the sequential circuit are computed and the outputs determined for the p functions. Where p=2, these functions are as illustrated in Tables 2 and 3.

In step S3 the sets and Equivalence Classes are computed as will be described in more detail in FIG. 13.

In step S4 a height of each equivalence class is then calculated. The height function is calculated such that sets of larger size are given larger height. Sets which have the same size are then given a height depending on their order of generation using the functions. For instance, as can be seen in FIG. 7 although with the set {5,6} is of the same size of the equivalence set, it is given a lower height since it is generated from members of the equivalence class.

In step S5 the states of each equivalence class are then computed as will be described in more detail with regard to FIG. 15.

In step S6 a multiplicity count of each state is determined which is a count for the number of times sets are repeated. The non-repeating states are assigned a zero multiplicity count. If a state (which is a set) occurs as a set for more than one equivalence class, each repetition gets a count with the first occurrence getting 1, the second occurrence getting 2, etc.

In step S7 a mask for each state is computed relative to a first set (Root) in the equivalence class of which it is a state. A mask of a state is a size of the set of which the state is subset. This comprises a binary code which indicates which components of the set the subset comprises. For example, the subsets {3,6} and {7,2} are subsets of {6,7,3,2} and their masks are 1010 and 0101 respectively.

In step S8 the heights of Boxes containing more than one set are determined. In the present implementation wires are fed forward for every machine corresponding to a height preceding a machine corresponding to a height at which an equivalence class consists of more than one set.

In step S8A using the height information, the user determines which machines are to be constructed and inputs a descending sequence (Mbist) which must comprise any of the heights +1 given in step S8 and 0. The maximum value of the MList must be less than or equal to the maximum height.

In step S9 a dummy machine is generated as an initial machine in the cascade of machines. This machine has one state which is a set consisting of all the states of the sequential circuit. This dummy machine is generated such that there are no transitions for an input i.e. the next state is the same as the current state.

In step S10 the Processing Height PH is then set to a maximum height and the process then enters the loop for generating the state graphs corresponding to the machines in the MList. The maximum height is set to be the height of the set consisting of all the states of the sequential circuit.

The processing loop is then entered in step S11 by determining whether the Processing Height PH=−1. If not in step S12 a process to build the next machine from the current machine takes place. This process is described in more detail in the flow diagram of FIG. 16.

In step S13 it is determined if the next machine is to be synthesised. If not the Processing Height (PH) is decremented in step S17 and the process returns to step S11. If the next machine is to be synthesised, in step S14 it is determined if it is the first machine in the cascade. If so, in step S15 redundant rows in the next machine are deleted and the process proceeds to step S16 and if not the process proceeds to step S16.

In step S16 states are then assigned to the machine using a conventional state assignment process. The exact method of state assignment is not material for the present invention. If the next machine is the last machine the outputs are associated with the machine so a full Kiss file for the machine is determined.

In step S17 the Processing Height (PH) count is decremented and in step S18 the row determined in step S80 of FIG. 16 (to be described hereinafter) is made to be the first row in the next machine and the remaining rows are numbered with consecutive integers.

If in step S11 all of the machines have been built PH=−1 and the process proceeds to step S19 wherein the circuits for each of the machines is generated using the created Kiss files for each machine together with information on the interconnections between each of the machines and the outputs to be generated by the last machine. The method for generating the circuit logic for the cascade decomposed sequential circuit can be any conventional logic assignment procedure. The exact method of assigning the logic is not material for the present invention.

Referring now to FIGS. 11 and 13 the steps for computing the sets and the Equivalence Classes will now be described in more detail. This procedure utilizes the dynamically allocated data structure and this will first be described with reference to the FIG. 11.

A Master Set List (MSL) is created and partitioned into cells. Each cell is indexed by an integer and each cell contains a list of sets of the size by which it is indexed. The Master Set List contains a list of sets which are to be processed and thus sets are inserted into and removed from the Master Set List. The sets are ordered in the Master Set List, such that a set in a cell having an index n precedes any set in a cell with a lower index even if the set in the lower index was inserted before the set in the cell of index n. Within a cell, the sets are ordered such that a first set precedes a second set if the first set was inserted into the Master Set List before the second set. This ordering of the sets within the Master Set List determines the order of processing.

Each size from 2 to n, where n is the number of states of the sequential circuit has associated with it a list of Accessibles 101. A new Accessible is created everytime a set is removed from the Master Set List. Each Accessible has associated with it a list of Lists 102. Each List has associated with it a list of Boxes 103. Each Box has associated with it a list of Sets 104. Each Set comprises a set of integers denoting the states of the sequential circuit and has associated with it a list of structures referred to as Top Sets 105.

The steps of computing the sets and Equivalence Classes will now be described with reference to FIG. 13.

The generation of the data structure is initiated by inserting the set {1,2,3,4,5,6,7} into a cell indexed by 7 in the Master Set List (MSL). A function count i is initiated to 0 and the added marker AM is set equal to 0 (step S20). The set {1,2,3,4,5,6,7} is removed from the MSL and an Accessible is created, with one List; the list having one Box and the Box having associated with it one Set {1,2,3,4,5,6,7} (step S21). In the preferred embodiment where the input Kiss file is illustrated in Table 1, there are two input values giving rise to two functions and thus p=2. Since i is not equal to 2 (in step S22) the function $F_0$ is evaluated on the set {1,2,3,4,5,6,7}. Thus the routine Evaluate Function determines the set $SF_0$={6,5,1} (step S23).

Given a function F and a set S={4,3,6,7,2}, we shall use the notation SF to denote the set obtained (without repetitions) by evaluating the function F on the members of S. In this example $SF_1$={6,7,2,3}. This procedure is referred to as the Evaluate Function procedure.

Since the size of $SF_{01}$ (denoted $|SF_0|$=3), $|SF_0|$=3<$|S|$=7, (step S24) the set {6,5,1} is added to the MSL in a cell indexed by 3 (since the MSL does not contain {6,5,1} and the function counter i is incremented by 1 so that i=1 (step S35).

A test is made to see if i=2 (step S22) and since it is not, the Evaluate Function routine is called with S={1,2,3,4,5,6,7} and $F_1$ this returns the set $SF_1$={4,3,7,6,2} (step S23). Since the $|Sf_1|$=5<$|S|$=7 (step S24) the set {4,3,7,6,2} is added to the MSL in a cell indexed by 5 (since the MSL does not contain {4,3,7,6,2}. The MSL now contains the sets {4,3,7,6,2} and {6,5,1} and the function counter is incremented by 1 so that i=2 (step S35).

Since i=2 (step S22) and AM=1 (step S33) the routine Collect Boxes is called.

The Collect Boxes routine is called with a list of Boxes associated with a Last List and a collection of arrows. If the collection of arrows is empty then nothing is done. Otherwise the routine Determine Ranges is called followed by the routine Configure Boxes.

The Determined Ranges routine will now be described. B1, B2, ... Bn with a list of boxes and let [j1, k1], [j2,k2]. . . [jp, kp] be the collection of arrows.

The following is done until no arrows remain.
1. The minimum value of j1, J2 . . . jp is determined for the collection of arrows and denoted by jm.
2. Then the collection of arrows is searched through which have their j values less than or equal to km and this collection is called the reachable collection. If there are none, the value [jm, km] is noted and the procedure returns to 1 above.
3. The reachable collection determined in 2 above is removed from the original collection and the remaining arrows are called the collection of arrows.
4. For the reachable collection of arrows determined in 2 above the maximum value of associated k values is determined. This is called km and the process returns to 2 above.

For example suppose B1, B2 . . . B15 are the Boxes and in the initial collection of arrows are [3,6], [4.5], [6,8], [7,10], [12,12], [14,15] (see FIG. 13A):
  A. the minimum value is 3;
  B. in the example km=6, and so the arrows with their j values less than or equal to 6 are [3,6], [4,5], [6,8], (the reachable collection);
  C. the collection of arrows becomes [7,10], [12,12], [14,15];
  D. the maximum k values for the arrows of step B is 8 and the routine goes to 2 above with km=8;
  E. the arrows in the collection with their i value less than or equal to 8 is [7,10];
  F. the collection of arrows becomes [12,12], [14,15];
  G. the maximum value for the arrows is determined in step E above is 10;
  H. when the collection [12,12], [14,15] is searched for the arrows with their j values less than or equal to 10, it can be seen that there are none so the values [3,10] are noted.

Continuing in this way the Determine Ranges routine returns the value [3,10], [12,12] and [14,15].

The Configure Boxes routine will now be described. Given a collection of Boxes and values (j1,k1) . . . (jp,kp) from the Determine Ranges routine, all the sets associated with the Boxes labelled from j1 to k1 are associated to a single Box and this is done for each of the values given by the Determine Ranges procedure.

The data structure following the Collect Boxes routine is illustrated in FIG. 13B.

In FIG. 13, since there are no arrows linking Boxes, there are no Boxes to collect and thus this routine does nothing (step S36). Since there are no Top Sets associated with the last List (step S37) the function count i is set to 0 and the AM flag is set to 0 (step S39).

The MSL contains the sets {4,3,7,6,2} and {6,5,1}. The set {4,3,7,6,2} is removed from the MSL and an Accessible is created such that the set associated with it contains {4,3,7,6,2} (step S21). Since i is not equal to 2 (step S22) the Evaluate Function routine returns $SF_0=\{6,5,1\}$ (step S23) and since $|SF_0|=3<|S|=5$ (step S24) and since the MSL currently contains {6,5,1} $SF_0=\{6,5,1\}$ is not added to the MSL (step S35). The function counter i is incremented by 1 and i=1.

Since i is not equal to p the Evaluate Function routine is called (step S23) with S={4,3,7,6,2} and $F_1$ to return $SF_1=\{6,7,2,3\}$ (step S23), the sizes of which is less than 5 (step S24). The set {6,7,2,3} is added to the MSL so that the MSL contains the set {6,7,2,3} and {6,5,1} (step S35). The function counter is once again incremented (step S35) so that i=2 i.e. i=p (Step S22) and since the AM flag is not set (step S33) the Collect Boxes routine is called and once again does nothing. The function count i and AM are set to 0 (step S39).

The set {6,7,2,3} is then removed from the MSL and an Accessible is created with its associated set having {6,7,2,3} (step S21).

Since i is not equal to p (step S22) the Evaluate Function routine (step S23) returns $SF_0=\{1,5\}$ which is added to the MSL (step S35).

Once again the Evaluate Function routine is called with S={6,7,2,3} and $F_1$ returns $SF_1=\{2,6,3,7\}$ (step S23). Since the $|SF_1|=|S|$ (step S24) $SF_1$ is deleted from the MSL but the MSL only contains {6,5,1} and {1,5} so nothing is done. It is then determined whether the set $Sf_1=\{2,6,3,7\}$ matches any set associated with the last List. Two sets are said to match if they comprise the same integers irrespective of their order. This is denoted hereinafter by an equals sign. Since the last List has the set {6,7,2,3} associated with it the test is true (step S27) and the routine Add Arrow is called which returns [1,1] which indicates that the set loops to itself and i is incremented to 2 (step S31).

The Add Arrow routine takes a list of Boxes, B1, B2 . . . Bp, a set SF and a value for AM. If AM=0 then all the sets associated to all the Boxes are searched. As soon as a match is found with Sr the routine returns the arrow [m,p], where Bm is the Box in which the match was found.

If AM=1 all the sets associated to all the Boxes B1 . . . Bp–1 are searched. As soon as a match is found with SF the routine returns an arrow [m, p–1], where Bm is the Box in which the match was found.

Since i=2 and AM is not equal to 1 the Collect Boxes routine is called (step S36) but nothing is done and i and AM are reset (step S39).

The set S={6,5,1} is removed from the MSL and an Accessible is created with it (step S21). The Evaluate Function routine is called with {6,5,1} and $F_0$ and returns {1,6} (step S23) which is added to the MSL (step S35).

The Evaluate Function routine is called again with S={6, 5,1} and $F_1$ and it returns {2,4} (step S23) which is added to the MSL (step S25).

The MSL now contains {1,5}, {1,6}, {2,4}. {1,5} is removed from the MSL (step. S21) and the Evaluate Function routine is called with {1,5} and $F_0$. It returns $SF_0=\{6,1\}$ (step 23). Since $|SF_0|=2=|S|$ and {6,1}={1,6} the latter being in the MSL, {1,6} is deleted from the MSL (step S25) and the MSL now contains {1,5} and {2,4}.

The last List only has the set {1,5} associated with it and since $SF_0=\{6,1\}$ does not match with {1,5} any set of size two, but there is only the one Accessible and each has the set {1,5} associated with it which again does not match {6,1}. The routine Add Set is then called and a new Last Box is added and the set {6,1} is associated with it. AM is then set to 1 and i is incremented by 1 to take the value 1.

The Add Set routine will, now be described. This routine is entered with a set SF and a value for AM which is 0 or 1. The Top Sets which are associated to sets which are in turn associated with the Last List are searched. If a match with SF is found then this Top Set is deleted. If AM=1 and SF matches a Top Set associated to the previous to last set in the List, then the Top Set is not deleted. If AM=0 then a new Last Box is added and associated to it is the Bet SF. If N=1 the set SF is added as a Top Set to the set which is associated to the previous to last Box. AM is then set to 1.

The Evaluate Function routine is once again called with S $\{1,5\}$ and $F_1$ (step S23). $SF_1=\{4,2\}$ is returned which is then deleted from the MSL (step S25). $SF_1$ does not match the set $\{1,5\}$ in last List and also does not match any set associated with Accessible in size two (step S27 and step S28). AM=1 so that the set $\{2,4\}$ is added to a Top Set to the previous to last set i.e. to the set $\{1,5\}$. The function count i takes the value 2. The Evaluate Function routine is then called with S=$\{6,1\}$ and $F_0$ and it returns $SF_0=\{1,6\}$. $SF_0=\{1,6\}$ matches the set $\{6,1\}$ and so the arrow [2,2] is added and i is set to 1 (step S31). The Evaluate Function routine is once again called with S=$\{6,1\}$ and $F_1$ and it returns $SF_1=\{2,4\}$. Since $\{2,4\}$ matches the Top Set associated with the set $\{1,5\}$ this Top Set is deleted (step S29). Also AM=0 so a new Last Box is added and it has the set $\{2,4\}$ associated with it. AM is then set to 1 and i is set to 2. The Evaluate Function routine is then called with $\{2,4\}$ and $F_0$. This returns $SF_0=\{5,6\}$. A new Last Box is added and the set $\{5,6\}$ is associated with it (step S29). The Evaluate Function routine is once again called with $\{2,4\}$ and $F_1$ and returns $SF_1=\{3,6\}$. Since Am=1, $SF_1=\{3,6\}$ is added as a Top Set associated with the set $\{2,4\}$ (stop S29). The Evaluate Function routine is then called once more with $\{5,6\}$ and $F_0$ and returns $SF_0=\{1\}$. Since $|SF_0|=\{1\}$, $\{1\}$ is not added to the MSL and i equals 1.

The Evaluate Function routine is once again called with $\{5,6\}$ and $F_1$ and returns $SF_1=\{2\}$. $SF_1=\{2\}$ is not added to the MSL and i=2. Since i=2 and AM is not equal to 1 the Collect Boxes routine is invoked but does nothing in this case. A test is made to see it any of the sets associated with the Last List has a Top Set associated with it. The set $\{3,6\}$ is associated as a Top Set to the set $\{2,4\}$ and so the Split Lists routine is invoked.

The Split Lists routine will now be described. This routine is invoked with a Last List. In a first step a search is made through the list of Boxes associated with the List and the last Box which has a set associated with it which in turn has a Top Set associated with it is determined. Two lists are formed, the first has associated with it the Boxes following the Box determined in the first step. This is then made to be the first List associated with the Last Accessible and a second List contains all the Boxes from the first Box to the Box determined in the first step. This latter List is then made to be the last List with the Last Accessible. The sets associated with the Box are left as they are. A new last Box is then created and the first (and last) Box associated with it now has as its set the first Top Set found in the Box determined in the first step. This Top Set is deleted as a Top Set. AM and i are then set to 0.

Figure 13:
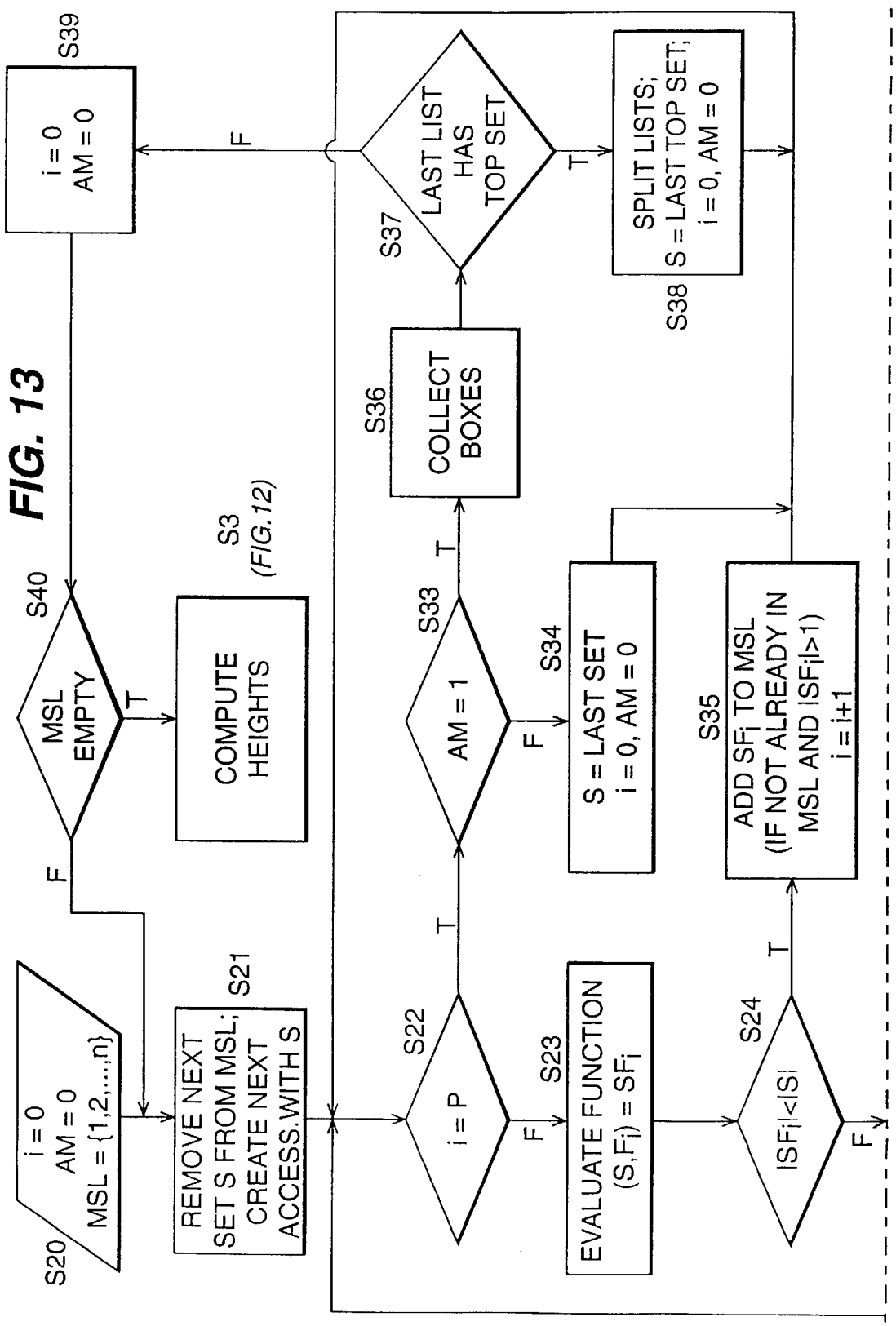
FIGS. 13C and 13D illustrate the data structure when AM=0 before and after the Add Set routine respectively.
FIGS. 13E and 13F illustrate the data structure when AM=1 before and after the Add Set routine respectively.
Figure 13A:
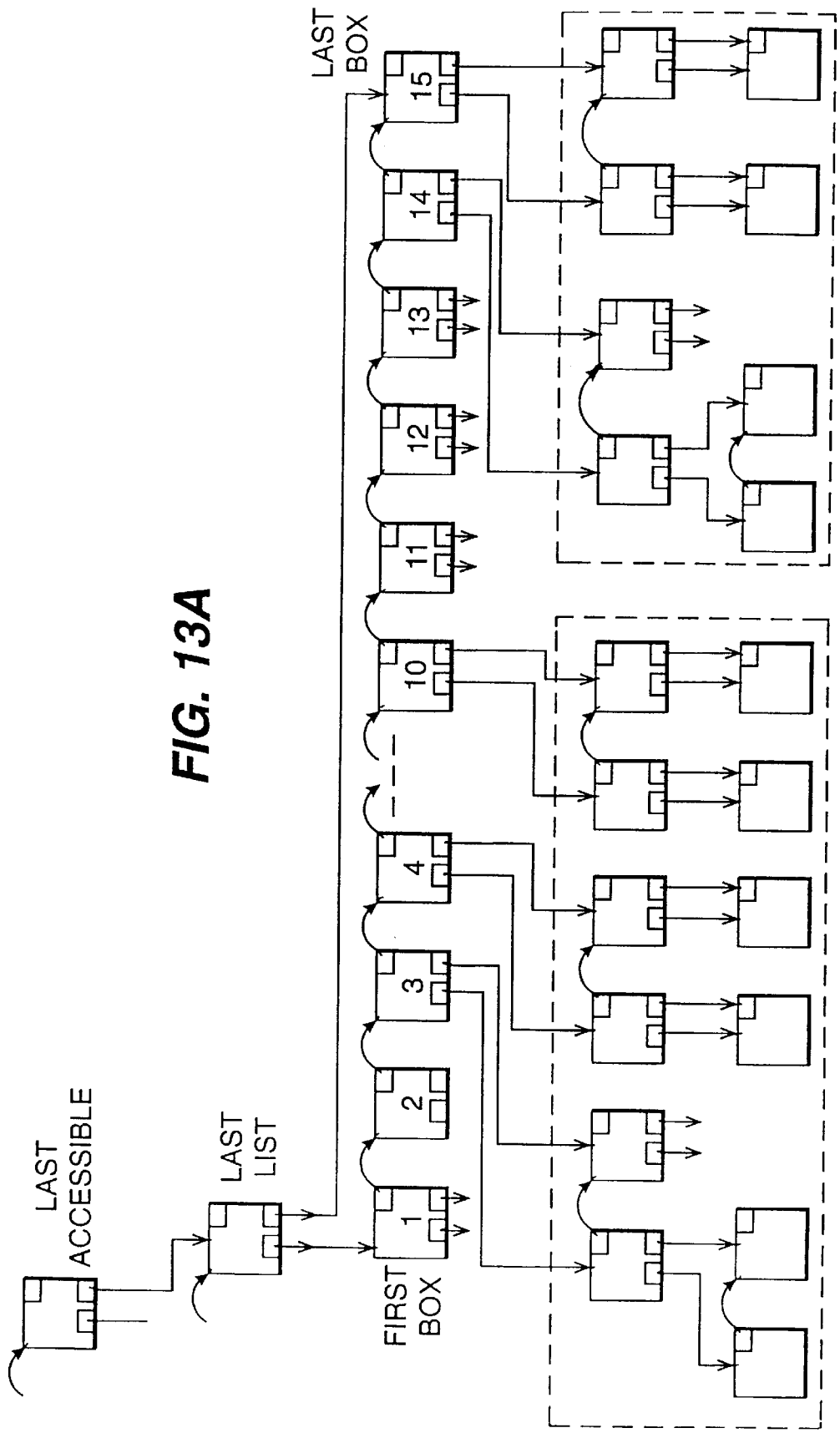
Figure 13B:
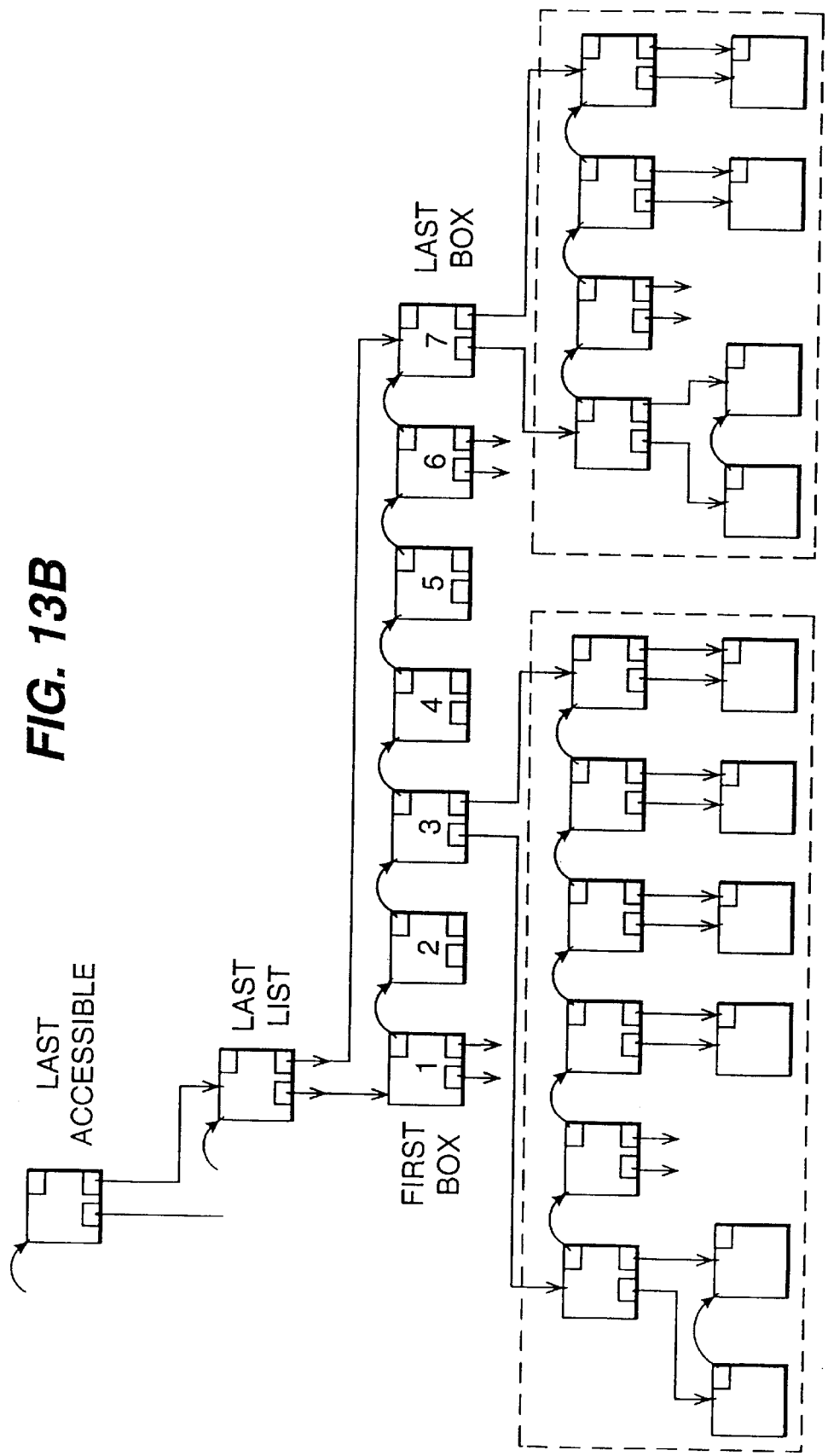
Figure 13C:
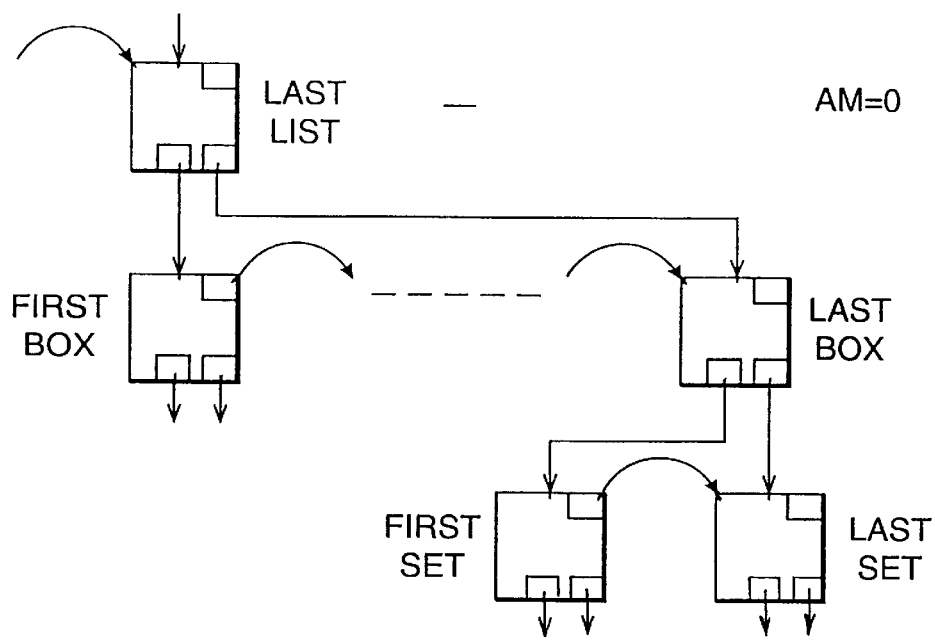
Figure 13D:
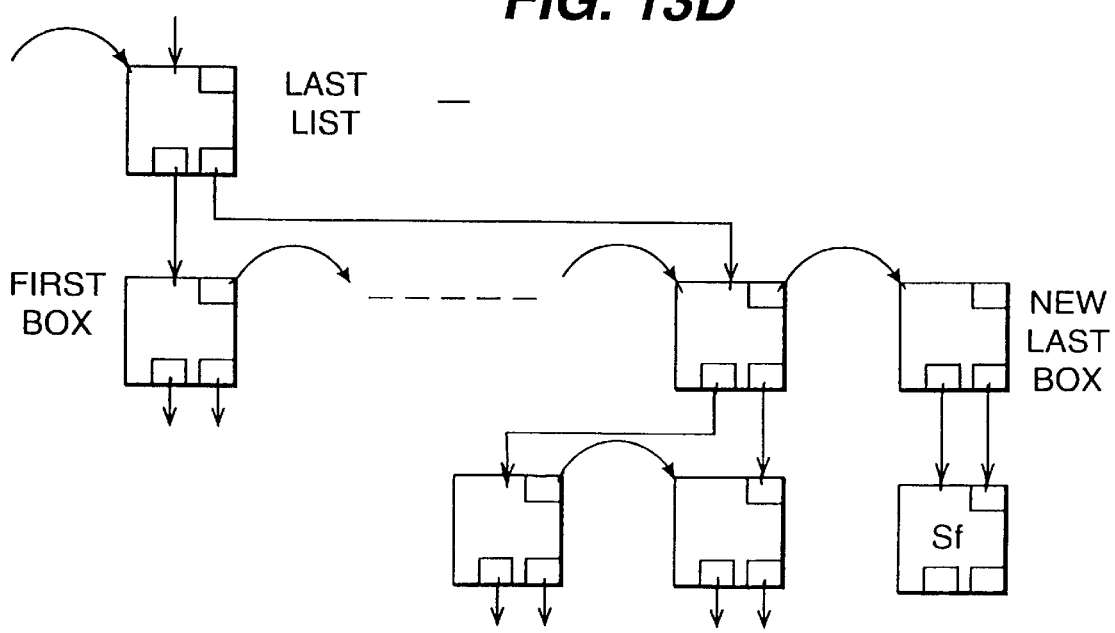
Figure 13E:
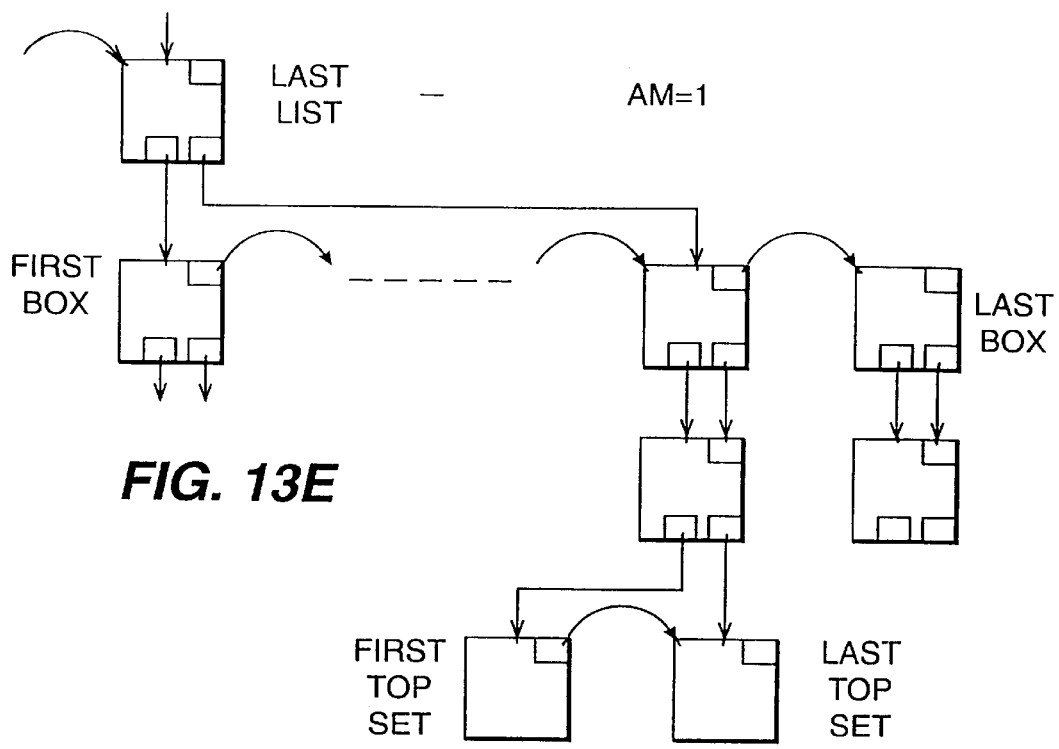
Figure 13F:
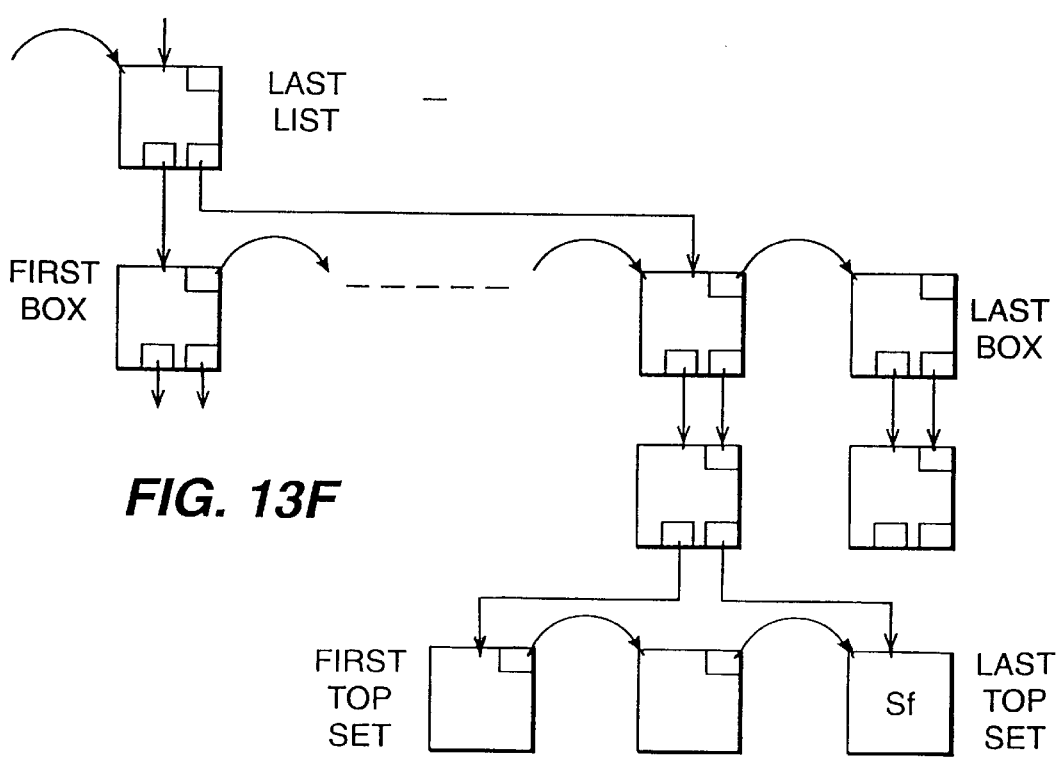
Figure 13G:
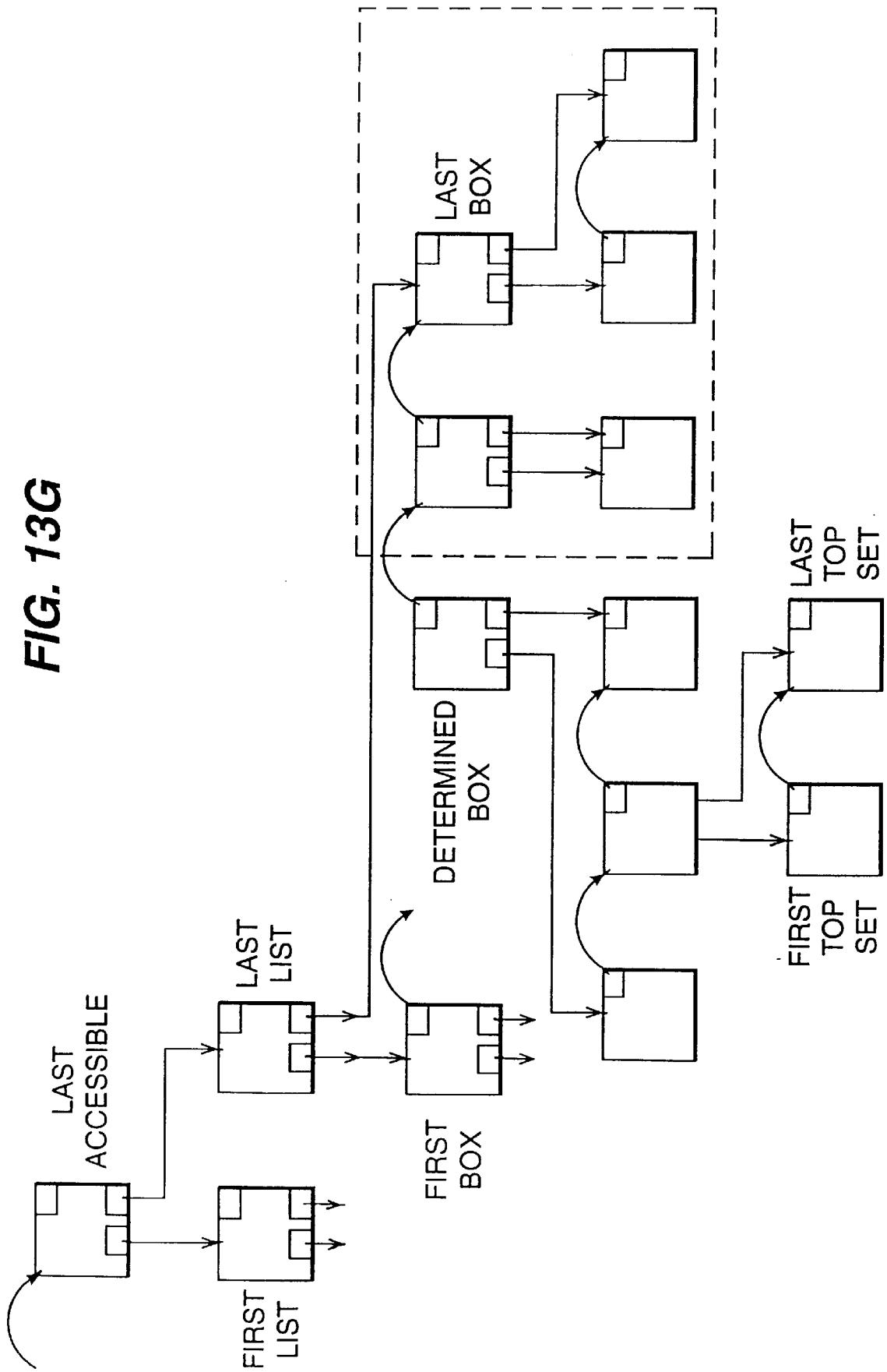
Figure 13H:
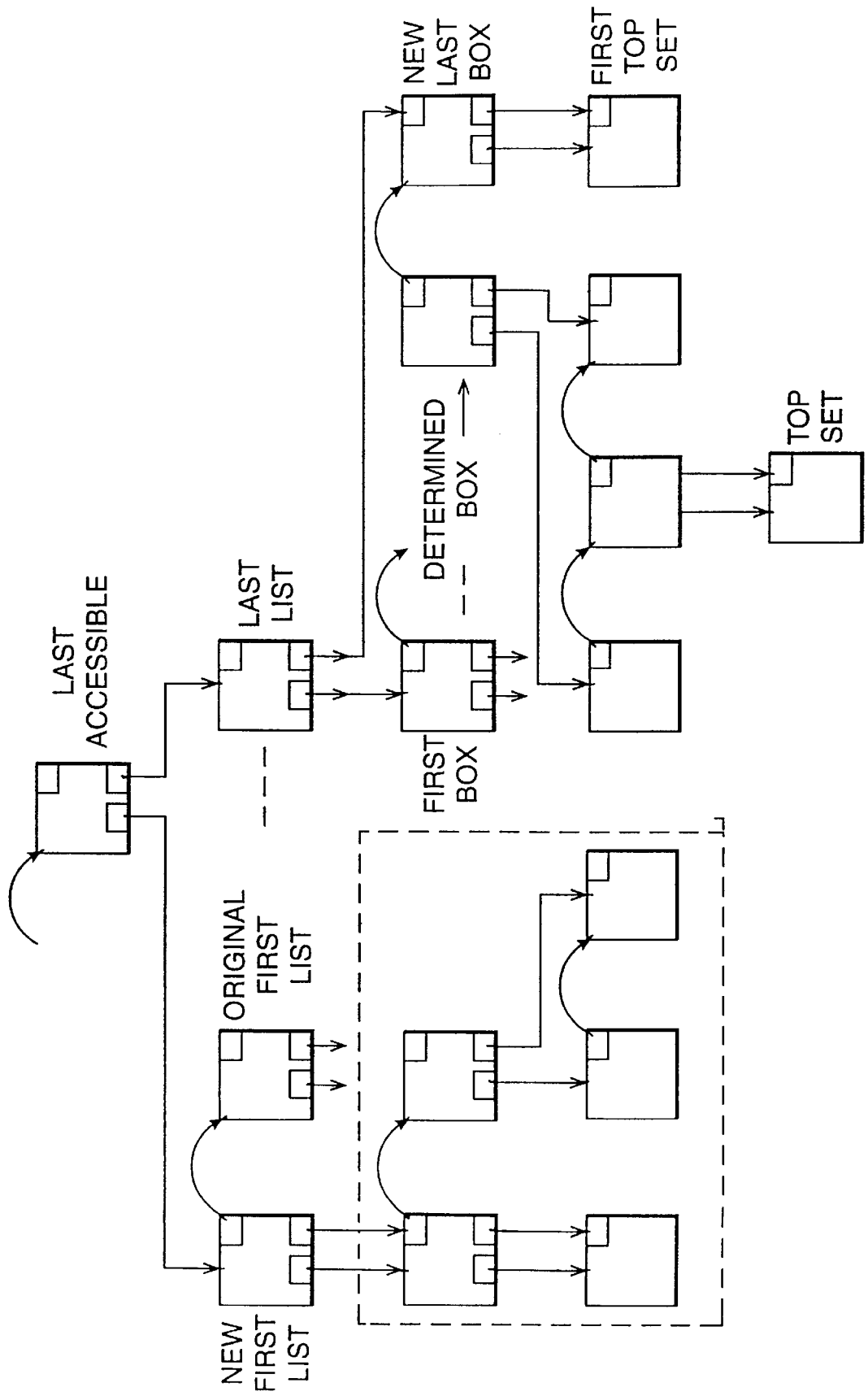

FIGS. 13G and 13H illustrate the data structure before and after the implementation of the Split Lists routine.

Two lists are created, the first containing one box with associated set $\{5,6\}$ and the last list has four Boxes with associated sets $\{1,5\}$, $\{6,1\}$, $\{2,4\}$ and $\{3,6\}$ respectively.

The Evaluate Function routine is called once more with $\{3,6\}$ and $F_0$ and returns $\{5,1\}$. An arrow [1,4] is added in (step S31).

The Evaluate Function routine is once again called with $\{3,6\}$ and $F_1$ and returns $\{7,2\}$. Since AM=0 a new Last Set is added with set $\{7,2\}$ and AM is set to 1 and i is set to 2 (step S29).

The Evaluate Function routine is once again called with $\{7,2\}$ and $F_0$ and returns $\{5\}$ which is not added to the MSL.

The Evaluate Function routine is once again called with $\{7,2\}$ and $F_0$ and returns $\{6,3\}$. Since a match is found i.e. $\{6,3\}$ matches $\{3,6\}$ a set in the Last List (step S27) in step S31 an arrow in [4,5] is added and i=2.

Since i=2 but AM is not equal to 1 the Collect Boxes routine is called which results in the Last List just having one box containing the sets $\{1,5\}$, $\{6,1\}$, $\{2,4\}$, $\{3,6\}$ and $\{7,2\}$.

Since no Top Sets exist and the MSL is empty the generation of the dynamic data structure is complete.

Figure 14:
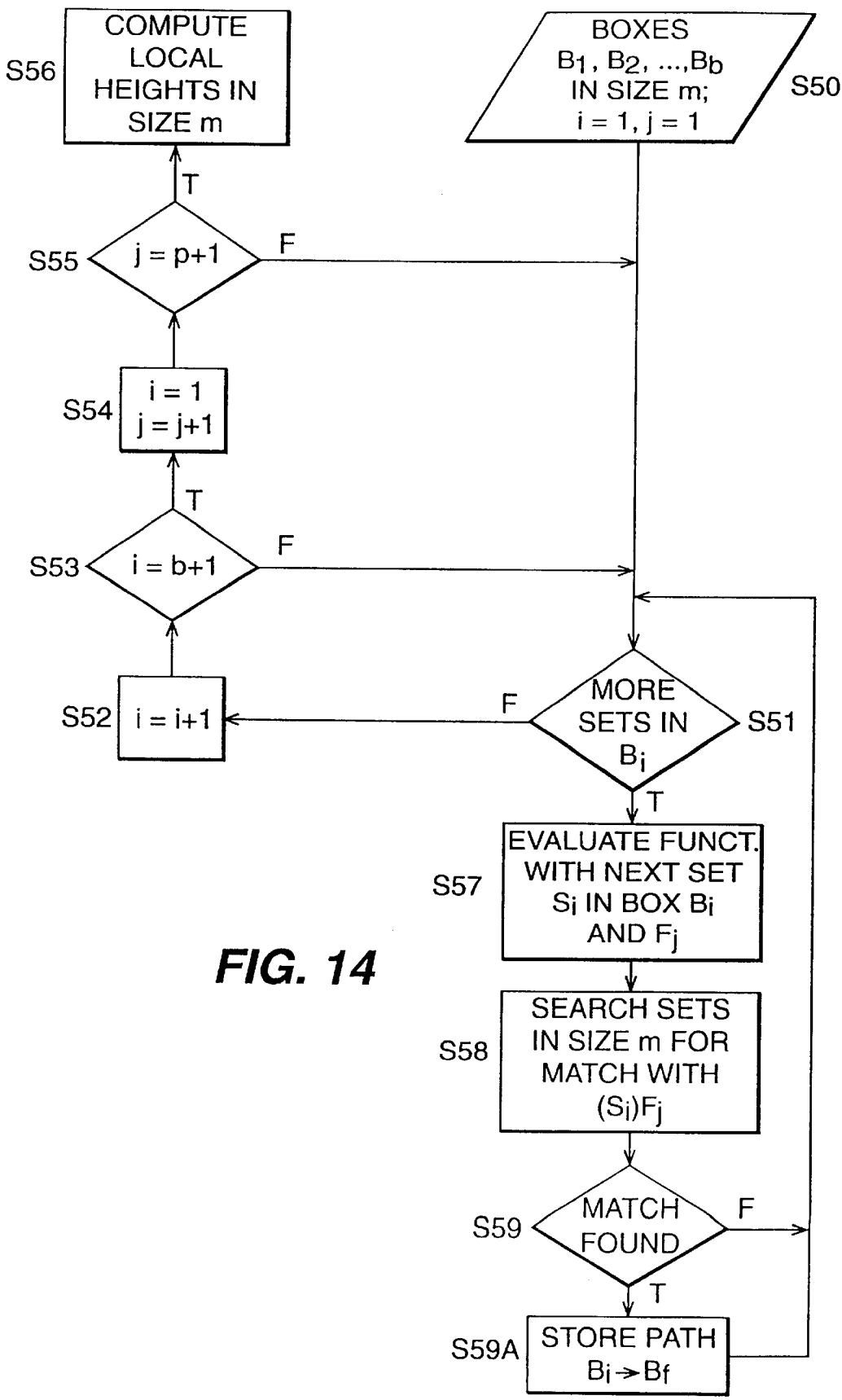

The step of computing the height of each equivalent class (step S4 in FIG. 12) will now be described with reference to FIG. 14.

In step S50 the routine is entered with all the Boxes B1 . . . Bb associated with size m. The Box Count Ci is set to 1 and the Function Count j is set to 1.

In step S51 it is determined if there are any more sets in the Box Bi and if not the Box count i is incremented in step S52. It is then determined in step S53 whether all the Boxes have been processed and if so the Box count is reset to 1 and the function count is incremented in step S54. Then in step S55 it is determined if the processing has been carried out with all the functions (step S55) and if so in step S56 Local Heights are computed.

By the point of computing the Local Heights a tree has been constructed. The Local Height of each Box is the length of the longest path from the Box to a terminal node (one with no paths emanating from it have a Local Height equal to 0).

If in step S53 i is not equal to p+1 and if in step S55 j is not equal to p+1, the process returns to step S51.

If in step S51 there are more sets in Dig in step S57 the Evaluate Function routine is called with the next set Si in Box Bi and the function j. Then in step S58 sets in size m are searched for a match with the set obtained in S58. Then in step S59 it is determined if a match is found and if not the process returns to step S51. If a match is found a path is stored from Box Bi to Box Bf, where Bf is the Box in which the match was found, only if the path has not already been stored (step S59A). The process then returns to step S51.

Once all the graphs have been computed, the heights are adjusted as follows. The lowest size which contains a set as determined and the actual height of each Box in this size is equal to the Local Height.

For the size m (which contains a set) the maximum actual height in the previous size with a set is added to each of the Local Heights in size m. Each set in a box is assigned the Height of the Box.

Figure 1:
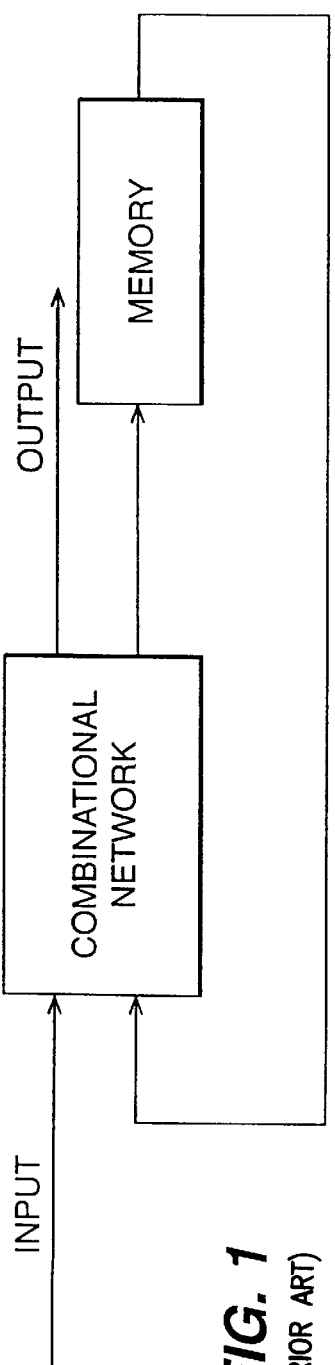
Figure 2:
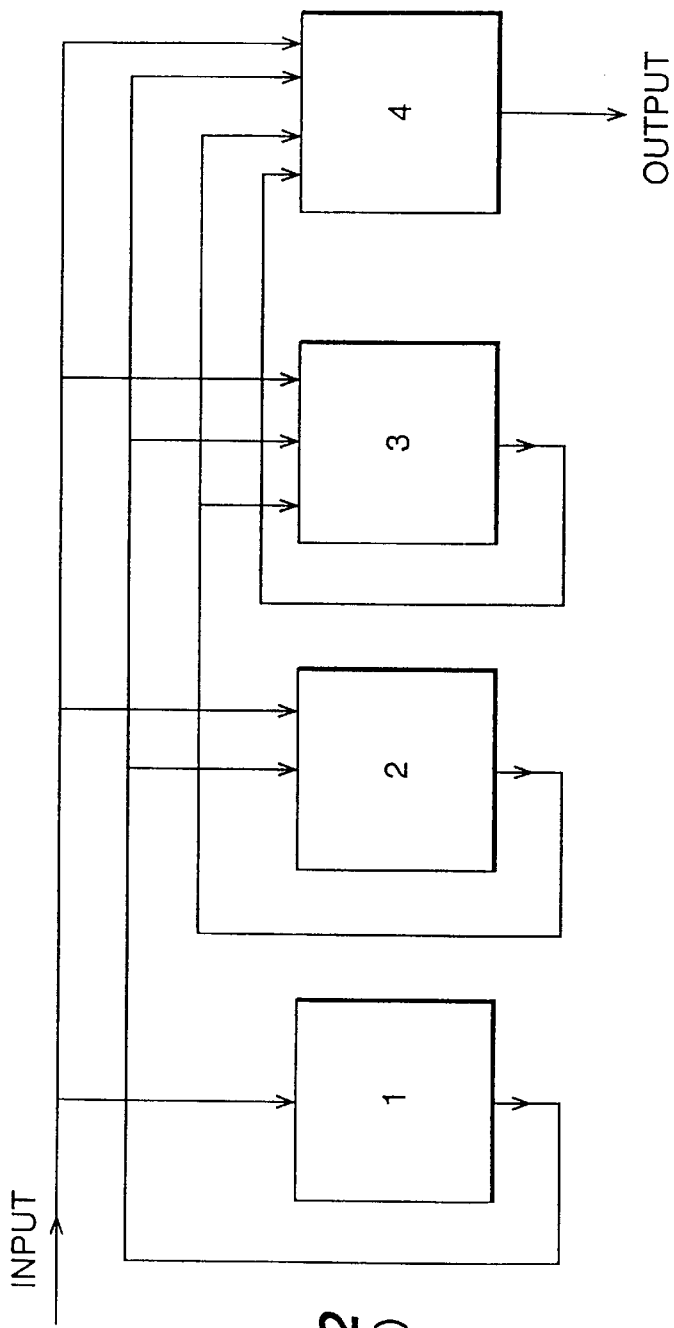
Figure 3:
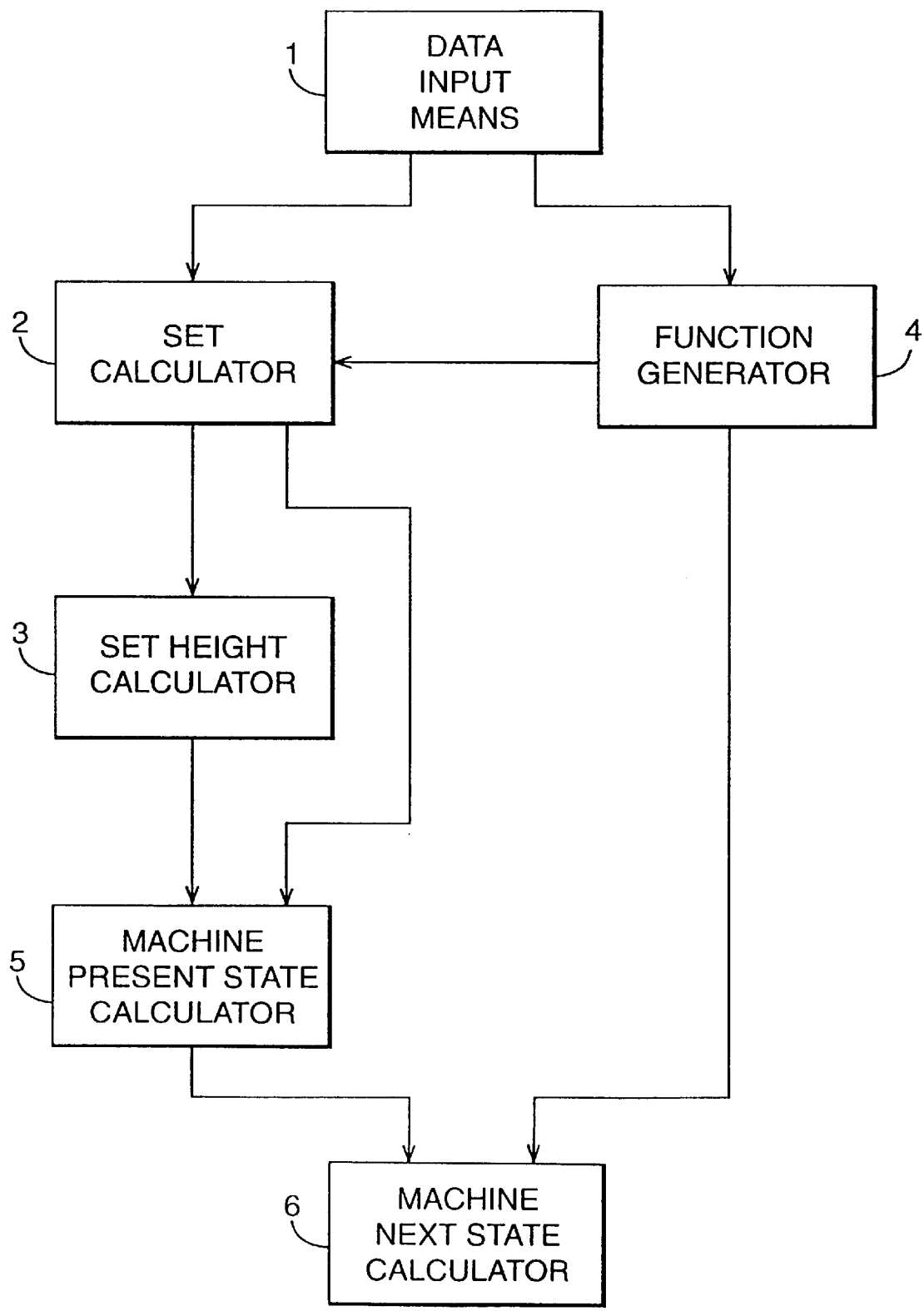
Figure 4:
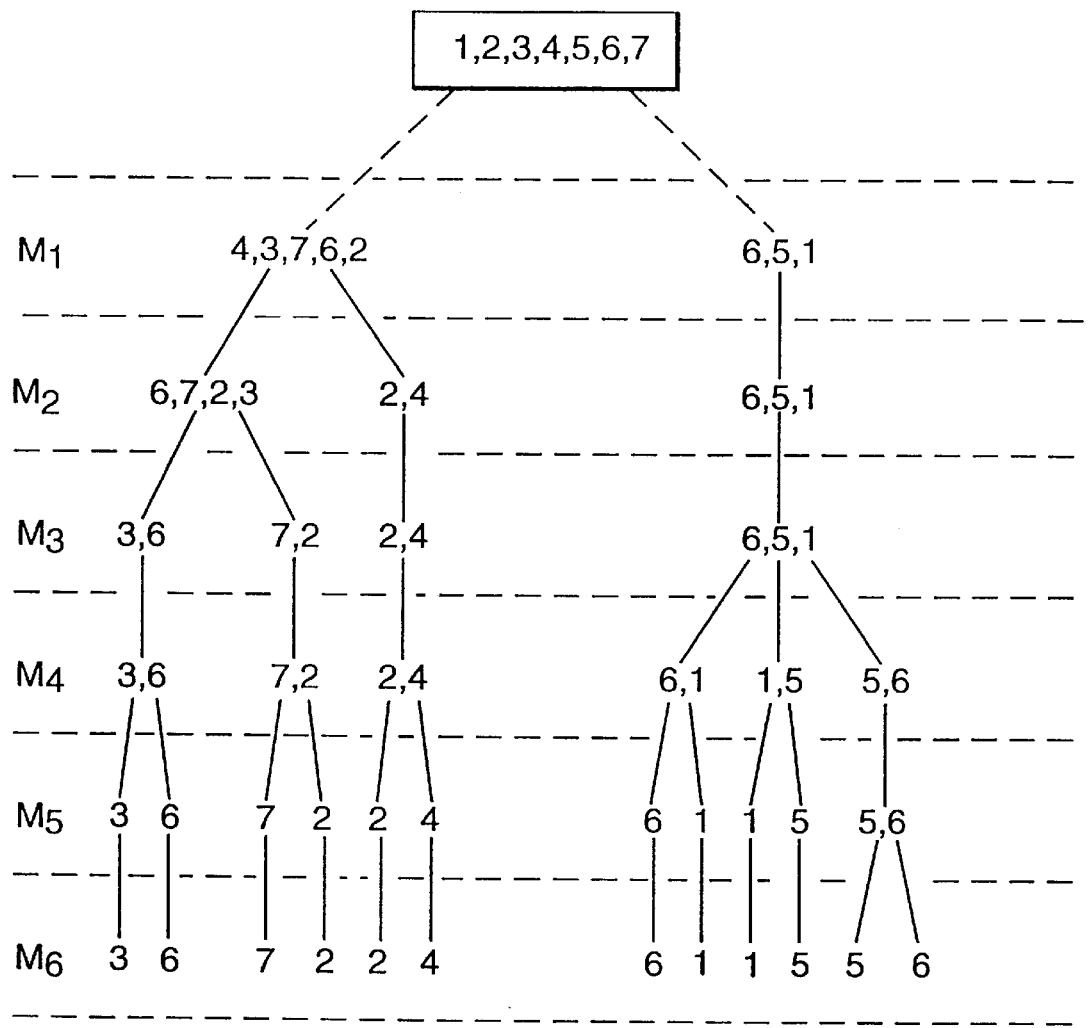
Figure 5:
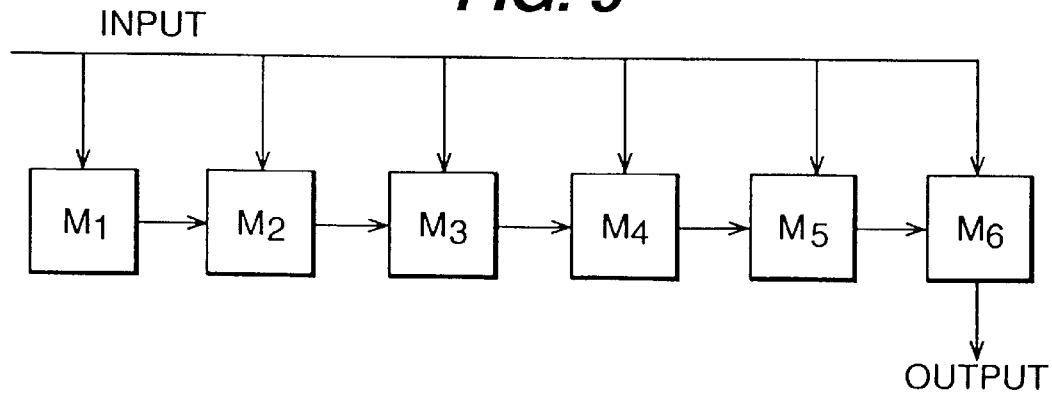
Figure 6:
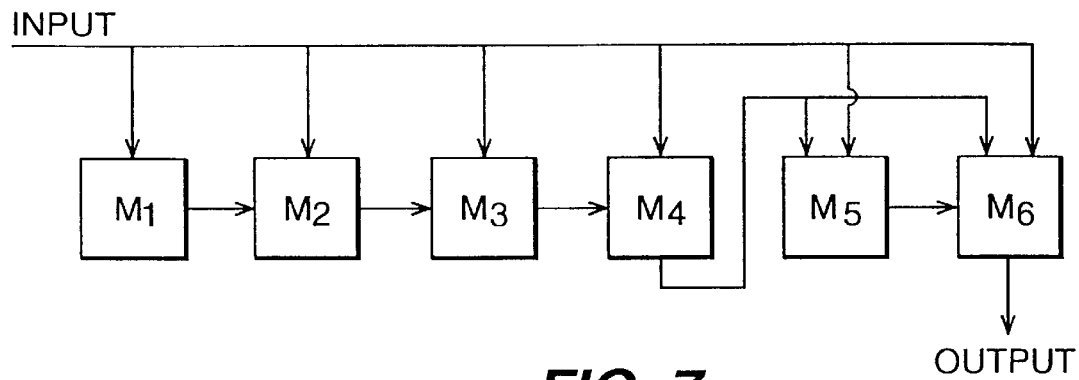
Figure 7:
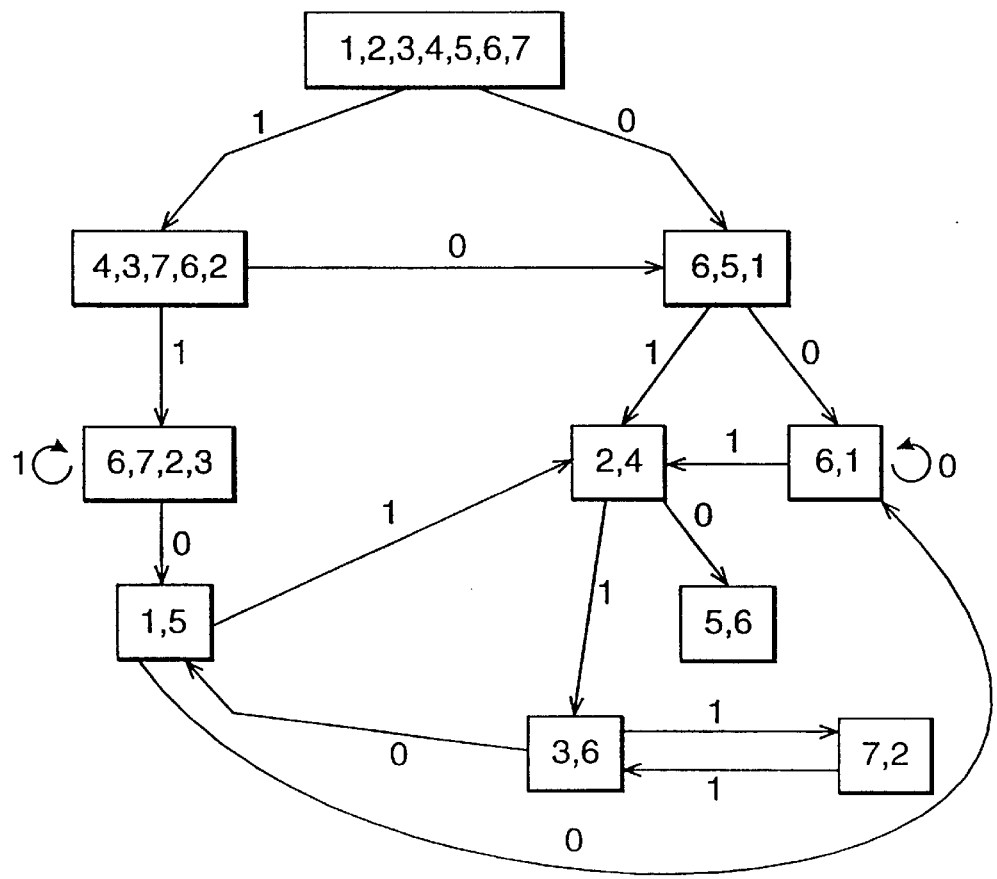
Figure 8:
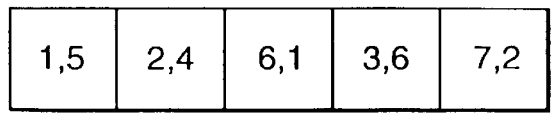
Figure 9:
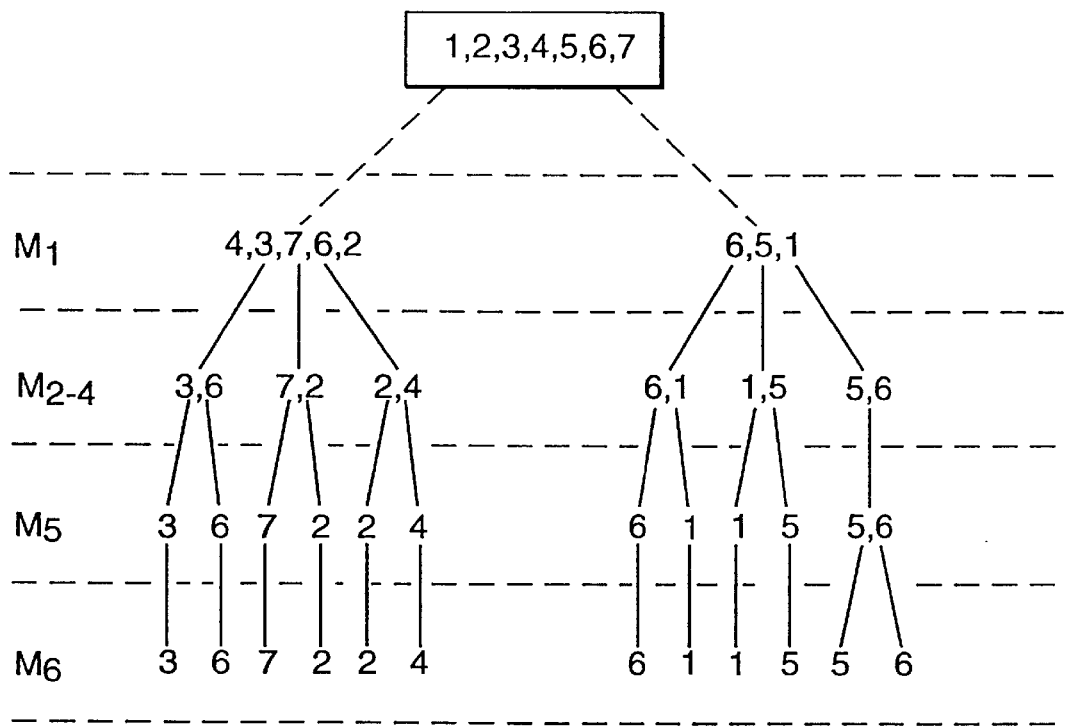
Figure 10:
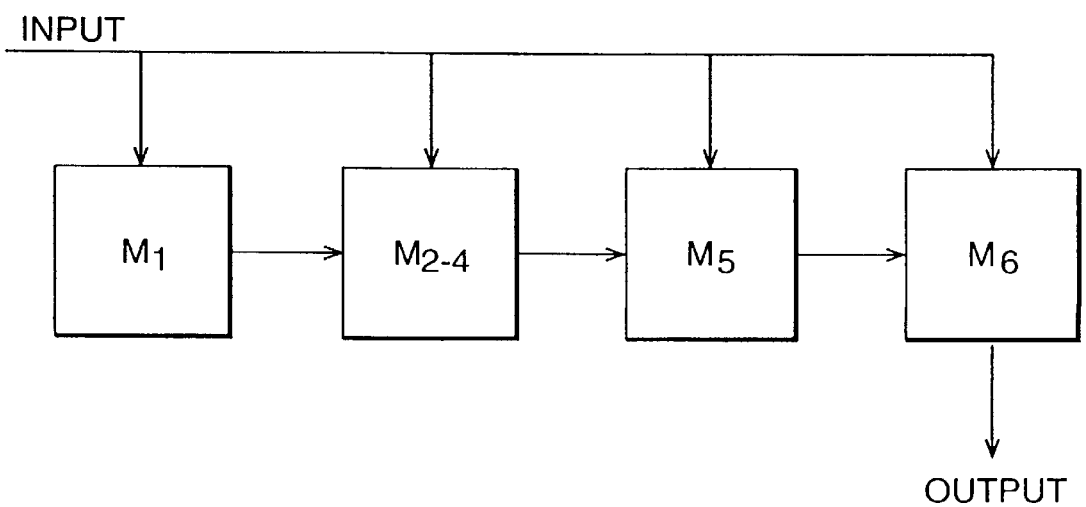
Figure 10A:
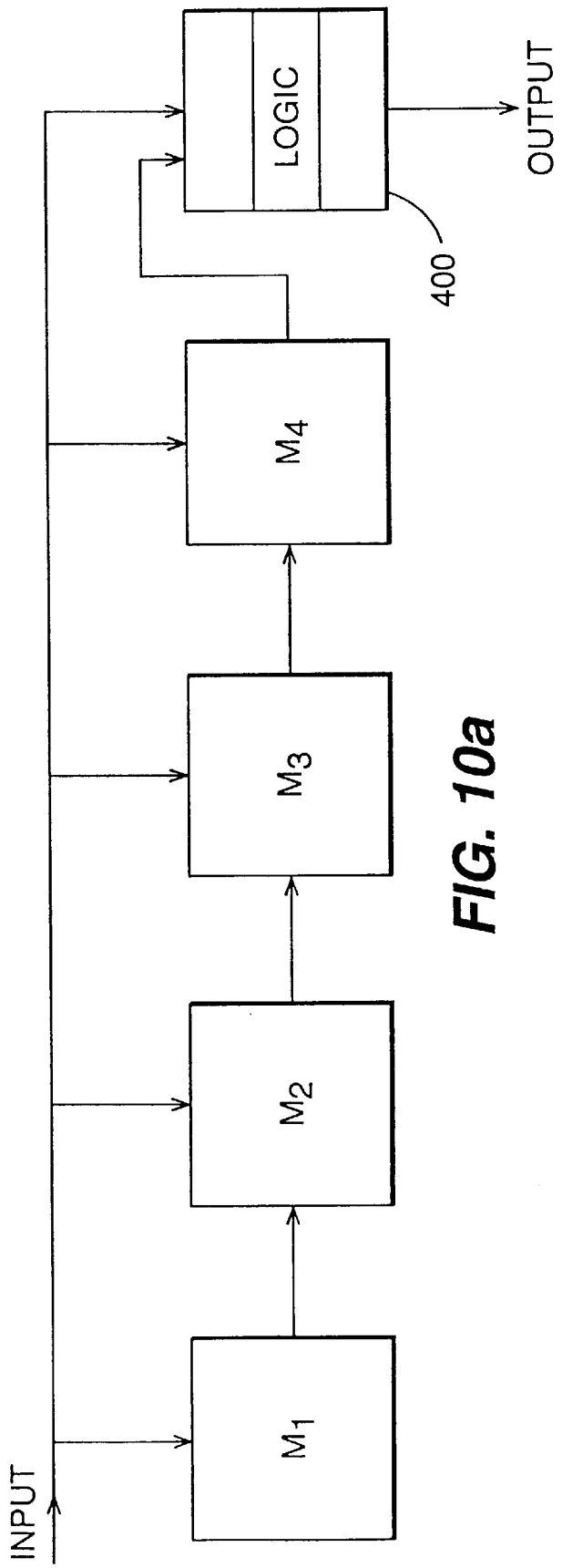
Figure 11:
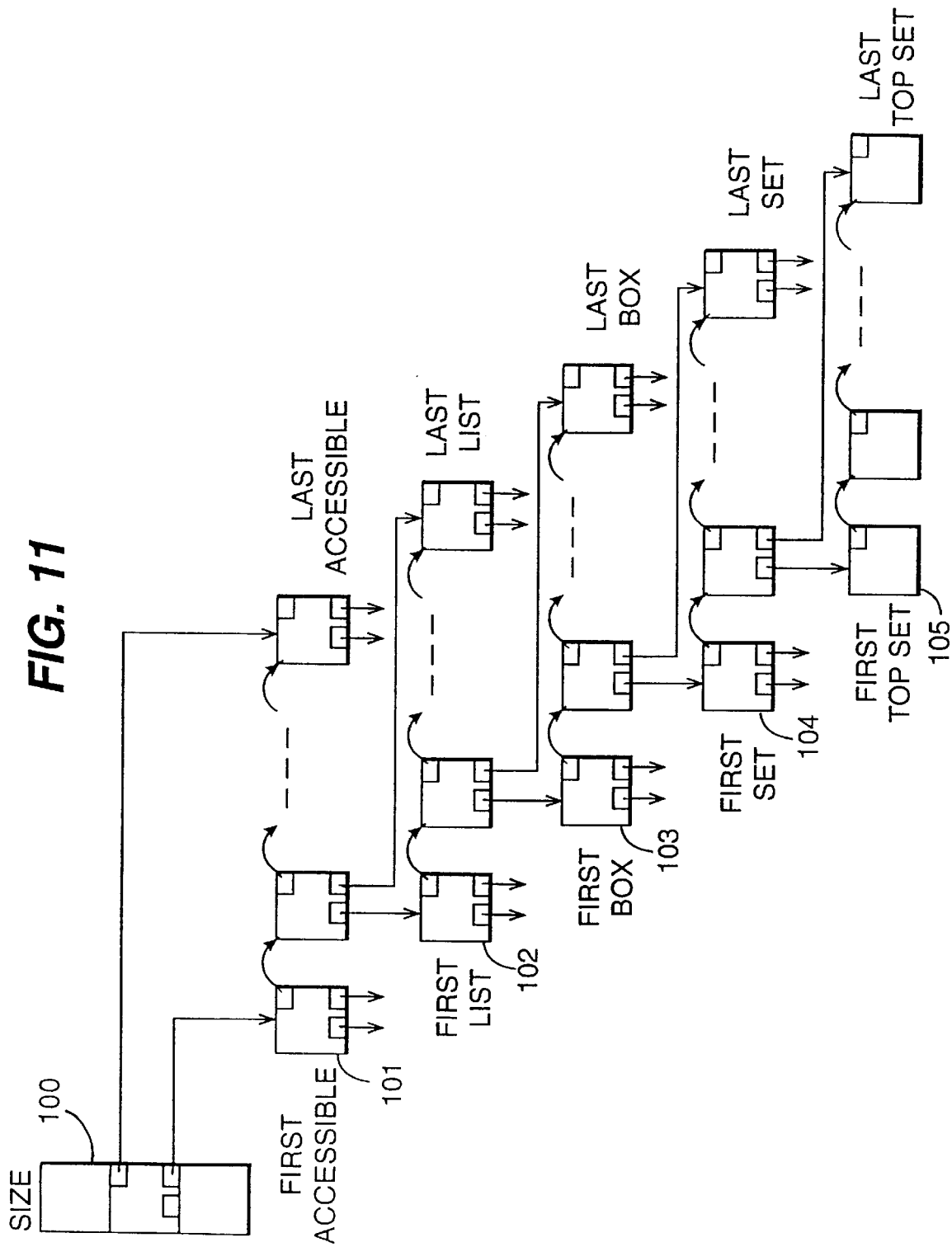
Figure 12:
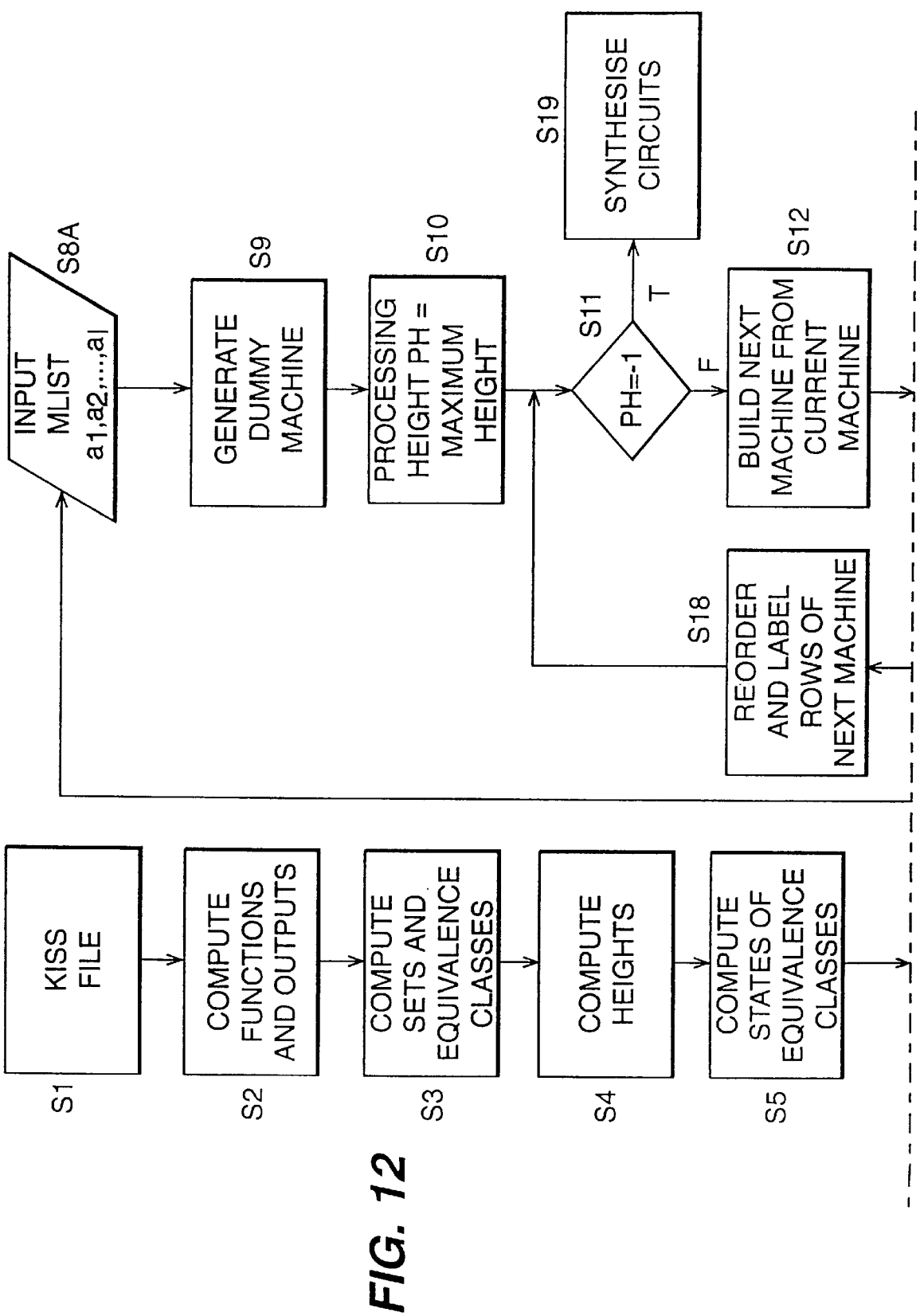
Figure 15:
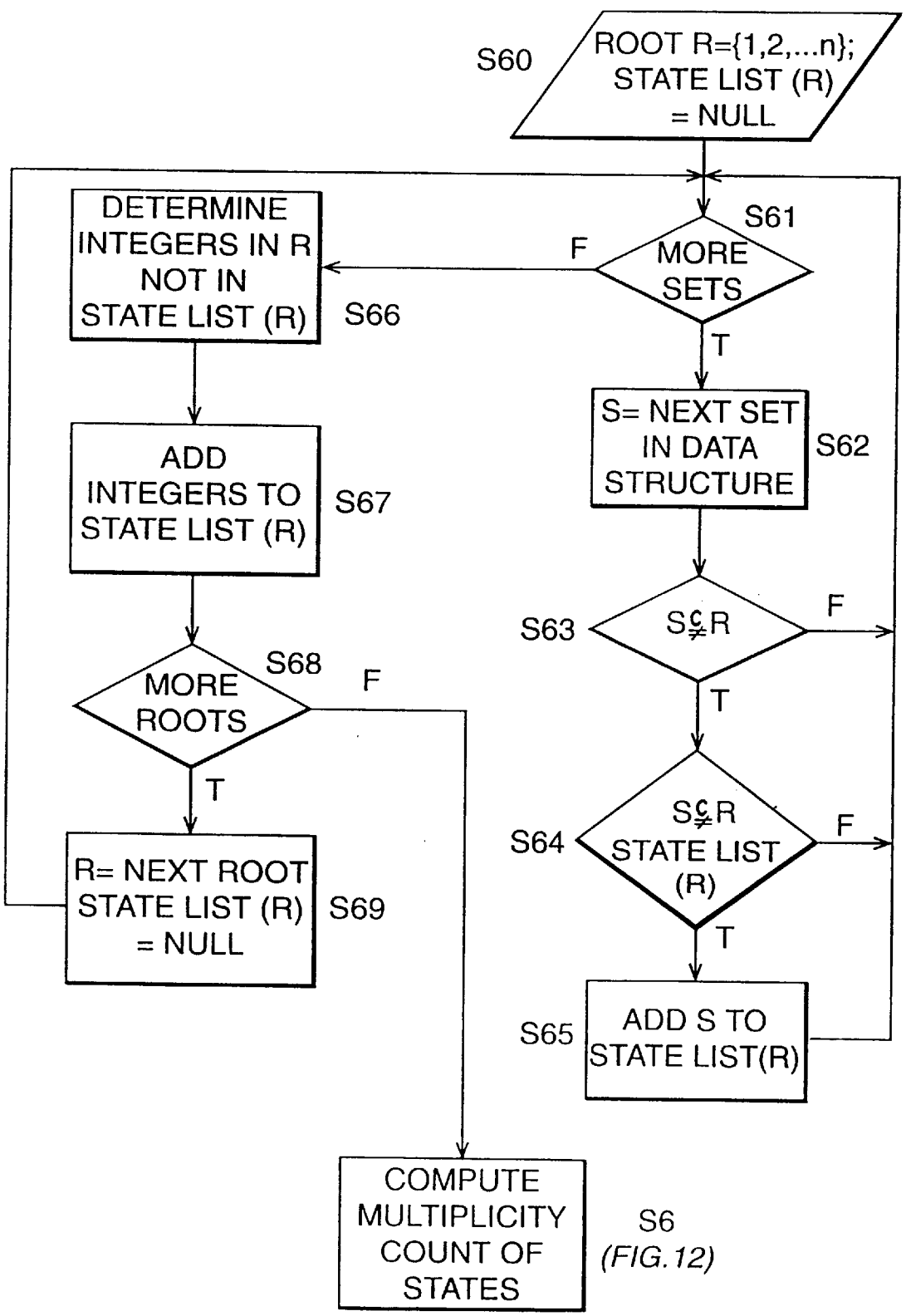

The step of computing the states of each equivalence class (step S5) of FIG. 12 will now be described with reference to FIG. 15.

A list of sets obtained from the data structure is associated with each root. This list of sets is said to be the state list associated with the Equivalence Class in which the root is found.

The routine is entered with the root set consisting of the integers comprising the states of the sequential circuit. Also the State List is assigned a null value. In step S61 it is then determined if there are any more sets in the data structure of a size less than the size of the root. If so, in step S52 the next set S is extracted from the data structure and the process proceeds to step S63 in which it is determined if S is a subset of R. If not the process returns to step S61 and if so the process proceeds to step S64 where it is determined if S is a subset of any set in the State List associated to R. If true the process returns to step S61 and if false the process proceeds to step S65 where S is added to the State List associated to R and the process returns to step S61. If in step S61 it is determined that there are no more sets, in step S66 the integers of R which are not in any set in the State List associated to R are determined and the process proceeds to Step S67 in which each of the integers determined in step S66 are added as a separate state to the State List associated to R. The process then proceeds to step S68 where it is determined if there are any more roots not yet processed. If so, R is assigned the next root and the State List associated to R is assigned a null value and the process returns to step S61. If not the process proceeds to step S6 of FIG. 12.

In the specific embodiment where the state set is {1,2,3, 4,5,6,7}, the roots and their associated states and multiplicity counts are given in Table 16 below.

TABLE 16

| Root | States |
|---|---|
| {1,2,3,4,5,6,7} | {4,3,7,6,2}[0], {6,5,1}[0] |
| {4,3,7,6,2} | {6,7,2,3,}[0], {2,4}[0] |
| {6,7,2,3} | {3,6}[0], {7,2}[0] |
| {6,5,1} | {1,5}[0], {6,1}[0], {5,6}[0] |
| {1,5} | {1}[0], {5}[1] |
| {5,6} | {5}[1], {6}[0] |

Further each state has the following information associated with it.

1. The root of which it is a state.
2. Mask of the state. Given a state and the root for which it is a state, a mask is constructed as follows, the mask of the state is the size of the root for which it is a state. For each integer in the state a 1 is placed in the corresponding position in the mask and other entries are 0. For example, {3,6} and {7,2} are states of the root {6,7,2,3} and their masks are 1001 and 0110 respectively.
3. The root of the box in which the state was found, denoted RWF. For example, RWF for {3,6} is {1,5}.
4. The height of the state is the height of the box in which the state is found. Thus {3,6} has height 1.

Details of the method by which the machines are assigned symbolic states will now be described.

A symbolic machine will have columns as follows:

| Input List (IL) | Input (I) | Working Set (WS) | Present State (PS) | Present State Branch (PSB) | Next State (NS) | Next State Branch (NSB) | Entry Set (ES) |
|---|---|---|---|---|---|---|---|

First a Dummy machine is generated (step S9 of FIG. 12), there is a row for each input, and all the columns for a row are simply the set consisting of the states of the original machine.

For the example we have:

| IL | I | WS | PS | PSB | NS | NSB | ES |
|---|---|---|---|---|---|---|---|
| NULL | 0 | {1, 2, 3, 4, 5, 6, 7} | {1, 2, 3, 4, 5, 6, 7} | [0] | {1, 2, 3, 4, 5, 6, 7} | [0] | {1, 2, 3, 4, 5, 6, 7} |
| NULL | 1 | {1, 2, 3, 4, 5, 6, 7} | {1, 2, 3, 4, 5, 6, 7} | [0] | {1, 2, 3, 4, 5, 6, 7} | [0] | {1, 2, 3, 4, 5, 6, 7} |

Figure 16:
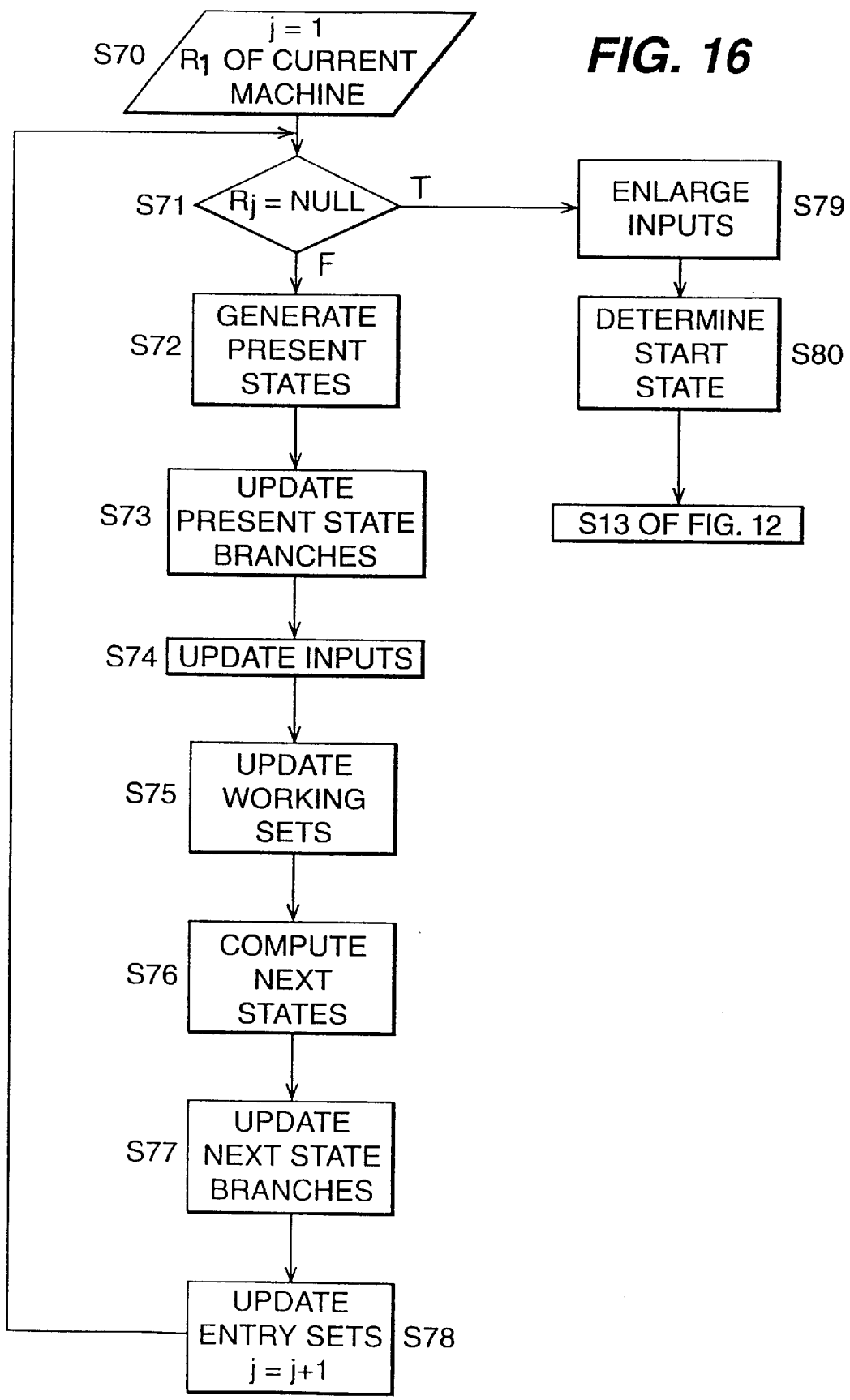

FIG. 16 is a high level flow diagram showing the routines required to generate the next machine from the current machine.

In step S70 of FIG. 16 the first row of the current machine is input and the row index j is set equal to 1. In step S71 it is determined whether the $j^{th}$ row of the current machine is null and if not, in step S72 the routine to generate the Present States is implemented. In step S73 the routine Update the Present State Branches is implemented and in step S74 the routine to update the Input is implemented. In step S75 the routine to Update the Working Sets is implemented and in step S76 the routine to Compute the Next States is implemented. In step S77 the routine to Update the Next State Branches is then implemented and in step S78 the routine to Update the Entry Sets is implemented and the row index j is incremented. The process then returns to step S71.

If in step S71 it is determined that all the rows have been processed, the process proceeds to step S79 wherein the procedure to Enlarge the Inputs is implemented and then the start states for the machine are determined (step S80). The process then proceeds to step S13 of FIG. 12.

The details of each of the steps of FIG. 16 will now be described in more detail.

Figure 17:
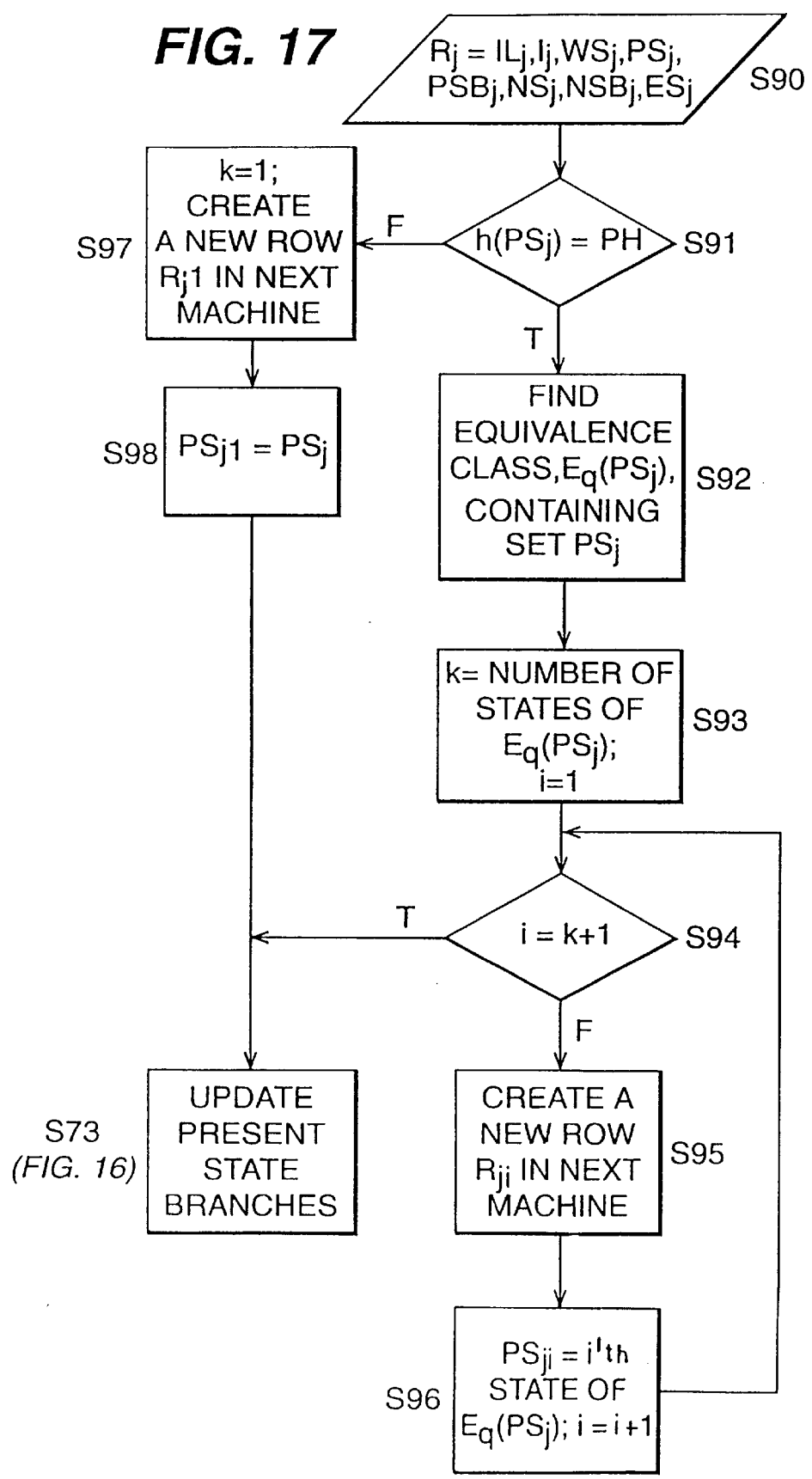

FIG. 17 illustrates the steps for generating Present States (step S72 of FIG. 16).

In step S90 of FIG. 17 the 0th row of the current machine is input. For convenience the entries in the $j^{th}$ row are indexed by j. Thus $IL_j$, $I_j$, $WS_j$, $PS_j$, $PSB_j$, $NS_j$, $NSB_j$, $ES_j$ are respectively the Input List, the Input, the Working Set, the Present State, the Present State Branch, Next State, Next State Branch and the Entry Set of the $j^{th}$ row in the current machine.

If in step S91 the height of the Present State of the $j^{th}$ row, denoted $h(PS_j)$ is equal to the Processing Height (PH), then the Equivalence Class (Box) containing the set $PS_j$ is determined and is denoted Eq $(PS_j)$ Then in step S93 a count k is set to be equal to the number of states in the State List for Eq $(PS_j)$.

In step S94 it is determined if k rows have been generated in the next machine. If this is the case then the routine Update Present State Branches is invoked (step S73 of FIG. 16). Otherwise a new row is generated in the next machine in S95 and this row is denoted by $R_{ji}$. In step S96 the Present State entry of row $R_{ji}$ is denoted $PS_{ji}$ and is set to the $i^{th}$ state of the Equivalence Class containing the set $PS_j$ (which was determined in step S92). The i count is incremented by 1 and the process then returns to step S94.

If step S91 the height of the Present State of the $j^{th}$ row in the current machine is not equal to the Processing Height (PH), in step S97 just one row is created in the next machine and in step S93 the Present State entry for this created row is set to the Present State entry of the $j^{th}$ row in the current machine. The process then implements the routine to Update Present State Branches (step S93 of FIG. 16).

The process of updating the present state list (step me S73 of FIG. 16) will now be described with reference to FIG. 18.

Figure 18:
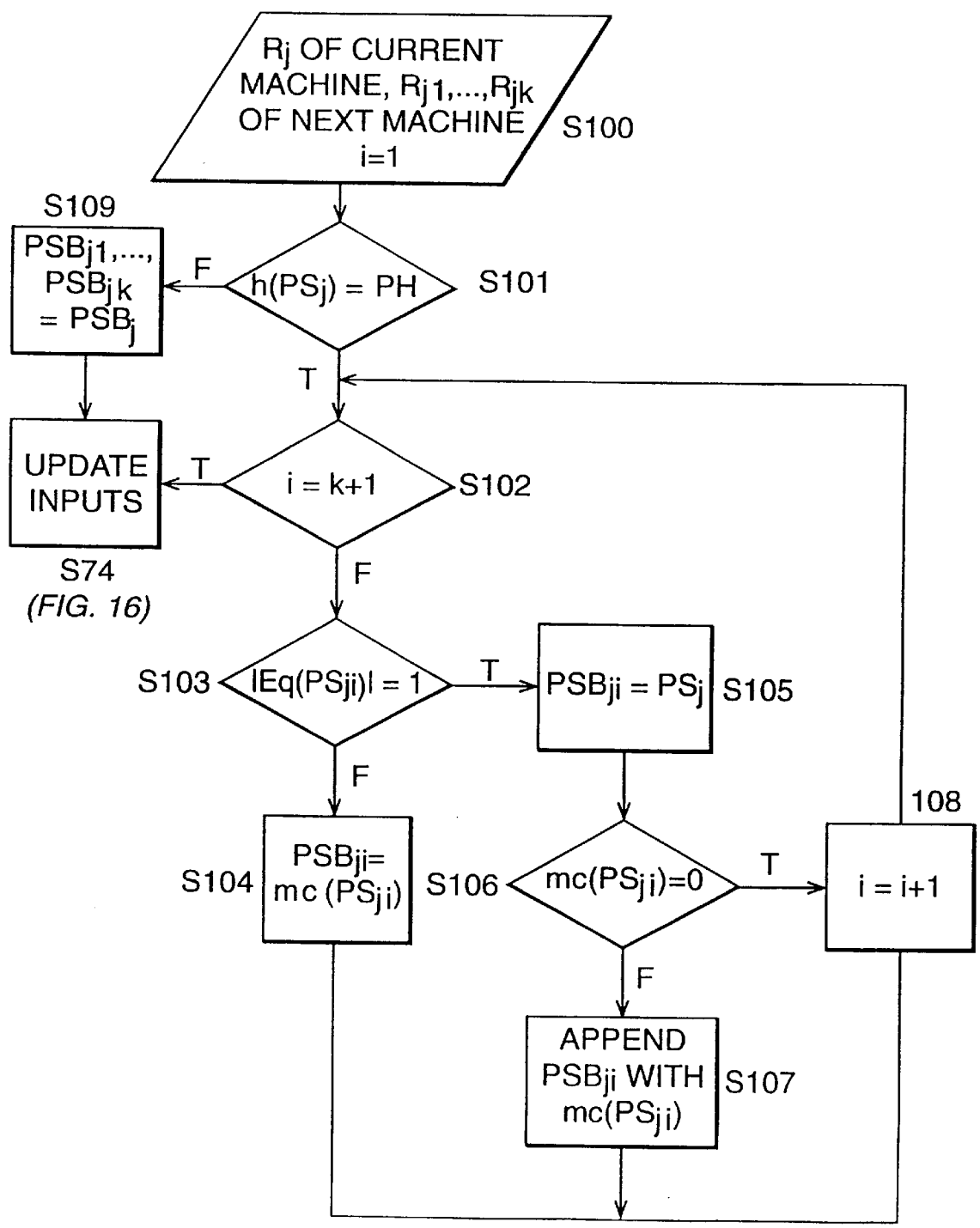

In step S100 of FIG. 18 the $j^{th}$ row of the current machine is input together with the row $R_{j1}, R_{j2} \ldots R_{jk}$ of the next machine which were generated in the routine Generate Present States. Also a count i is set to 1.

In step S101 it is determined if the height of the Present State, $h(PS_j)$, of the $j^{th}$ row in the current machine is equal to the Processing Height. If this is not the case then in step S109 the Present State Branch, $PSB_{ji}$ of the single row $R_{ji}$ which was generated in the next machine in the Generate Present States routine is simply set to the entry in the Present State Branch, $PSB_j$, of the $j^{th}$ row $R_j$ in the current machine and the process proceeds to the Update Input routine (step S74 of FIG. 16).

If in step S101 the height of the Present State of the $j^{th}$ row in the current machine is equal to the Processing Height then in step S102 it is determined if all the row $R_{j1}, R_{j2} \ldots R_{jk}$ have been processed. If this is the case, then the process implements the Update Inputs routine (step S74 of FIG. 16). Otherwise in step S103 it is determined if the Equivalence Class (Box) $Eq(PS_{ji})$ containing the set $PS_{ji}$ which is the Present State of the row $R_{ji}$ in the next machine containing only one set. The notation $|Eq(PS_{ji})|$ denotes the number of sets in the Equivalence Class (Box) containing the set $PS_{ji}$. If this is not the case then in step S104 the Present State Branch of row $R_{ji}$ in the next machine is set to be the multiplicity count of the Present State of row $R_{ji}$ and the process proceeds to step S108 where the i count is incremented by 1. The process then returns to step S102 to check if all the rows $R_{j1} \ldots R_{jk}$ in the next machine have been processed.

If in step S103 it is found that the Equivalence Class (Box) containing the Present State of the row $R_{ji}$ only contains one set then the process proceeds to step S105. In step S105 the Present State Branch, $PSB_{ji}$, for the row $R_{ji}$ of the next machine is set to the Present State Branch, $PSB_j$, of the $j^{th}$ row in the current machine. Then in step S106 it is determined if the multiplicity count of the Present State, $PS_{ji}$ of row $R_{ji}$ in the next machine is 0. If this is the case then the process proceeds to step S108 where the i count is incremented by 1 and the process then returns to stop S102 to determined if all the rows $R_{j1} \ldots R_{jk}$ have been processed. Otherwise, the process proceeds to step S107 where the Present State Branch of the row $R_{ji}$ has an extra entry added in a new last position, the entry being the multiplicity count of the Present State of row $R_{ji}$. The process then proceeds to step S108 where the i count is incremented by 1 and then the process proceeds to step S102 to determine if all the rows $R_{j1} \ldots R_{jk}$ generated in the next machine have been processed.

The routines generate Present States and Update Present State Branches will now be described with reference to the specific example, where the current machine is a dummy machine and its first row is being considered.

| IL | I | WS | PS | PSB | NS | NSB | ES |
|---|---|---|---|---|---|---|---|
| Null | 0 | {1, 2, 3, 4, 5, 6, 7} | {1, 2, 3, 4, 5, 6, 7} | [0] | {1, 2, 3, 4, 5, 6, 7} | [0] | {1, 2, 3, 4, 5, 6, 7} |

Since the height of The Present State in row 1 of the dummy machine is 5 and the Processing Height is 5, the Equivalence Class (Box) containing the set {1,2,3,4,6,7} is determined in step S92 The State List associated with this Equivalence Class contains {4,3,7,6,2} and {6,5,1}. In step S93 k is then set to 2. Thus the step S93, S94 and S96 generates two new rows $R_{11}$ and $R_{12}$ in the next machine with respective,Present States {4,3,7,6,2} and {6,5,1}. Then in the Update Present State Branches routine it is found in step S103 that the Equivalence Class (Box) containing the set {4,3,7,6,2} contains only this set i.e. $|Eq(\{4,3,7,6,2\})|=1$. Thus $PSB_{11}=PSB_1=[0]$. Also in step S106 the multiplicity count of {4,3,7,6,2} is [0] and hence the second row $R_{j2}$ of the next machine is processed. Since $PS_{12}$ has height 2 and PH is currently 5, $PSB_1=[O]$ is assigned to $PSB_{12}$.

Two new rows are thus created as illustrated below:

| IL | I | WS | PS | PSB | NS | NSB | ES |
|---|---|---|---|---|---|---|---|
| Null | | | {4, 3, 7, 6, 2} | [0] | | | |
| Null | | | {6, 5, 1} | [0] | | | |

Figure 19:
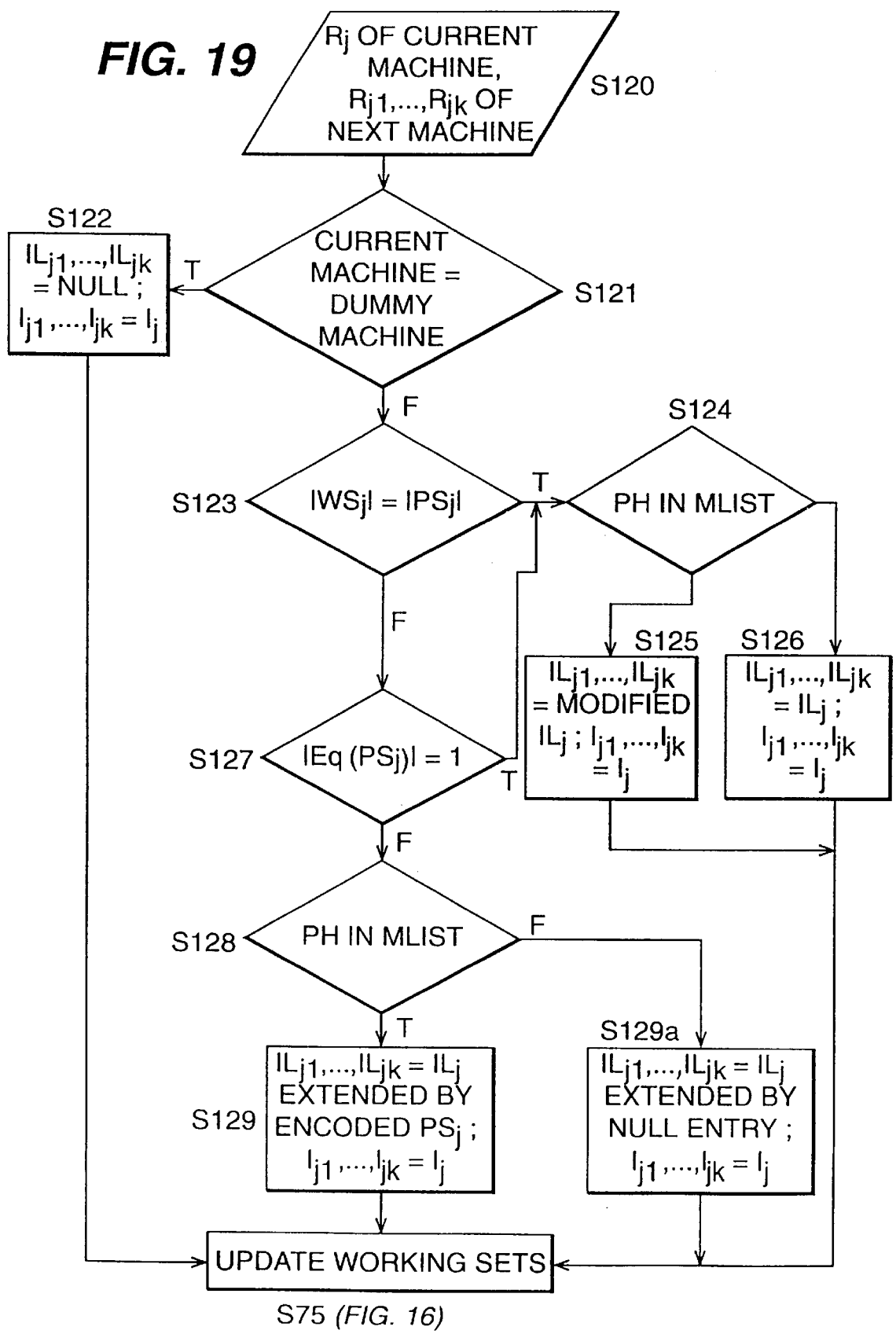

The steps of Updating the Inputs (step S74 of FIG. 16) will now be described in detail with reference to FIG. 19.

The routine Update Inputs is entered in step S120 with the $j^{th}$ row $R_j$ of the current machine and the rows $R_{ji} \ldots R_{jk}$ of the next machine which were generated in the Generate Present States routine and have their Present State Branches updated in the Update Present State Branches routine.

In step S121 it is determined if the current machine is the dummy machine. If this is case then in Step 122 the Inputs $I_{j1} \ldots I_{jk}$ for each of the rows $R_{j1} \ldots R_{jk}$ of the next machine are simply set to be equal to the Input, $I_j$ of the $j^{th}$ row of the current (dummy) machine and the Input Lists $IL_{j1} \ldots IL_{jk}$ are set to be null. The process then proceeds to step S75 to the Update Working Set routine (to be described later).

If in step S121 it is determined that the current machine is not the dummy machine then the process proceeds to the step S123. In this step it is determined that the size of the Working Set of the $j^{th}$ row of the current machine, denoted $|WS_j|$ is the same as the size of the Present State of the $j^{th}$ row in the current machine denoted $|PS_j|$.

If this is the case, in step S124 a test is made to determine if PH is in the MList and if so then in step S125 the Input Lists, $IL_{ji} \ldots IL_{jk}$ have their last entry replaced by the binary encoding of the Present States $PS_j$ of row j in the current machine. Also the Inputs $I_{j1} \ldots I_{jk}$ are simply set to be equal to the Input Ij of the $j^{th}$ row in the current machine and then the process proceeds to step S75 of FIG. 16.

If in step S123 the test is false then step S127 it is determined if the Equivalence Class (Box), $Eq(PS_j)$, containing the set $PS_j$ contains only one set. If this is the case then the process proceeds to step S124. If it is not the case, then the process proceeds to S128 where the same test as in steps S124 is carried out. If this is true then in step S129 the Input Lists, $IL_{j1} \ldots IL_{jk}$ of the rows $R_{j1} \ldots R_{jk}$ in the next machine are set equal to the Input Lists, $IL_j$ of the $j^{th}$ row in the current machine and a new last entry added to each of the Lists $L_{j1} \ldots IL_{jk}$ which contains the binary coded value of the Present State, $PS_j$ of the $j^{th}$ row in the current machine. Also the Inputs, $I_{j1} \ldots I_{jk}$ are simply assigned the value of $I_j$. The process then proceeds to the Update Working Sets procedure (step S75 of FIG. 16) which will be described later.

If in step S124 the test is false, in step S126 the Input List, $IL_{j1} \ldots IL_{jk}$ are simply assigned the value of $IL_j$ of the $j^{th}$ row in the current machine. Also the Input $I_{j1} \ldots I_{jk}$ are assigned to the value $I_j$ which is the input of the $j^{th}$ row in the current machine. The process then proceeds to step S75.

If in step S128 the test is false, in step S129A the Input List, $IL_{j1} \ldots IL_{jk}$ in the next machine are set equal to the Input List, $IL_j$ and the new Last Entry is added to each of the Lists $IL_{j1}$ . . . $IL_{jk}$ which contains a null entry. Also the Inputs, $I_{j1}$ . . . $I_{jk}$ are simply set equal to the Input $I_j$ of the $j^{th}$ row of the current machine. The process then proceeds to step S75.

The routine Update Inputs will now be illustrated by the specific example and the table below shows the previous table with the Inputs updated.

| IL | I | WS | PS | PSB | NS | NSB | ES |
|---|---|---|---|---|---|---|---|
| Null | 0 | | {4, 3, 7, 6, 2} | [0] | | | |
| Null | 0 | | {6, 5, 1} | [0] | | | |

Figure 20:
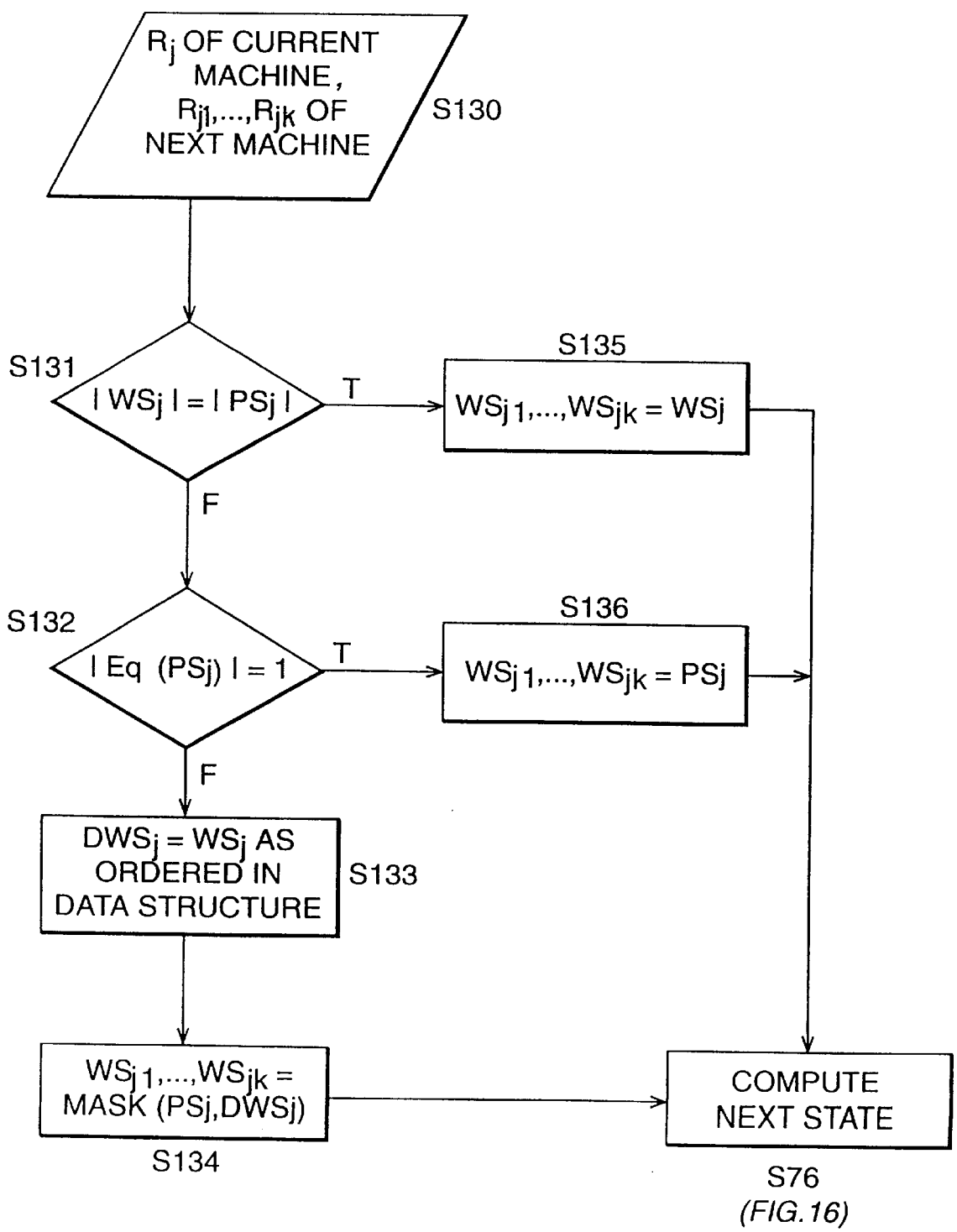

The process of updated the Working Sets (step S75 of FIG. 16) will now be described in detail with reference to the flow diagram of FIG. 20.

The process of updating the Working Sets is initiated with the jth row of the current machine and the rows $R_{j1}$, $R_{j2}$ . . . $R_{jk}$ of the next machine.

In step S131 it is determined if the size of the Working Set, $|WS_j|$ of the $j^{th}$ row in the current machine is equal to the size of the Present State, $|PS_j|$ in the $j_{th}$ row in the current machine. If this is the case, then the working Set, $WS_{j1}$ . . . $WS_{jk}$ of the rows $R_{j1}$ . . . $R_{jk}$ in the next machine are simply set Lo be the Working Set of the $j^{th}$ row in the current machine (step S135) and the process proceeds to step S76 to the Compute Next States routine.

If the test in S131 is false then in step S132 it is determined if the Equivalence Class (Box) containing the Present State of the $j^{th}$ row in the current machine only contains one set. If this is true then the Working Sets, $WS_{j1}$ . . . $WS_{jk}$ of the rows $R_{j1}$ . . . $R_{jk}$ in the next machine are simply set to be equal to the Present State of the $j^{th}$ row in the current machine and the process proceeds to step S76 to the Compute Next States routine. If the test in step S132 is false then the process proceeds to step S133. In this step the data structure is searched until a match is found for the set $WS_j$ which is the Working Set in the $j^{th}$ row of the current machine. The variable $DWS_j$ is assigned the set $WS_j$ as found in the Data Structure. Then in step S134 the last of the Present State in the jrh row of the current machine is applied to the set $DWS_j$ to obtain the set mask ($PS_j$, $DWS_j$) e.g. if the mask of $PS_j$ is 01111 and $DWS_j$={4,3,7,6,2} then the set mask ($PS_j$, $DWS_j$)={3,7,6,2}.

The Working Sets, $WS_{j1}$ . . . $WS_{jk}$ in the rows $R_{j1}$ . . . $R_{jk}$ in the next machine are assigned the set mask ($PS_j$, $DWS_j$). The process then proceeds to step S76 to the Compute Next States routine.

Figure 21:
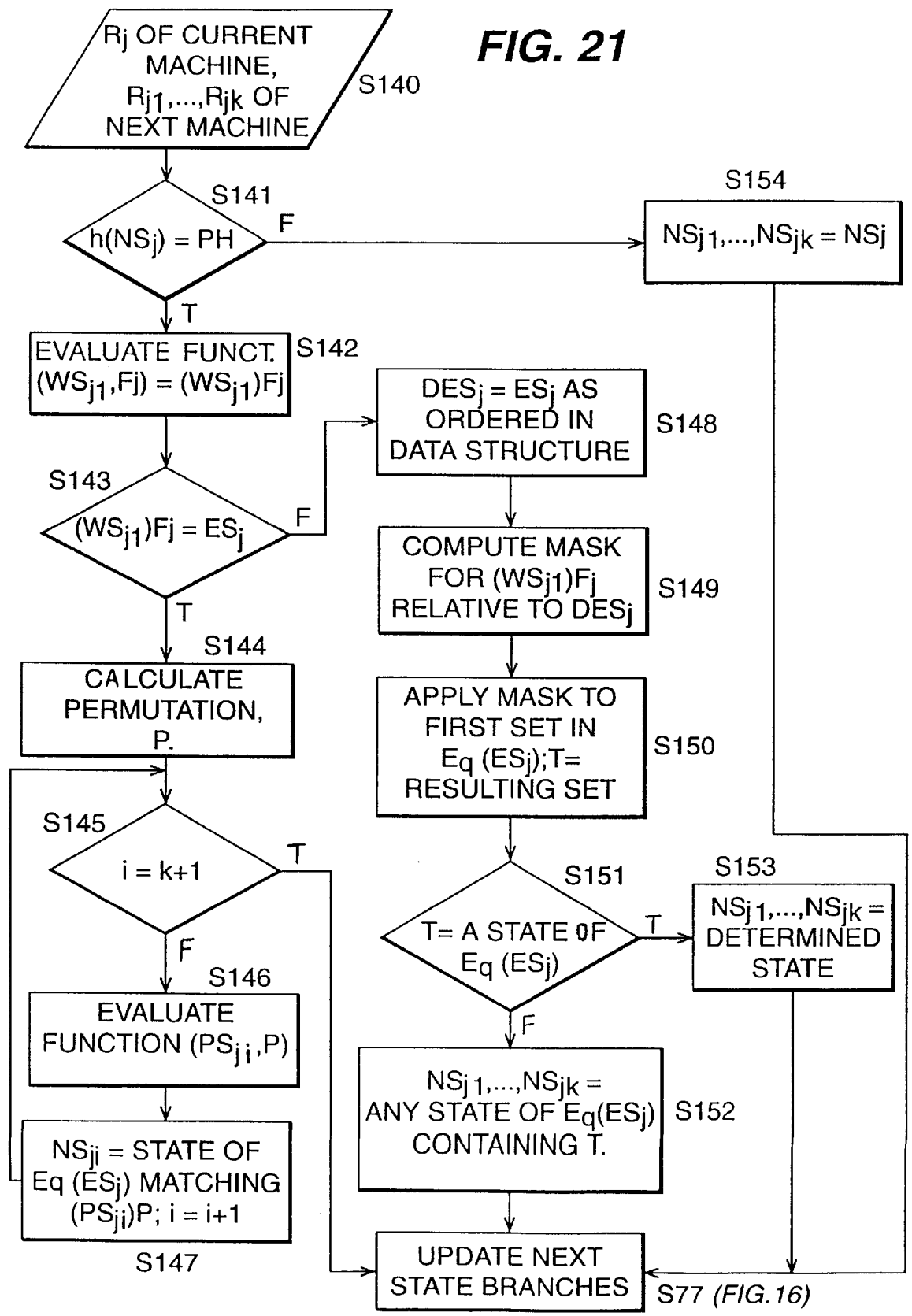

The process of computing the Next States (step S76) will now be described in detail with reference to FIG. 21).

The process of computing the Next States is initiated in step S140 with the $j^{th}$ row of the current machine and the rows $R_{j1}$, $R_{j2}$ . . . $R_{jk}$ of the next machine.

In step S141 it is determined if the height of the Next State, $h(NS_j)$ of the $j^{th}$ row in the current machine is equal to the Processing Height, PH. If this is not the case, then in step S154 the Next States, $NS_{j1}$ . . . $NS_{jk}$ of each of the rows $R_{j1}$ . . . $R_{jk}$ in the next machine are assigned the sets $NS_j$ which is the Next State in the $j^{th}$ row of the current machine and then the process then proceeds to the Update Next State Branches routine in step S77.

If in step S141 the test is truer the process proceeds to step S142. In this step the Evaluate Function routine is called with the Working Set, $WS_{j1}$ of row $R_{j1}$ in the next machine and the function $F_j$ associated to the Input in the $j^{th}$ row of the current machine. The Evaluate Function routine returns a set which is denoted $(WS_{j1})F_j$. Then in step S143 it is determined if the sets $(WSj,)F_1$ and the Entry Set of the jut row, $ES_j$ are equal. If the test is false, the data structure is searched until a match is found with the Entry Set $ES_j$. The variable $DES_j$ is assigned to the set $DES_j$ as found in the data structure. Then in step S149 a mask is calculated for the set $(WS_{j1})F_j$ relative to the set $DES_j$. (This process is exactly the same as calculating a mask for a state relative to the root as described earlier).

In step S150 the mask constructed in step S149 is to applied to the first set in the Equivalence Class (Box), $Eq(ES_j)$ contained with the set $ES_j$. The set thus obtained is denoted by T.

In step S151 the State List associated to the Equivalence Class (Box) containing the set $ES_j$ is searched to determine if T matches (denoted as=) a state in the State List. If the test is true the process proceeds to step S153 where each of the Next States, $NS_{j1}$ . . . $NS_{jk}$ of each of the rows $R_{j1}$ . . . $R_{jk}$ in the next machine are assigned to the state in the State List with which a match was found. The process then proceeds to step S77.

If in step S151 the test is false, the process proceeds to step S152. In this step the State List associated to the Equivalence Class (Box) containing the set $ES_j$ is searched to determine a state in the State List which contains T as a subset. In the particular embodiment, the first state in the State List which contains T as a subset is assigned to each of the Next States, $NS_{j1}$ . . . $NS_{jk}$ of each of the row $R_{j1}$ . . . $R_{jk}$ in the next machine. (If it is desired, the reduction in logic a different state in the State List containing the set T may be asigned as the Next States, $NS_{j1}$ . . . $NS_{jk}$ of each of the rows $R_{j1}$ . . . $R_{jk}$ in the next machine). The process then proceeds to the Update Next State Branches routine in step S77.

If in step S143 the test is true, a permutation is calculated by the following steps. (,The permnutation will be a function from the set of integers in the first set in the Box contain ing the set $ES_j$ into the same set of integers).

1. T he first set R in the Box containing the set $ES_j$ is noted, for example {1,5}.
2. The Box containing the set $ES_j$ is searched until a match is found for the set $WS_{j1}$. The variable $DWS_{j1}$ is assigned the set $WS_{j1}$ as found in the data structure.
3. The variable $DES_j$ is assigned thie set $ES_j$ as found in the data structure.
4. The function $F_j$ corresponding to the input in the $j^{th}$ row of the current machine is applied to the first elemtent of the set $DWS_{j1}$. This gives an integer in the set $DES_j$. The position of this integer is noted in the set $DES_j$. Then the integer in the determined position is noted in the set R. The function p maps the first element of the set R to the integer just determined in the seL R. This procedure is repeated for each of the integers in the set.

For example if:

R={1,5}

$DWS_{j1}$={7,2}

Applying $F_1$ to $DWS_{j1}$={6,31}

$ES_j$={3,6}

6 has the position 2 in $FS_j$ and 3 has the position 1 in $ES_j$
Thus the permutation p is:

| 1 | 5 |
|---|---|
| 5 | 1 |

The process then proceeds to step S145 where a determination is made to see if all the rows $R_{j1} \ldots R_{jk}$ in the next machine have been processed. If this is the case then the process proceeds to step S77. Otherwise the Evaluate Function routine is called with the Present State, $PS_{ji}$ of $R_{ji}$ in the next machine and the permutation. This returns a set $(PS_{ji})p$.

In step S147 the State List associated with the Equivalence Class (box) containing the set $ES_j$ is then searched for a match with $(PS_{ji})p$. The found matching state is assigned to $NS_{ji}$ which is the next state NS for the row $R_{ji}$ and the process returns to step S145.

The routine far updating the Next State Branches (step S77 of FIG. 16) is the same as the proce ss for updating the Present State Branches (step S73 of FIG. 16) and thus reference can be made to FIG. 18 for the understanding of the method.

Figure 22:
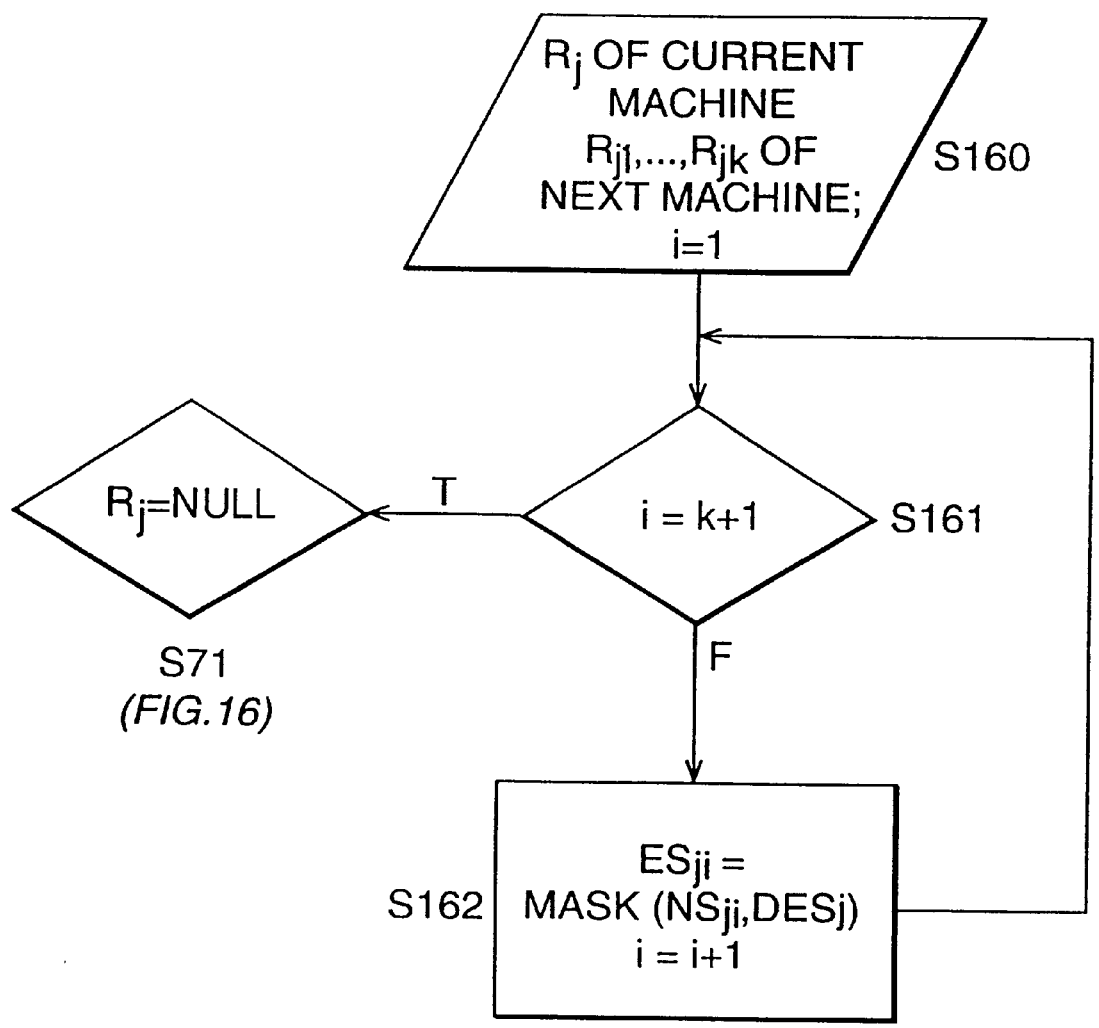

The process of updating the Entry Sets shown in FIG. 22 is initiated in step S160 with the $j^{th}$ row of the current manchine and the rows $R_{j1}, R_{j2} \ldots R_{jk}$ of the next machine. A count i is also set to 1.

In step S161 it is deterhmined if the all the rows $R_{j1} \ldots R_{jk}$ have bceen processed. If this is the case, then the process returns to step S71 if FIG. 16 to determine if all the rows of the current ma chine have been processed.

If the test in step 161 is false then in step S162 the data structure is searched until a match is found for the Entry Set, $ES_j$ of the $j^{th}$ row in the current msachine. The variable $DES_j$ is assigned to the set $ES_j$ as found in the data structure. Then the mask of the Next State, $NS_{ji}$ in row $R_{ji}$ is applied to $DES_j$ and a resulting set is assigned to tho Entry Set, $ES_{ji}$ of row $R_{ji}$ in the next machine. The i count is incremented by 1 and the process returns to step S61.

The mask is applied to the Next State in order to get a subset e.g. the mask 1000110 applied to the set $\{1,2,3,4,5,6,7\}$ returns the subset $\{6,5,1\}$.

The table below shows the previous table after Update Working Set, Compute Next States, Update Next State Branches and Update Entry Sets.

| IL | I | WS | PS | PSB | NS | NSB | ES |
|---|---|---|---|---|---|---|---|
| Null | 0 | {1, 2, 3, 4, 5, 6, 7} | {4, 3, 7, 6, 2} | [0] | {6, 5, 1} | [0] | {1, 5, 6} |
| Null | 0 | {1, 2, 3, 4, 5, 6, 7} | {6, 5, 1} | [0] | {6, 5, 1} | [0] | {1, 5, 6} |

The procedure for enlarging inputs (step S79 in FIG. 16) will now be explained in more detail.

In the present implemuentation because the optimisation technique using the wiring is used, a miachine may not require the input provided by the wiring and thus for that miachine the input can be defined as a "dont care" input.

The number of bits in the Input List of each row in the next machine is computed and the maximum value is noted. Then for each row containing bits less than the maximum value a new entry containing a number of "dont cares" i.e. - - - is inserted in the previous to last entry in the Input List. The number of "dont cares" to be inserted is determined to be the difference between the maximum length and the number of bits in the row being processed.

It should be noted that for each machine the last non null entry in the Input List is input to this machine from the previous machine and the non null entry previous to the last is the input to the machine from the previous to previous machine and so forth. This is how the connections between the machines are defined.

The routine for deleting redundant rows in the next machine (step S15 in FIG. 12) will now be described.

If the Present State of a row with a given Input is a subset or matches the Present State of a subsequent row with the same Input, the former row is then deleted. This process is repeated for each of the rows. Once this has been done it is determined if the Next State for each of the remaining rows is a subset of some present state in the remaining rows and if so the Next State of that row is replaced by the set of which it is a sub5et. Further, the multiplicity count of each Present State and Next State is set to 0.

The routine for making a file for the state assignment (step S16 of FIG. 12) will now be explained in more detail.

For each row in the machine except the last, each of the columns in the machine is transformed into a file for state assignment, consisting of three columns.

The Input is simply the concatenation of the symbols in the Input List. Followed by this is the Present State concatenated with Present State List and lastly the Next State concatenated with Next State Branch.

For the case of the last machine, an extra column is added which is the output. For each row in the last machine a routine Update Working Set is called which necessarily returns an integer which is a state of the sequential circuit. This integer must be the Present State of the sequential circuit and so the integer together with the function determined by the input on the row determines the output on that row.

Figure 23:
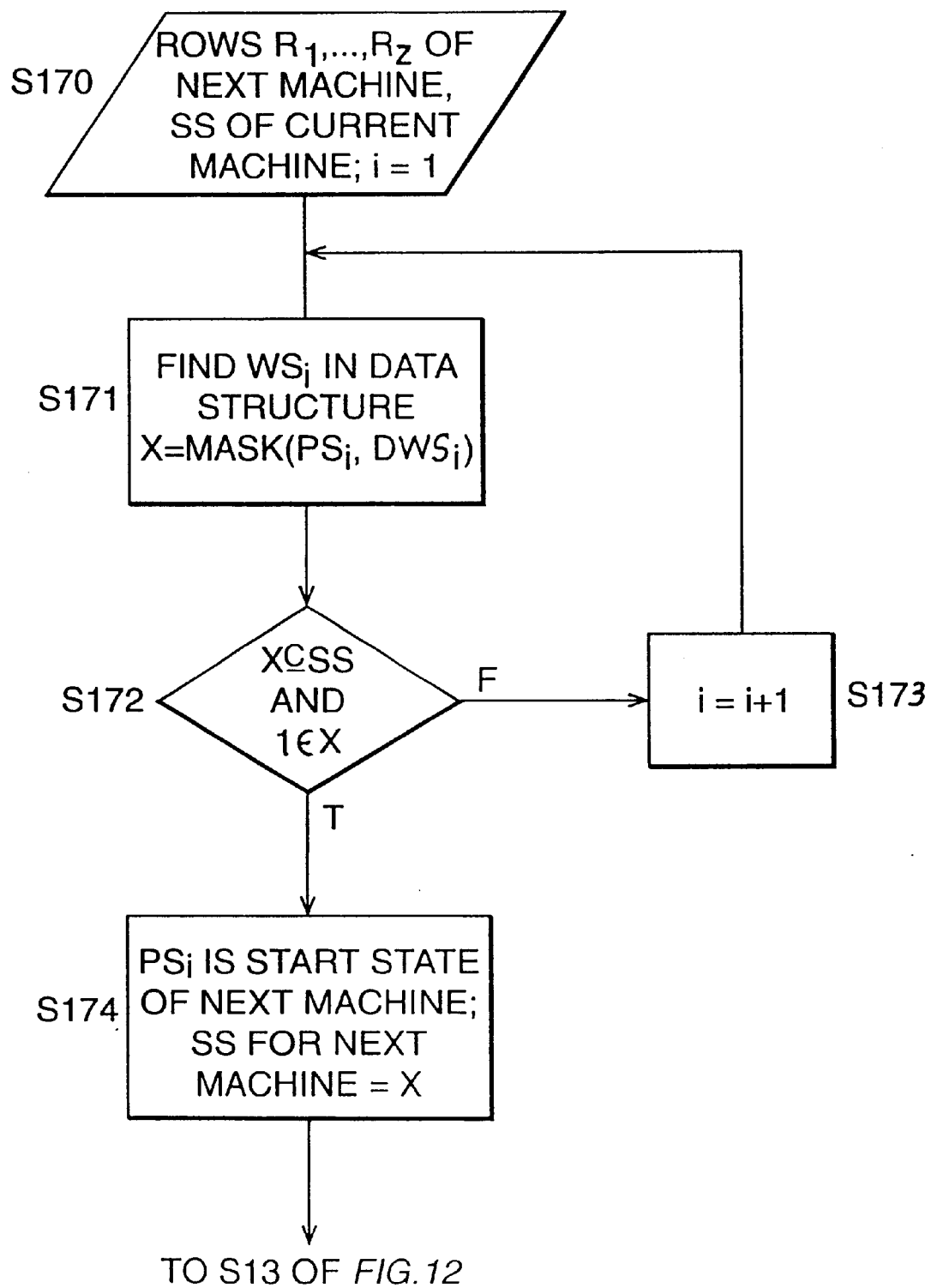

The procedure for determining the start states for the machine will now be described in detail with reference to FIG. 23.

Every machine has associated with it a set SS which is used to determine the Start State of the next machine. SS for the dummy machine is a set consisting of all state of the sequential circuit. FIG. 23 describes the computation of the Start State and the set SS for the next machine.

In step S170 the routine is entered with the rows of the next machine and the SS set of the current machine. A row count i is set to 1. The Working Set on the $i^{th}$ row of the next machine is located in the data structure and the variable $DWS_i$ is assigned to the located set in step S171. Further the mask of the Present State in the row i is applied to $DWS_i$ to obtain a set X. Then in step S172 it is determined if the set X is a subset or matches the set SS of the current machine and if the Start State of the sequential circuit (usually state 1 of the Kiss file) is a member of X. If not in step S173 the row count is incremented by 1 and the process returns to step S171 and if so, the process proceeds to S174 where the present state of the $i^{th}$ row of the next machine is the Start State for that machine and the SS set for the next machine is the set X.

It has thus been shown that the present invention provides a method of designing a cascade decomposed sequential circuit which has a much faster cycle time than sequential circuits designed in accordance with the prior art methods.

To illustrate the advantages of this particular embodiment of the present invention, a conventionally designed sequential circuit was constructed using the Kiss file of Table 1. This circuit had a processing time of 7.12. Using the method of the specific embodiment of the present invention described hereinabove, when the input machine List of 2,0 (i.e. the sequential circuit is to be decomposed into two circuits) is used the processing time for the two machines are respectively 2.6 and 2.91. This thus gives the circuit the overall processing time of 2.91 which is clearly a vast improvement over the conventional sequential circuit design.

Although the present invention has been described here above with reference.to the specific embodiments, the present invention is not limited to such specific embodiments and it will be apparent to a skilled person in the art that many modification can be made which fall within the spirit and scope of the present invention.

What is claimed is:

1. A computer implemented method of generating finite state data for designing a cascade decomposed logic circuit from finite state data defining current states, next states, input states and output states for a logic circuit, the method comprising:

determining functions defining all transitions from a current state to a next state of the logic circuit caused by an input to the logic circuit;

determining sets of circuit states which include the possible states of the logic circuit using said functions;

assigning levels to said sets of circuit states, each level corresponding to one of a cascaded plurality of circuit units;

defining each circuit unit to have a plurality of unit states, each unit state comprising a set of circuit states of the logic circuit;

assigning said sets of states to said plurality of cascaded circuit units as unit states for the circuit units on the basis of the assigned levels, wherein the circuit states of each of at least two unit states of a circuit unit are subsets of a set of circuit states of a unit state of an immediately preceding circuit unit in the cascade, said subsets are a cover of said set, and at least one circuit unit has a unit state which is a set of circuit states of an immediately preceding circuit unit in the cascade; and determining next sets of circuit states for the circuit units using said functions and the circuit states of at least one preceding circuit unit in the cascade.

2. A method as claimed in claim 1 including assigning binary states to each state of each circuit unit; and outputting finite state data defining current states, next states and input states for each circuit unit, output states for the last circuit unit in the cascade, and information defining connections between the circuit units for passing states of circuit units down the cascade.

3. A computer implemented method of designing a sequential logic circuit comprising the method of claim 2 and the steps of designing the logic circuit using said current states, next states, input states and output states, and said information defining connections between the circuit units.

4. The method of claim 3, further comprising the step of manufacturing the logic circuit in accordance with the design.

5. A method as claimed in claim 1 wherein said levels are assigned to said sets of states depending upon the size of said sets.

6. A method as claimed in claim 1 wherein said sets of states are determined by applying said functions to the current states of the logic circuit to generate sets, and repeatedly applying said functions to the generated sets to generate more sets.

7. A method as claimed in claim 6 wherein said sets of states comprise sets of size two or more.

8. A method as claimed in claim 6 wherein said levels are assigned to said sets of states depending upon the order of generation of said sets.

9. A method as claimed in claim 1 wherein said sets of states for a first of said circuit units in the cascade are determined using the current states for the logic circuit and said functions, said sets of states for each subsequent circuit unit in the cascade are determined as subsets of a said set of states for an immediately preceding circuit unit in the cascade, the circuit unit for which a said set of states is decomposed into subsets is dependent upon the level of the set of states, and any said set of states having a level for decomposition corresponding to one of the circuit units along the cascade forms a state of at least one circuit unit and is passed therethrough without being decomposed into subsets.

10. A method according to claim 9 wherein each subset has associated with it the identity of the set from which it was derived.

11. A method according to claim 1 wherein all possible sets of states which include the possible states of the logic circuit are determined using said functions, and said sets of states for a plurality of adjacent circuit units in the cascade are merged such that said plurality of adjacent circuit units are replaced by a compound circuit unit having current states assigned thereto comprising the sets of states of the one of said plurality of adjacent circuit units furthest along the cascade.

12. A method as claimed in claim 11 wherein said plurality of adjacent circuit units are chosen on the basis of a determined speed of performance of each of said plurality of adjacent circuit units.

13. A method as claimed in claim 12 wherein said plurality of adjacent circuit units are chosen on the basis of a determined speeg of one of said circuit units in the cascade having the slowest speed.

14. A method as claimed in claim 1 wherein when the number of sets in a level exceed a threshold, sets of states for at least two subsequent levels corresponding to at least two adjacent circuit units further along the cascade are combined such that said at least two adjacent circuit units further along the cascade are replaced by a compound circuit unit having current states assigned thereto comprising the sets of states of the one of said at least two adjacent circuit units furthest along the cascade.

15. A method as claimed in claim 1 wherein, during determination of said sets of states, when a plurality of sets of states are determined which can transit between each other in the manner of a closed loop, the sets are defined as equivalent and are represented by a single one of the sets as a single state of a said circuit unit, said single one of said sets is assigned a level corresponding to one of the cascaded plurality of circuit units, and said single one of the sets is passed to every subsequent circuit unit in the cascade as an input.

16. A method as claimed in claim 1 wherein said functions are determined defining all transitions from a current state to a next state of the logic circuit for a single input to the logic circuit.

17. A method as claimed in claim 1 wherein a dummy first circuit unit in the cascade is used and has current and next states comprising the set of current states thus defining transitions between all states.

18. A storage medium storing instructions for controlling a processing apparatus to carry out the method of claim 1.

19. Apparatus for generating finite state data for designing a cascade decomposed logic circuit from finite state data defining current states, next states, input states and output states for a logic circuit, the apparatus comprising:
- function determining means for determining functions defining all transitions from a current state to a next state of the logic circuit caused by an input to the logic circuit;
- set determining means for determining sets of states which include the possible states of the logic circuit using said functions;
- level designing means for assigning levels to said sets of states, each level corresponding to one of a cascaded plurality of circuit units each circuit unit having a plurality of states;
- set assigning means for assigning said sets of states of said plurality of cascaded circuit units on the basis of the assigned levels such that at least two states of a circuit unit are subsets of a said set of states of an immediately preceding circuit unit in the cascade, said subsets being a cover of said sets, and at least one circuit unit has a state which is a said set of states of an immediately preceding circuit unit in the cascade; and
- calculating means for calculating next sets of states for the circuit units using said functions and the states of at least one preceding circuit unit in the cascade.

20. Apparatus as claimed in claim 19, including means for assigning binary states to each state of each circuit unit, and outputting means for outputting finite state data defining current states, next states, and input states for each circuit unit, output states for the last circuit unit in the cascade, and information defining connections between the circuit units for passing states of circuit units down the cascade.

21. Apparatus for designing a sequential logic circuit comprising the apparatus of claim 20, and means for designing the logic circuit using said current states, next states, input states and output states, and said infonnation defining connections between the circuit units.

22. Apparatus for manufacturing a sequential logic circuit comprising the apparatus of claim 21 and means for manufacturing the logic circuit in accordance with the design.

23. Apparatus as claimed in claim 19 wherein said level assigning means is adapted to assign said levels to said sets of states depending upon the size of said states.

24. Apparatus as claimed in claim 19 wherein said set determining means is adapted to determine said sets of states by applying said functions to the current states of the logic circuit to generate sets, and repeatedly applying said functions to the generated sets to generate more sets.

25. Apparatus as claimed in claim 24 wherein said set determining means is adapted to determine said sets of states to have a size of two or more.

26. Apparatus as claimed in claim 24 wherein said level assigning means is adapted to assign said levels to said sets of states depending upon the order of generation of said sets.

27. Apparatus as claimed in claim 19 wherein said set assigning means is adapted to assign said sets of states determined using the current states for the logic circuit and said functions to a first of said circuit units in the cascade; to assign to each subsequent circuit unit in the cascade said sets of states comprising subsets of a said set of states for an immediately preceding circuit unit in the cascade, where the circuit unit for which a said set of states is decomposed into subsets is dependent upon the level of the set of states; and to assign any set of states having a level for decomposition corresponding to one of the circuit units along the cascade as a state of at least one circuit unit to be passed therethrough without being decomposed into subsets.

28. Apparatus as claimed in claim 27 wherein said set assignment means is adapted to associate with each subset the identity of the set to which the subset belongs.

29. Apparatus as claimed in claim 19 wherein said set determining means is adapted to determine all possible sets of states which include the possible states of the logic circuit using said functions, and merging means is provided for merging said sets of states for a plurality of adjacent circuit units in the cascade such that said plurality of adjacent circuit units are replaced by a compound circuit unit having current states assigned thereto comprising the sets of states of the one of said plurality of adjacent circuit units furthest along the cascade.

30. Apparatus as claimed in claim 29 including means for selecting said plurality of adjacent circuit units on the basis of a determined speed of performance of each of said plurality of adjacent circuit units.

31. Apparatus according to claim 30 wherein said selecting means is arranged to allow the selection of said plurality of adjacent circuit units on the basis of a determined speed of one of said circuit units in the cascade having the slowest speed.

32. Apparatus according to claim 19 including means for combining sets of states for at least two levels corresponding to at least two adjacent circuit units when the number of sets in a level exceeds a threshold such that said at least two circuit units are replaced by a compound circuit unit having current states assigned thereto comprising the sets of states of one of said at least two adjacent circuit units furthest along the cascade.

33. Apparatus as claimed in claim 19 including means for defining sets as equivalent when, during determination of said sets of states, a plurality of sets of states are determined which can transit between each other in the manner of a closed loop, and for representing the equivalent sets by a single one of the sets as a single state of a said circuit unit; wherein said set assigning means adapted to assign said single set a level corresponding to one of the cascaded plurality of circuit units; and including means for passing said single set to every subsequent circuit unit in the cascade as an input.

34. Apparatus as claimed in claim 19 wherein said function determining means is adapted to determine said function defining all transitions from a current state to a next state of the logic circuit for a single input of the logic circuit.

35. A sequential logic circuit for receiving an input and for generating an output, the logic circuit comprising:
- a plurality of interacting sequential circuit units which function concurrently, each said sequential circuit unit having input means for receiving the input, at least one of said sequential circuits having second input means for receiving only one further input from only an immediately preceding sequential circuit unit in the sequence, the last of said sequential circuit units in the sequence having output means for generating the output, and at least one of the sequential circuit units is not a permutation reset machine.

36. A sequential logic circuit as claimed in claim 35 wherein said preceding sequential circuit unit includes storage means for storing at least one state of one or more further sequential circuit units preceding said preceding sequential circuit units in the sequence, and said second input means of said at least one sequential circuit is adapted to receive the output of said storage means.

37. A sequential logic circuit as claimed in claim 36 wherein said preceding sequential circuit unit includes storage means for storing at least one state of one or more further sequential circuit units preceding said preceding sequential circuit units in the sequence, and said second input means of said at least one sequential circuit is adapted to receive the output of said storage means.

38. A sequential logic circuit for receiving an input and for generating an output, the logic circuit comprising:
  at least three interacting sequential circuit units which function concurrently, each said sequential circuit unit having input means for receiving the input, at least one of said sequential circuits having second input means for receiving one further input from only an immediately preceding sequential circuit unit in the sequence, and the last of said sequential circuit units in the sequence having output means for generating the output.

39. A method of automatically generating finite state graphs for a cascade decomposed sequential circuit from an input finite state graph for a sequential circuit, the method comprising:
  determining functions defining all transitions from a current state to a next state of the sequential circuit caused by a single input to the sequential circuit;
  determining sets of states which include the possible states of the sequential circuit using the functions;
  assigning levels to said sets, each level corresponding to one of a cascaded plurality of sequential circuit components;
  assigning sets of states to the cascaded sequential circuit components on the basis of the assigned levels;
  passing information on the states of preceding sequential circuit components along the cascade; and
  determining next sets of states for the sequential circuit components using said functions and the states of preceding sequential circuit components in the cascade.

40. The method of claim 39, further comprising the step of storing instructions for controlling a processing apparatus with a storage medium.

41. The method of claim 39, further comprising the step of designing the sequential circuit components using the finite state graphs, and manufacturing the cascade decomposed sequential circuit according to the design.

42. Apparatus for automatically generating finite state graphs for a cascade decomposed sequential circuit from an input finite state graph for a sequential circuit, the apparatus comprising:
  function determining means for determining functions defining all transitions from a current state to a next state of the sequential circuit caused by a single input to the sequential circuit;
  set determining means for determining sets of states which include the possible states of the sequential circuit using the functions;
  level assigning means for assigning levels to the sets, each level corresponding to one of a cascaded plurality of sequential circuit components;
  set assigning means for assigning sets of states to the cascaded sequential circuit components on the basis of the assigned levels;
  means for passing information on the states of preceding sequential circuit components along the cascade; and
  next set determining means for determining next sets for the sequential circuit components using said functions and the states of preceding sequential circuit components in the cascade.

43. A computer implemented method of generating finite state data for designing a cascade decomposed sequential circuit from finite state data definingcurrent states, next states, input states and output states for a sequential circuit, the method comprising:
  determining function defining transitions from a current state to a next state of the sequential circuit caused by any of a number of possible input states to the sequential circuit;
  determining set of states which include the possible states of the sequential circuit using said functions;
  determining a plurality of equivalence classes of sets of states, each said equivalence class being determined to comprise one said set and any further said sets to which said one set can transit by application of said functions and from which said one set can be transmitted to by application of said functions;
  assigning a level to the sets of each said equivalence class the sets of each equivalence class being assigned the same level, each level corresponding to one of a cascaded plurality of sequential circuit components; assigning said sets of states as states of said cascaded plurality of sequential circuit components on the basis of the assigned levels;
  identifying any of said equivalence classes comprising only one said set;
  for any said sequential circuit component corresponding to a said equivalence class identified in the identifying step, using the states of the sequential circuit component as inputs for only the next sequential circuit component in the cascade; and
  determining next states for the sequential circuit components using said functions and the states of at least one preceding sequential circuit component in the cascade as an input.

44. The method of claim 43, further comprising the step of storing instructions for controlling a processing apparatus with a storage medium.

45. The method of claim 43, further comprising the step of designing the sequential circuit components using the finite state graphs, and manufacturing the cascade decomposed sequential circuit according to the design.

46. A method as claimed in claim 43, wherein for at least one of said sequential circuit components corresponding to a said equivalence class comprising more than one said set, the states of the sequential circuit component are used as inputs for all subsequent sequential circuit components in the cascade.

47. Apparatus for generating finite state data for designing a cascade decomposed sequential circuit from finite states data defining current states, next states, input states and output states for a sequential circuit, the apparatus comprising:
  function determining means for determining functions defining transitions from a current state to a next state of the sequential circuit caused by any or a number of possible input states to the sequential circuit;
  set determining means for determining sets of states which include the possible states of the sequential circuit using said functions;
  equivalence class determining means for determining a plurality of equivalence classes of sets of states, each said equivalence class being determined to comprise one said set and any further said sets to which said one set can transit by application of said functions and from which said one set can be transmitted to by applications of said functions;

level assigning means for assigning a level to the sets of each said equivalence class, the sets of each equivalence class being assigned to the same level, each level corresponding to one of a cascaded plurality of sequential circuit components;

set assigning means for assigning said sets of states as states of said plurality of sequential circuit components on the basis of the assigned levels;

identifying means for identifying any of said equivalence classes comprising only one said set;

input assignment means for assigning the states of any of the sequential circuit components identified by said identifying means as inputs for only the next sequential circuit component in the cascade; and calculating means for calculating next states for the sequential circuit components using said functions and dependent upon the states of at least one preceding sequential circuit component in the cascade as an input.

48. Apparatus as claimed in claim 47 including means for assigning the states of at least one sequential circuit component corresponding to a said equivalence class comprising more than one set as inputs for all subsequent sequential circuit components in the cascade.

49. Apparatus for generating finite state data for designing a cascade decomposed logic circuit from finite state data defining current states, next states, input states and output states for a logic circuit, the apparatus comprising:

function determining means for determining functions defining all transitions from a current state to a next state of the logic circuit caused by an input to the logic circuit;

set determining means for determining sets of circuit states which include the possible states of the logic circuit using said functions;

level designing means for assigning levels to said sets of circuit states, each level corresponding to one of a cascaded plurality of circuit units, each circuit unit have a plurality of states, each unit state comprising a set of circuit states of the logic circuit;

set assigning means for assigning said sets of states of said plurality of cascaded circuit units as unit states for the circuit units on the basis of the assigned levels, wherein the circuit states of each of at least two unit states of a circuit unit are subsets of a set of circuit states of a unit states of an immediately preceding circuit unit in a cascade, said subsets are a cover of said sets, and at least one circuit unit has a unit state which is a set of circuit states of an immediately preceding circuit unit in the cascade; and calculating means for calculating next sets of circuit states for the circuit units using said functions and the circuit states of at least one preceding circuit unit in the cascade.

* * * * *